US012787306B2

(12) United States Patent
Sato et al.

(10) Patent No.: US 12,787,306 B2
(45) Date of Patent: Nov. 3, 2026

(54) SEMICONDUCTOR MEMORY DEVICE WITH A PLURALITY OF WIRING LAYERS

(71) Applicant: Kioxia Corporation, Tokyo (JP)

(72) Inventors: Toshiaki Sato, Yokohama (JP); Masaki Unno, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 286 days.

(21) Appl. No.: 18/465,244

(22) Filed: Sep. 12, 2023

(65) Prior Publication Data

US 2024/0099033 A1 Mar. 21, 2024

(30) Foreign Application Priority Data

Sep. 21, 2022 (JP) ................................ 2022-150735

(51) Int. Cl.
*H10B 80/00* (2026.01)
*H10W 90/00* (2026.01)

(52) U.S. Cl.
CPC ............ *H10B 80/00* (2023.02); *H10W 90/00* (2026.01); *H10W 90/792* (2026.01)

(58) Field of Classification Search
CPC ........ H10B 80/00; H10B 43/10; H10B 43/40; H10B 43/27; H01L 24/08; H01L 25/0657; H01L 25/18; H01L 2224/08145; H01L 2924/1431; H01L 2924/14511; H10W 90/00; H10W 90/792
See application file for complete search history.

(56) References Cited

U.S. PATENT DOCUMENTS

| | | | | |
|---|---|---|---|---|
| 10,453,518 | B1 | 10/2019 | Nagai | |
| 11,705,443 | B2 | 7/2023 | Maejima et al. | |
| 2019/0237477 | A1 | 8/2019 | Baek et al. | |
| 2020/0335513 | A1 | 10/2020 | Morozumi et al. | |
| 2021/0118862 | A1 | 4/2021 | Maejima et al. | |
| 2022/0130849 | A1 | 4/2022 | Kwon et al. | |
| 2022/0246196 | A1 | 8/2022 | Takenaka et al. | |
| 2022/0262724 | A1* | 8/2022 | Tabata | G11C 16/0483 |
| 2024/0099031 | A1* | 3/2024 | Hashimoto | H10B 43/27 |
| 2024/0153830 | A1* | 5/2024 | Choo | G01R 31/2853 |
| 2024/0257883 | A1* | 8/2024 | Maejima | H10B 41/50 |

FOREIGN PATENT DOCUMENTS

| | | | |
|---|---|---|---|
| CN | 112670298 | A | 4/2021 |
| TW | 202211238 | A | 3/2022 |

* cited by examiner

*Primary Examiner* — Thanh Y. Tran
(74) *Attorney, Agent, or Firm* — Oblon, McClelland, Maier & Neustadt, L.L.P.

(57) ABSTRACT

A semiconductor memory device includes a plurality of sense amplifier regions, a first wiring layer including a plurality of bit lines electrically connected to a plurality of semiconductor layers, and a second wiring layer including a plurality of first wirings electrically connecting the respective plurality of sense amplifier regions to the plurality of bit lines. The semiconductor substrate includes a first region and a second region arranged in a second direction. The (n1) (n1 is an integer of 2 or more) first wirings arranged in the third direction are disposed at a position where the first region overlaps with the sense amplifier region viewed in the first direction. The (n2) (n2 is an integer of 2 or more different from n1) first wirings arranged in the third direction are disposed at a position where the second region overlaps with the other sense amplifier region viewed in the first direction.

19 Claims, 37 Drawing Sheets

SEMICONDUCTOR MEMORY DEVICE WITH A PLURALITY OF WIRING LAYERS

CROSS-REFERENCE TO RELATED APPLICATIONS

This application is based upon and claims the benefit of Japanese Patent Application No. 2022-150735, filed on Sep. 21, 2022, the entire contents of which are incorporated herein by reference.

Background

FIELD

Embodiments described herein relate generally to a semiconductor memory device.

Description of the Related Art

There has been known a semiconductor memory device including a substrate, a plurality of conductive layers arranged in a direction intersecting with a surface of this substrate, a semiconductor layer opposed to these plurality of conductive layers, and a gate insulating layer disposed between the conductive layers and the semiconductor layer. The gate insulating layer includes a memory portion configured to store data, and the memory portion is, for example, an insulating electric charge accumulating layer, such as silicon nitride (SiN), and a conductive electric charge accumulating layer, such as a floating gate.

DETAILED DESCRIPTION

Figure 1:
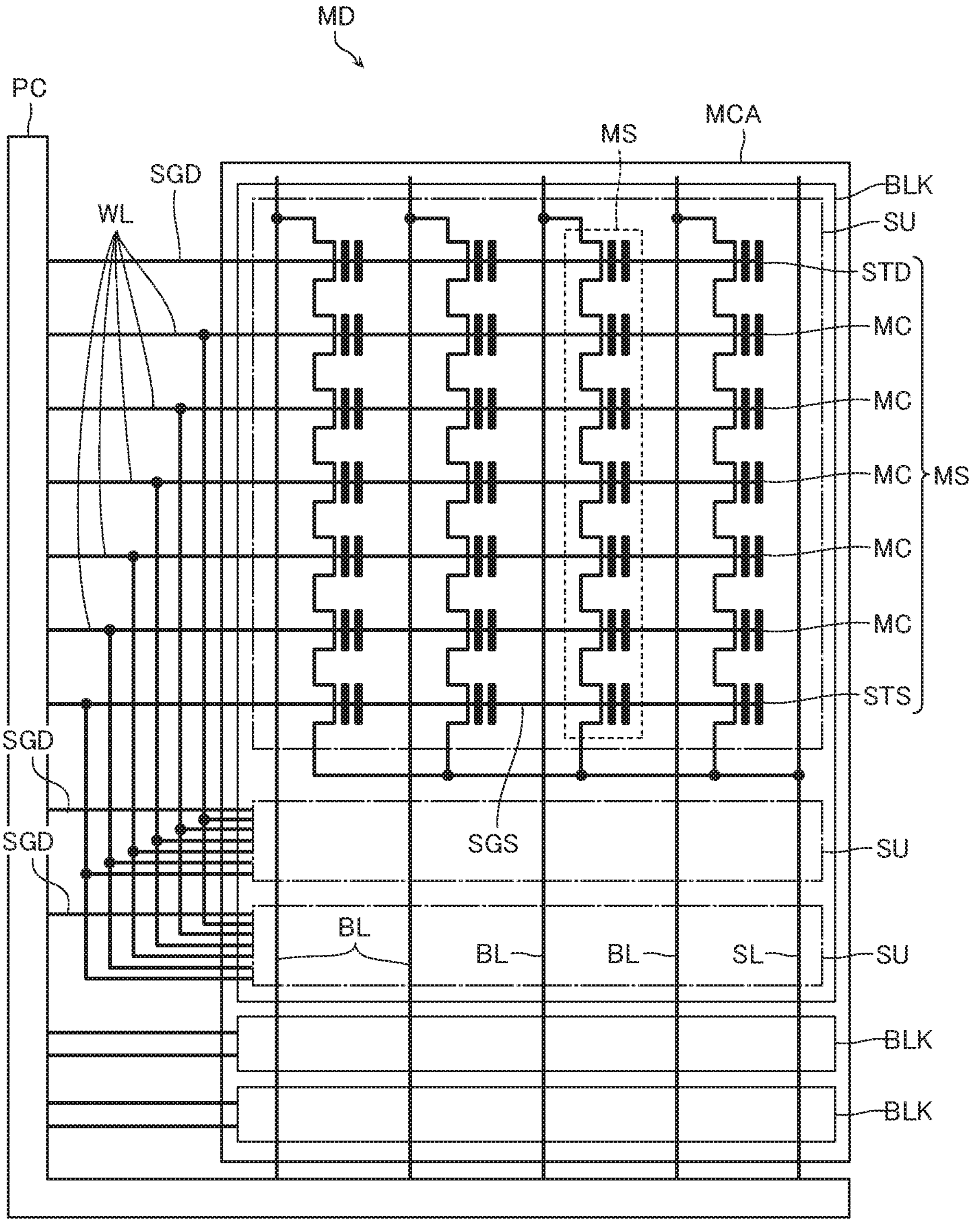
FIG. 1 is a schematic circuit diagram illustrating a part of a configuration of a memory die MD.

A semiconductor memory device according to one embodiment comprises: a semiconductor substrate; a plurality of conductive layers arranged in a first direction intersecting with a surface of the semiconductor substrate and extending in a second direction intersecting with the first direction; a plurality of semiconductor layers extending in the first direction and being opposed to the plurality of conductive layers; a first wiring layer disposed between the semiconductor substrate and the plurality of semiconductor layers, being electrically connected to the plurality of semiconductor layers, and including a plurality of bit lines, the plurality of bit lines being arranged in the second direction and extending in a third direction intersecting with the first direction and the second direction; a column control circuit region disposed in the semiconductor substrate; and a second wiring layer disposed between the semiconductor substrate and the first wiring layer and including a plurality of first wirings, the respective plurality of first wirings electrically connecting the column control circuit region to the plurality of bit lines. The semiconductor substrate includes a first region and a second region arranged in the second direction. The column control circuit region includes a plurality of sense amplifier regions. The (n1) (n1 is an integer of 2 or more) first wirings arranged in the third direction are disposed at a position where the first region overlaps with the sense amplifier region viewed in the first direction. The (n2) (n2 is an integer of 2 or more different from n1) first wirings arranged in the third direction are disposed at a position where the second region overlaps with the other sense amplifier region viewed in the first direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Circuit Configuration of Memory Die MD]

FIG. 1 is a schematic circuit diagram illustrating a part of a configuration of a memory die MD. As illustrated in FIG. 1, the memory die MD includes a memory cell array MCA and a peripheral circuit PC. As illustrated in FIG. 1, the memory cell array MCA includes a plurality of memory blocks BLK. Each of these plurality of memory blocks BLK includes a plurality of string units SU. Each of these plurality of string units SU includes a plurality of memory strings MS. One ends of these plurality of memory strings MS are each connected to the peripheral circuit PC via a bit line BL. The other ends of these plurality of memory strings MS are each connected to the peripheral circuit PC via a common source line SL.

The memory string MS includes a drain-side select transistor STD, a plurality of memory cells MC (memory transistors), and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS are simply referred to as select transistors (STD, STS) in some cases.

The memory cell MC is a field-effect type transistor. The memory cell MC includes a semiconductor layer, a gate insulating film, and a gate electrode. The semiconductor layer functions as a channel region. The gate insulating film includes an electric charge accumulating film. A threshold voltage of the memory cell MC varies corresponding to an electric charge amount in the electric charge accumulating film. The memory cell MC stores data of 1 bit or a plurality of bits. The gate electrodes of the plurality of memory cells MC corresponding to one memory string MS are connected to respective word lines WL. Each of these word lines WL is connected in common to all of the memory strings MS in one memory block BLK.

The select transistors (STD, STS) are field-effect type transistors. The select transistors (STD, STS) each include a semiconductor layer, a gate insulating film, and a gate electrode. The semiconductor layer functions as a channel region. The gate insulating film may include an electric charge accumulating layer. The select gate lines (SGD, SGS) are connected to the respective gate electrodes of the select transistors (STD, STS). One drain-side select gate line SGD is connected to all of the memory strings MS in one string unit SU in common. One source-side select gate line SGS is connected to all of the memory strings MS in one memory block BLK in common.

Figure 2:
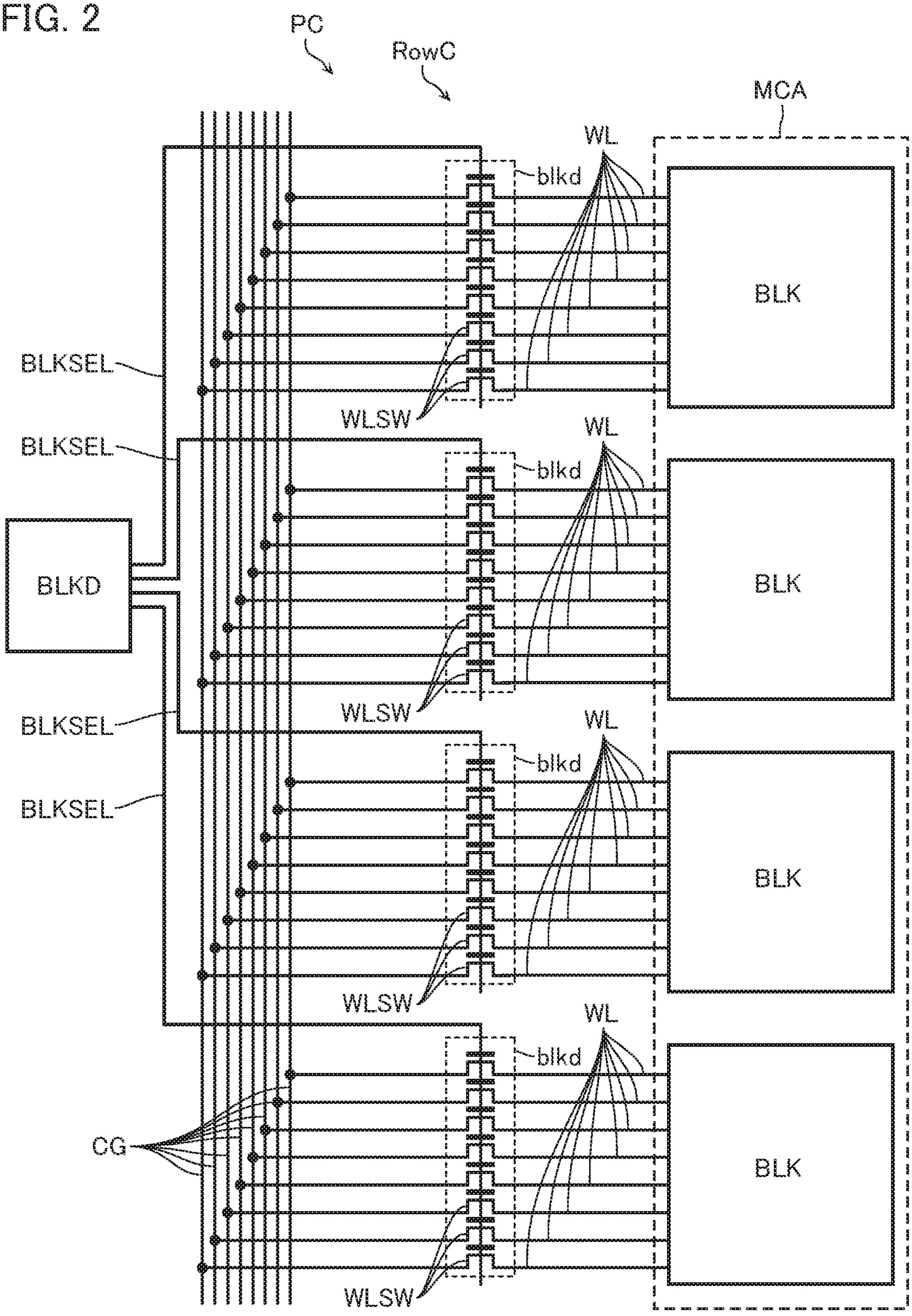
FIG. 2 is a schematic circuit diagram illustrating a part of a configuration of a peripheral circuit PC.

FIG. 2 is a schematic circuit diagram illustrating a part of a configuration of the peripheral circuit PC. For example, as illustrated in FIG. 2, the peripheral circuit PC includes a row control circuit RowC. The row control circuit RowC includes a plurality of block decode units blkd and a block decoder BLKD.

The plurality of block decode units blkd correspond to the plurality of memory blocks BLK in the memory cell array MCA. The block decode unit blkd includes a plurality of word line switches WLSW. The plurality of word line switches WLSW correspond to the plurality of word lines WL in the memory block BLK. The word line switch WLSW is, for example, a field-effect type NMOS transistor. The word line switch WLSW has a drain electrode connected to the word line WL. The word line switch WLSW has a source electrode connected to a wiring CG. The wiring CG is connected to all of the block decode units blkd in the row control circuit RowC. The word line switch WLSW has a gate electrode connected to a signal supply line BLKSEL. A plurality of the signal supply lines BLKSEL are disposed corresponding to all of the block decode units blkd. The signal supply line BLKSEL is connected all of the word line switches WLSW in the block decode unit blkd.

The block decoder BLKD decodes a block address in a read operation or a write operation. The block decoder BLKD turns one of the plurality of signal supply lines BLKSEL to an "H" state, and turns the remaining signal supply lines BLKSEL to an "L" state corresponding to the decoded block address.

Figure 3:
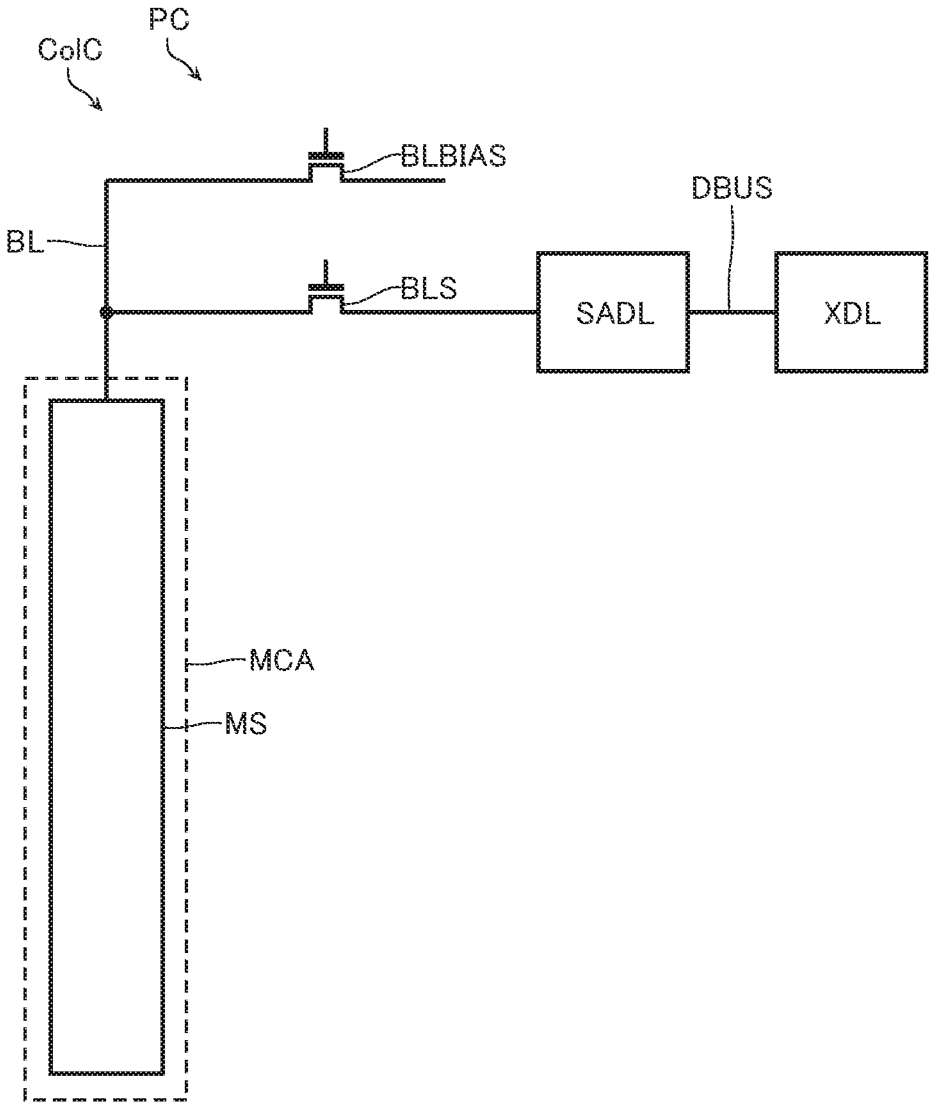
FIG. 3 is a schematic circuit diagram illustrating a part of the configuration of the peripheral circuit PC.

FIG. 3 is a schematic circuit diagram illustrating a part of the configuration of the peripheral circuit PC. For example, as illustrated in FIG. 3, the peripheral circuit PC includes a column control circuit ColC. The column control circuit ColC includes switch transistors BLS, BLBIAS connected to a bit line BL, a sense amplifier circuit SADL connected to the bit line BL via the switch transistor BLS, and a latch circuit XDL connected to the sense amplifier circuit SADL.

The switch transistors BLS, BLBIAS are, for example, field-effect type NMOS transistors. The switch transistors BLS, BLBIAS have drain electrodes connected to the bit line BL. The switch transistor BLS has a source electrode connected to the sense amplifier circuit SADL. The switch transistor BLBIAS has a source electrode connected a voltage supply line (not illustrated).

The sense amplifier circuit SADL includes a sense circuit, a latch circuit, and a voltage transfer circuit. The sense circuit includes a sense transistor and a data wiring. The sense transistor has a gate electrode electrically connected to the bit line BL. The sense transistor has a drain electrode connected to the data wiring. The sense transistor turns ON corresponding to the voltage or the current of the bit line BL. The data wiring is charged or discharged corresponding to the ON/OFF state of the sense transistor. The latch circuit latches data of "1" or "0" corresponding to the voltage of the data wiring. The voltage transfer circuit causes the bit line BL to be electrically conducted to any of the two voltage supply lines corresponding to the data latched by the latch circuit.

The latch circuit XDL is electrically connected to the data wiring in the sense amplifier circuit SADL via a wiring DBUS. Data included in the latch circuit XDL is sequentially transferred to the sense amplifier circuit SADL or an input/output control circuit (not illustrated).

[Structure of Memory Die MD]

Figure 4:
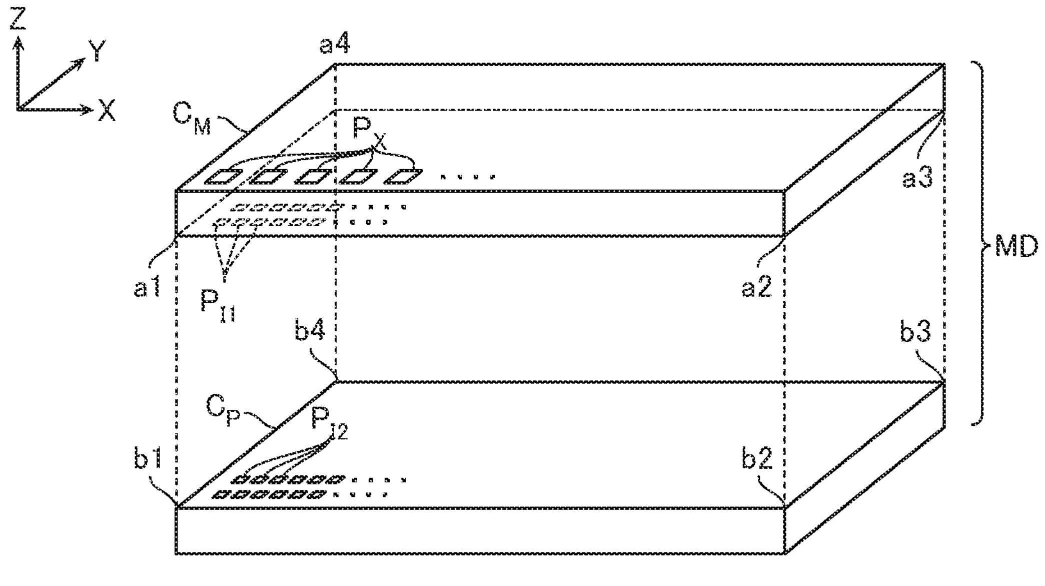
FIG. 4 is a schematic exploded perspective view illustrating an exemplary configuration of a semiconductor memory device according to an embodiment.

FIG. 4 is a schematic exploded perspective view illustrating an exemplary configuration of a semiconductor memory device according to the embodiment. As illustrated in FIG. 4, the memory die MD includes a chip $C_M$ in the memory cell array MCA side and a chip $C_P$ in the peripheral circuit PC side.

On an upper surface of the chip $C_M$, a plurality of external pad electrodes $P_X$ connectable to a bonding wire (not illustrated) are disposed. On a lower surface of the chip $C_M$, a plurality of bonding electrodes $P_{I1}$ are disposed. On an upper surface of the chip $C_P$, a plurality of bonding electrodes $P_{I2}$ are disposed. Hereinafter, in the chip $C_M$, the surface on which the plurality of bonding electrodes $P_{I1}$ are disposed is referred to as a front surface, and the surface on which the plurality of external pad electrodes $P_X$ are disposed is referred to as a back surface. In the chip $C_P$, the surface on which the plurality of bonding electrodes $P_{I2}$ are disposed is referred to as a front surface, and a surface in the opposite side of the front surface is referred to as a back surface. In the illustrated example, the front surface of the chip $C_P$ is disposed above the back surface of the chip $C_P$, and the back surface of the chip $C_M$ is disposed above the front surface of the chip $C_M$.

The chip $C_M$ and the chip $C_P$ are disposed such that the front surface of the chip $C_M$ is opposed to the front surface of the chip $C_P$. The plurality of bonding electrodes $P_{I1}$ are disposed corresponding to the respective plurality of bonding electrodes $P_{I2}$, and disposed at positions allowing bonding to the plurality of bonding electrodes $P_{I2}$. The bonding electrode $P_{I1}$ and the bonding electrode $P_{I2}$ function as bonding electrodes that bond the chip $C_M$ and the chip $C_P$ together and electrically connect the chip $C_M$ and the chip $C_P$.

In the example of FIG. 4, corner portions a1, a2, a3, and a4 of the chip $C_M$ correspond to corner portions b1, b2, b3, and b4 of the chip $C_P$, respectively.

Figure 5:
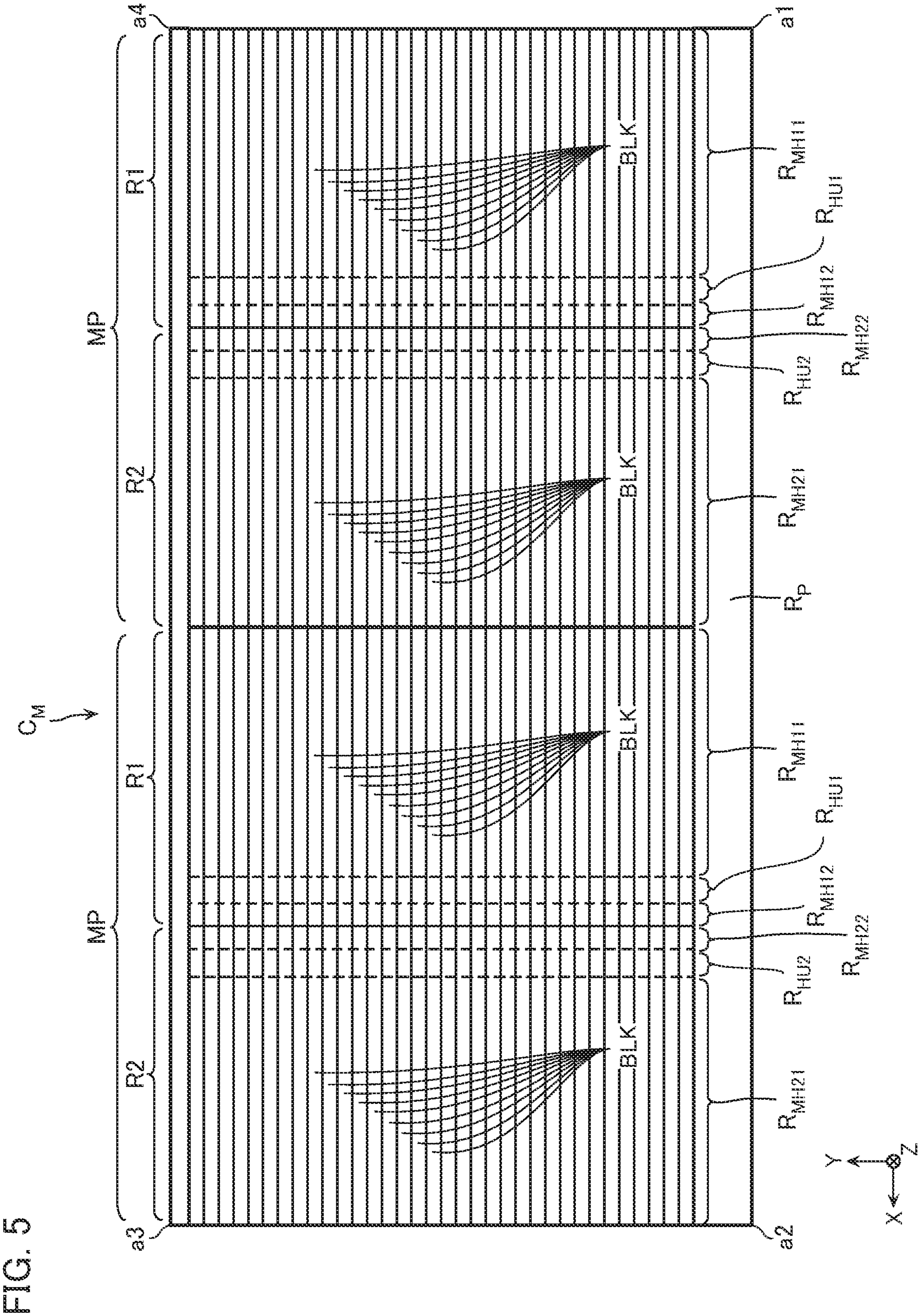
FIG. 5 is a schematic bottom view illustrating an exemplary configuration of a chip $C_M$.
Figure 6:
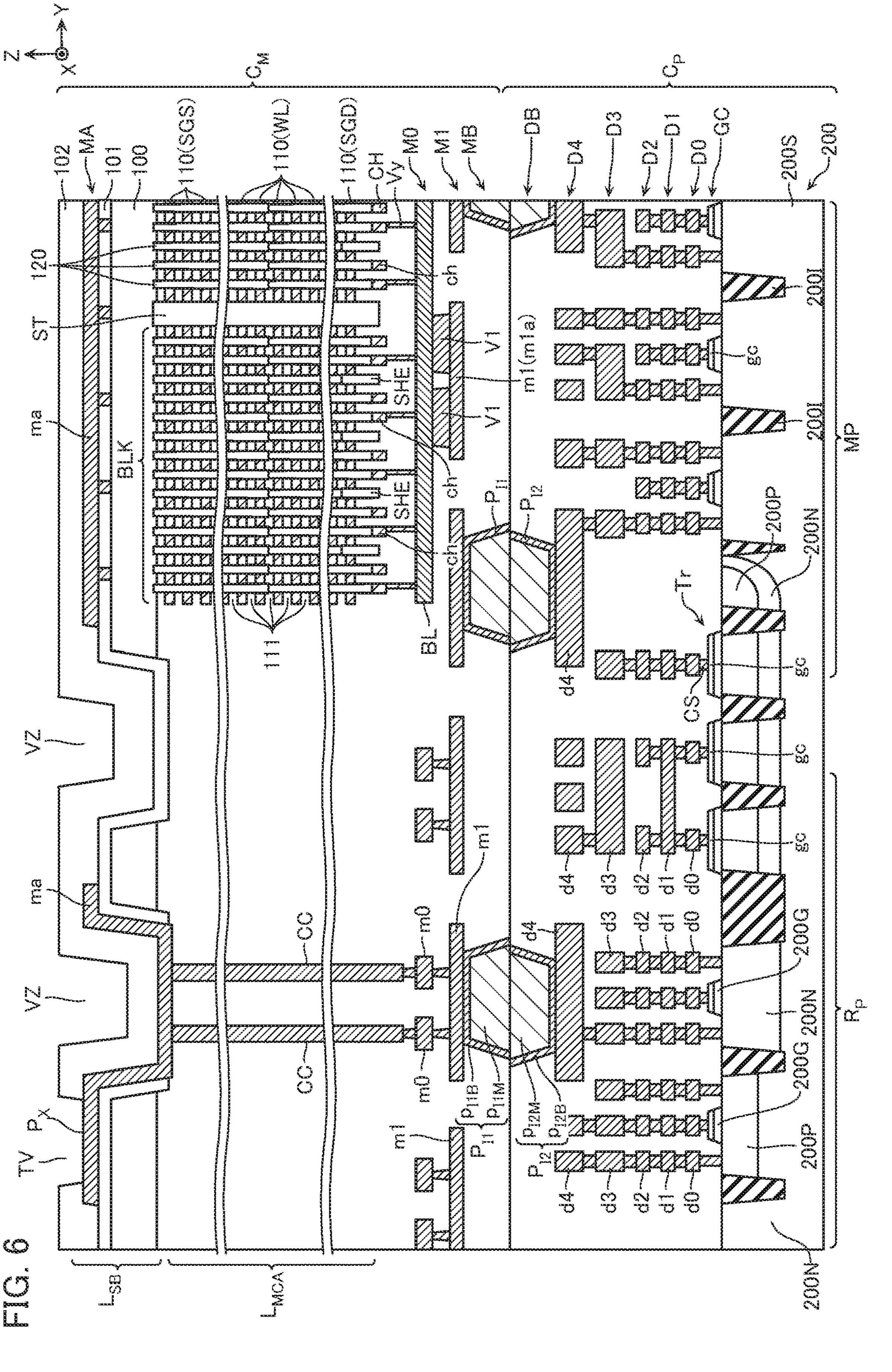
FIG. 6 is a schematic cross-sectional view illustrating a part of the configuration of the memory die MD.
Figure 7:
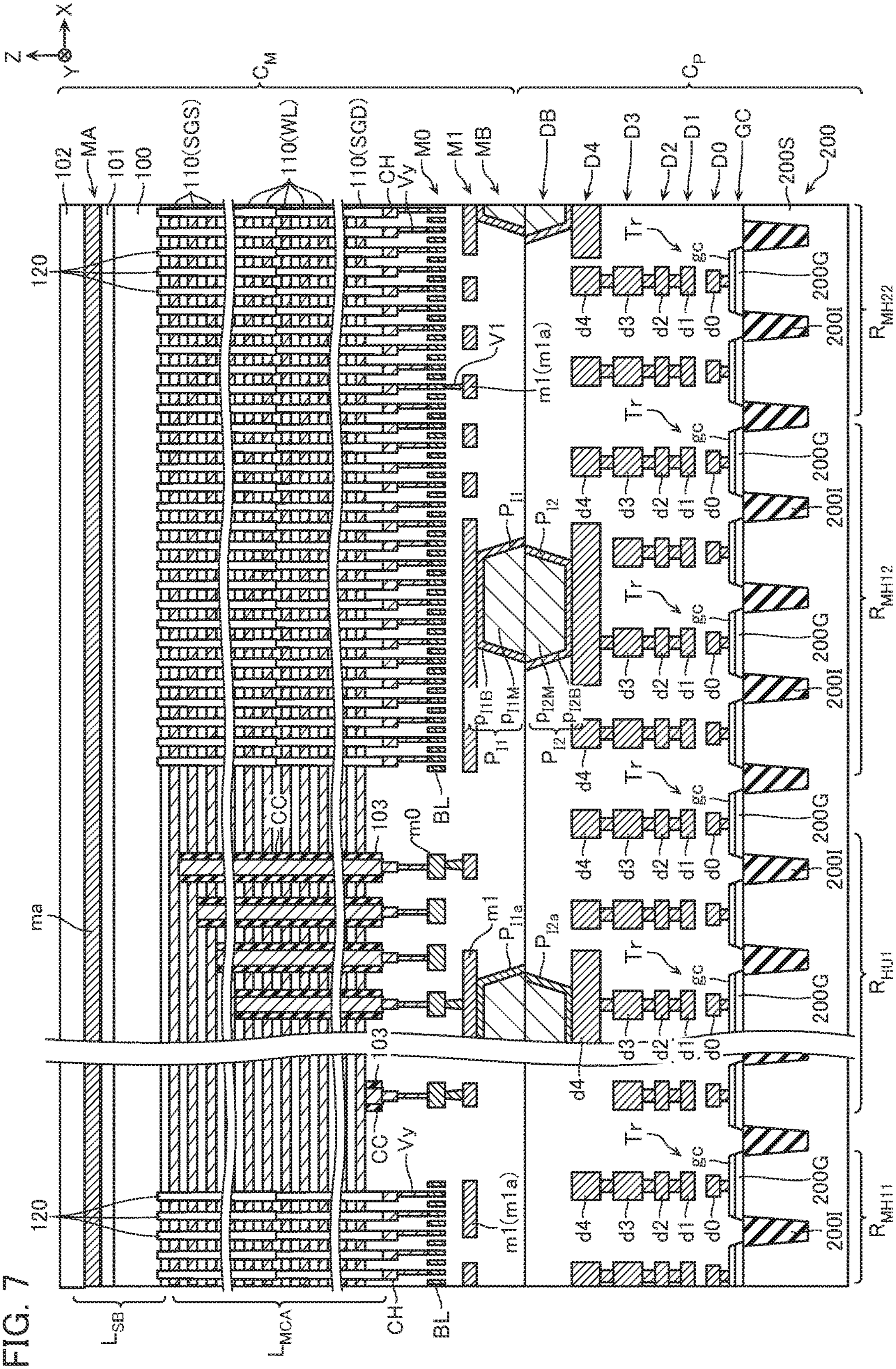
FIG. 7 is a schematic cross-sectional view illustrating a part of the configuration of the memory die MD.
Figure 8:
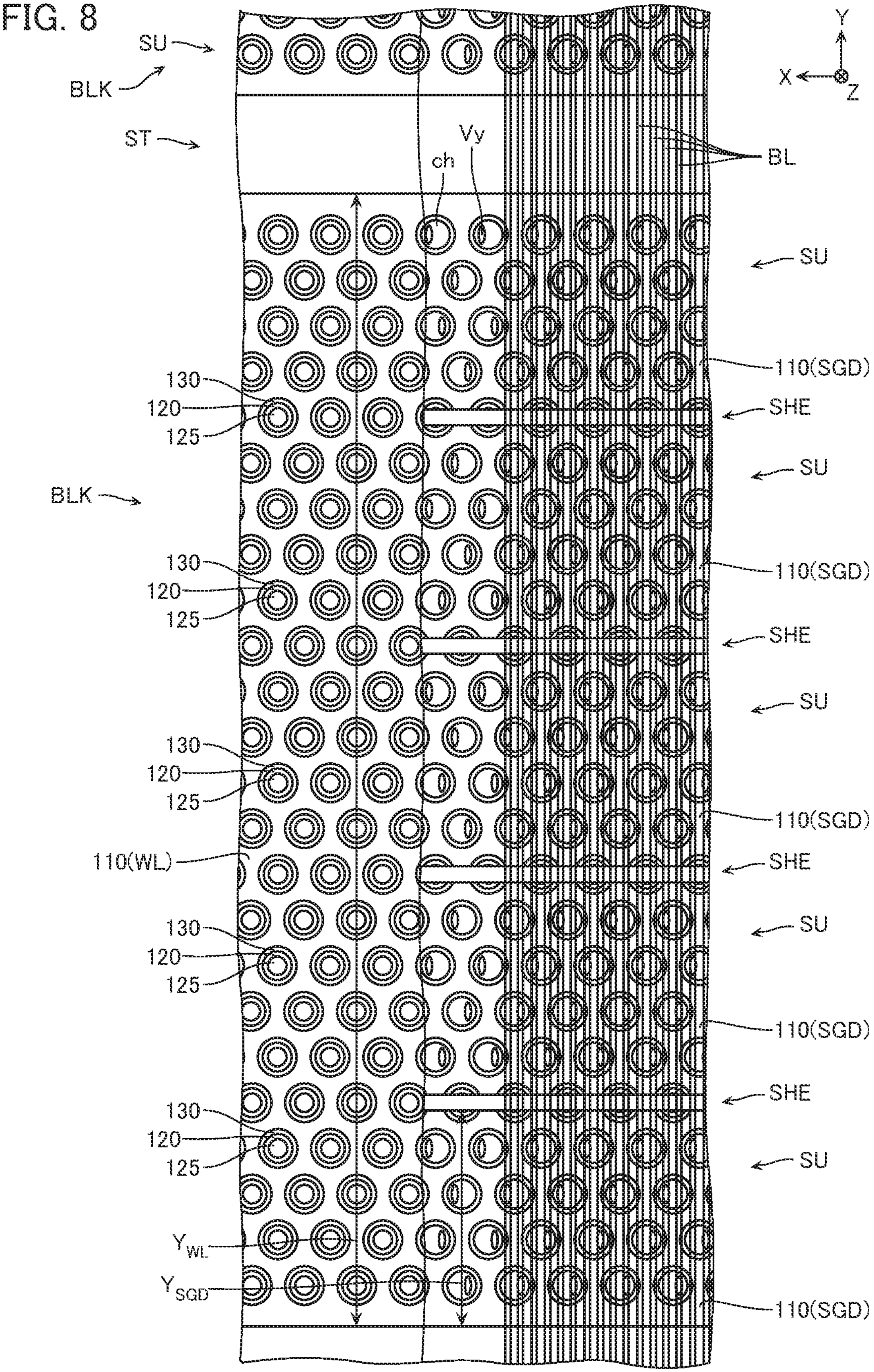
FIG. 8 is a schematic bottom view illustrating a part of the configuration of the chip $C_M$.
Figure 9:
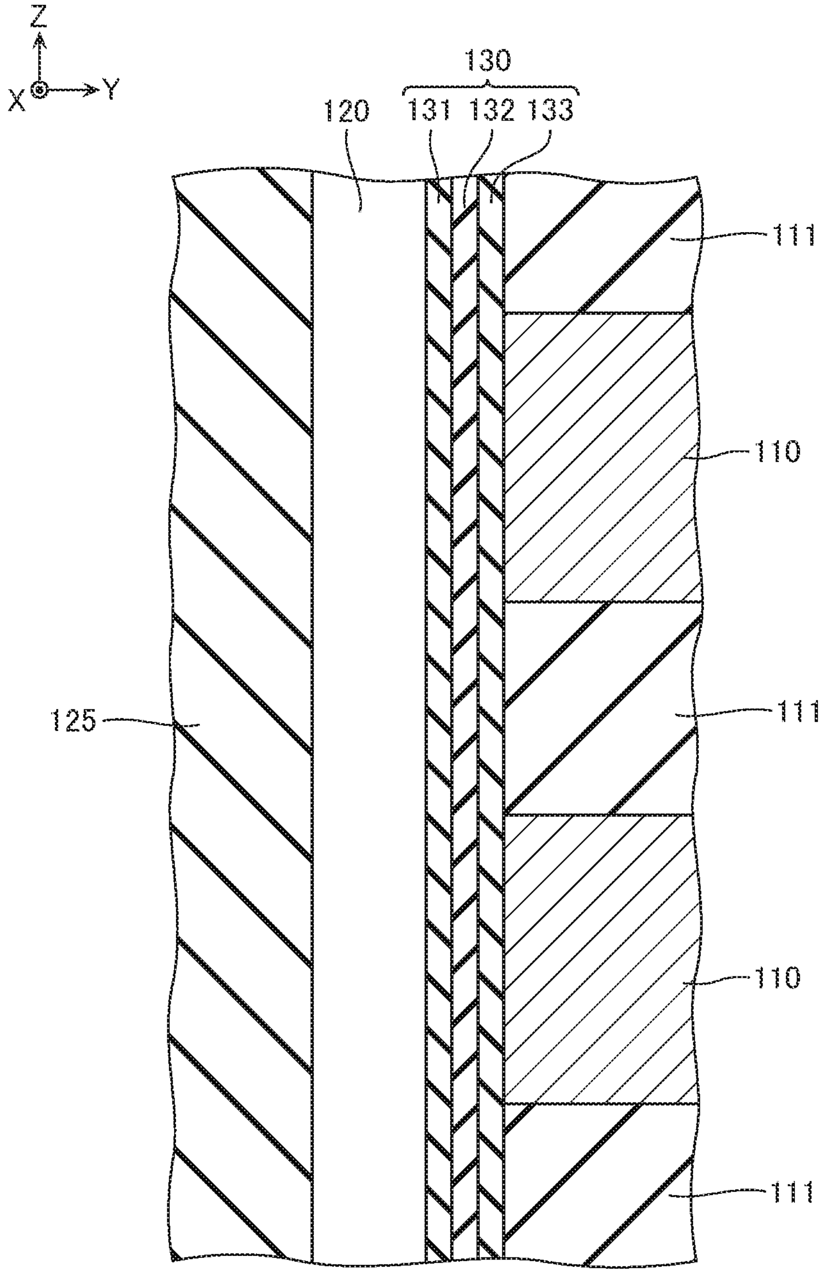
FIG. 9 is a schematic cross-sectional view illustrating a part of the configuration of the chip $C_M$.
Figure 10:
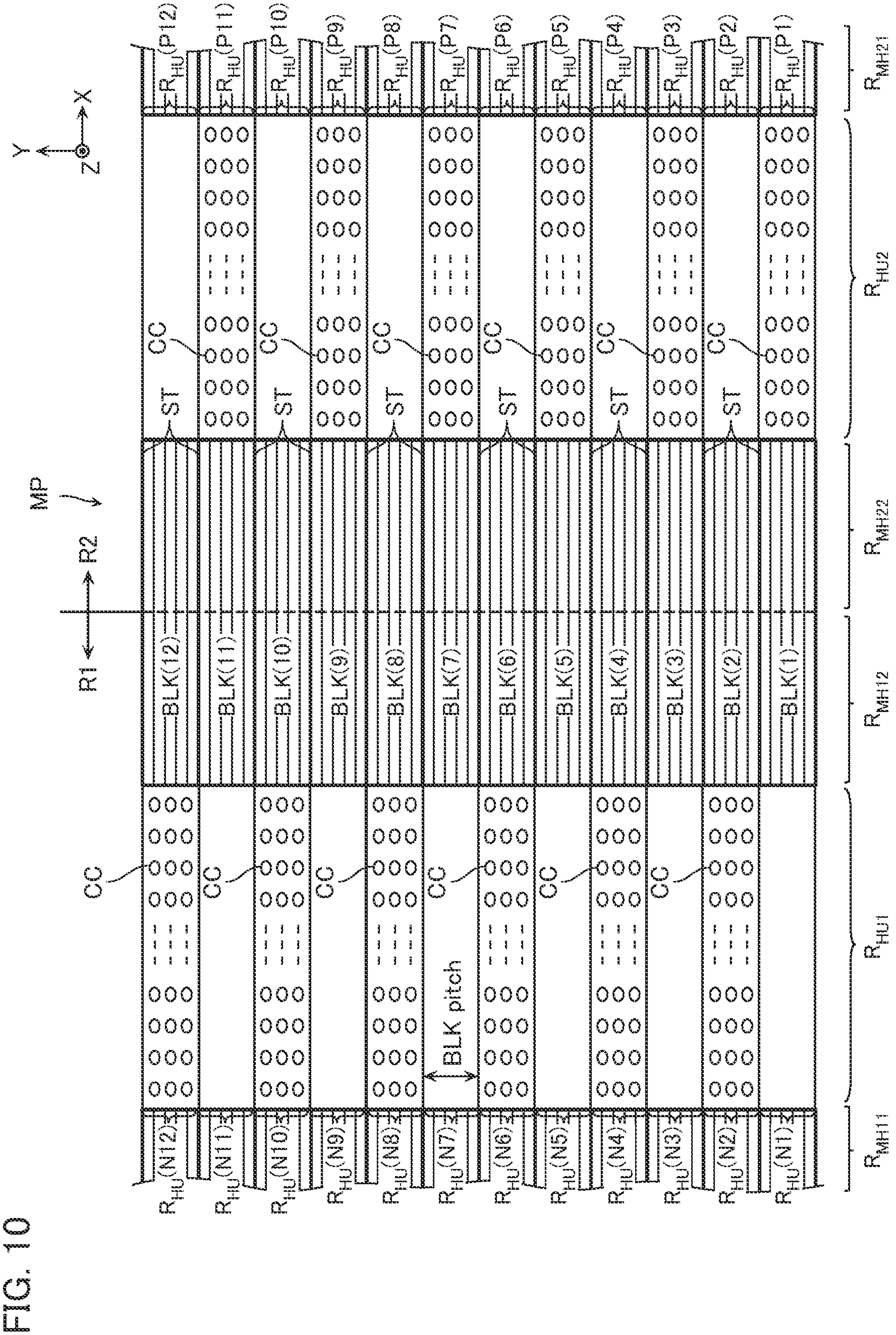
FIG. 10 is a schematic plan view illustrating exemplary configurations of hook-up regions $R_{HU1}$, $R_{HU2}$.
Figure 11:
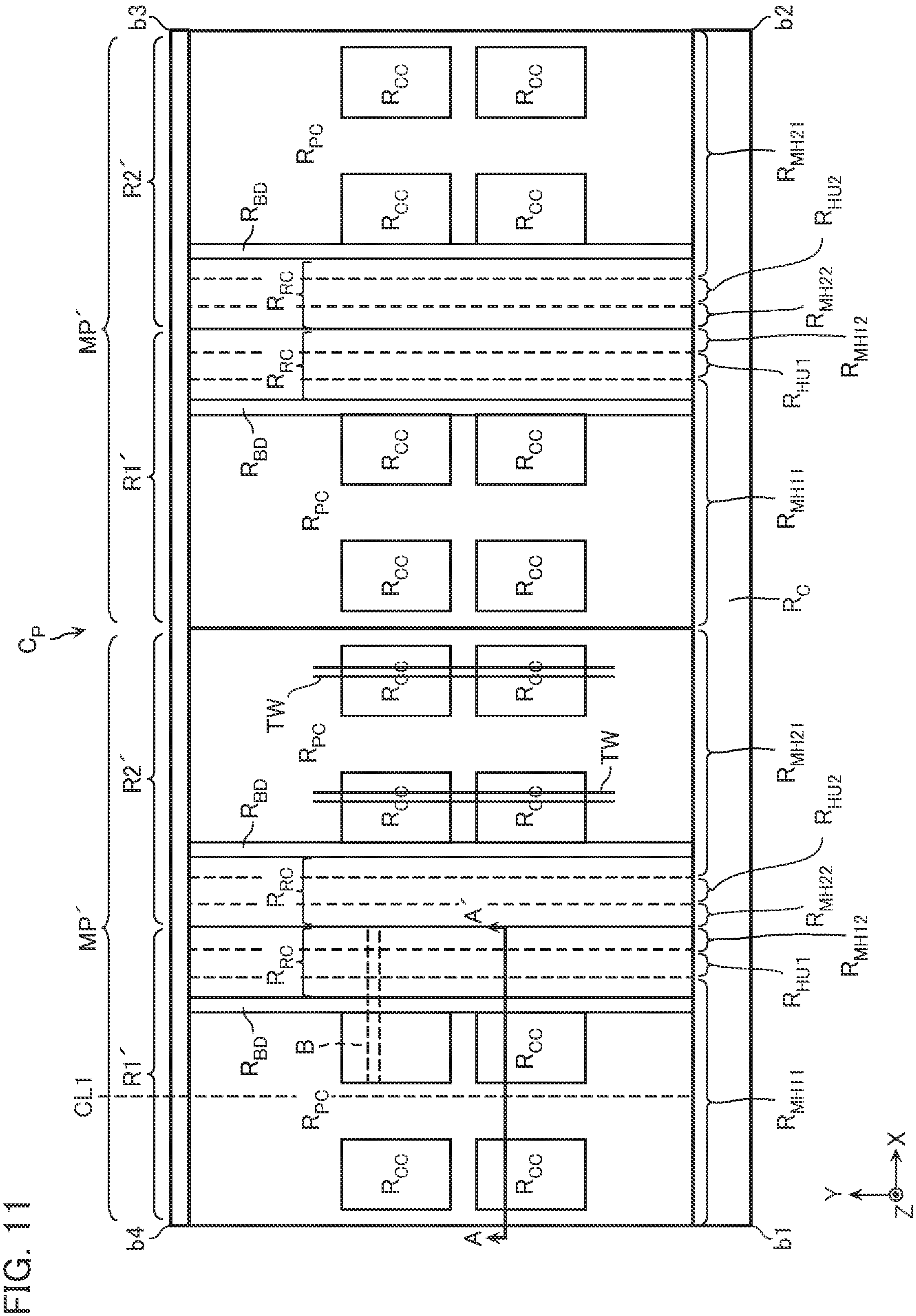
FIG. 11 is a schematic plan view illustrating an exemplary configuration of a chip $C_P$.
Figure 12:
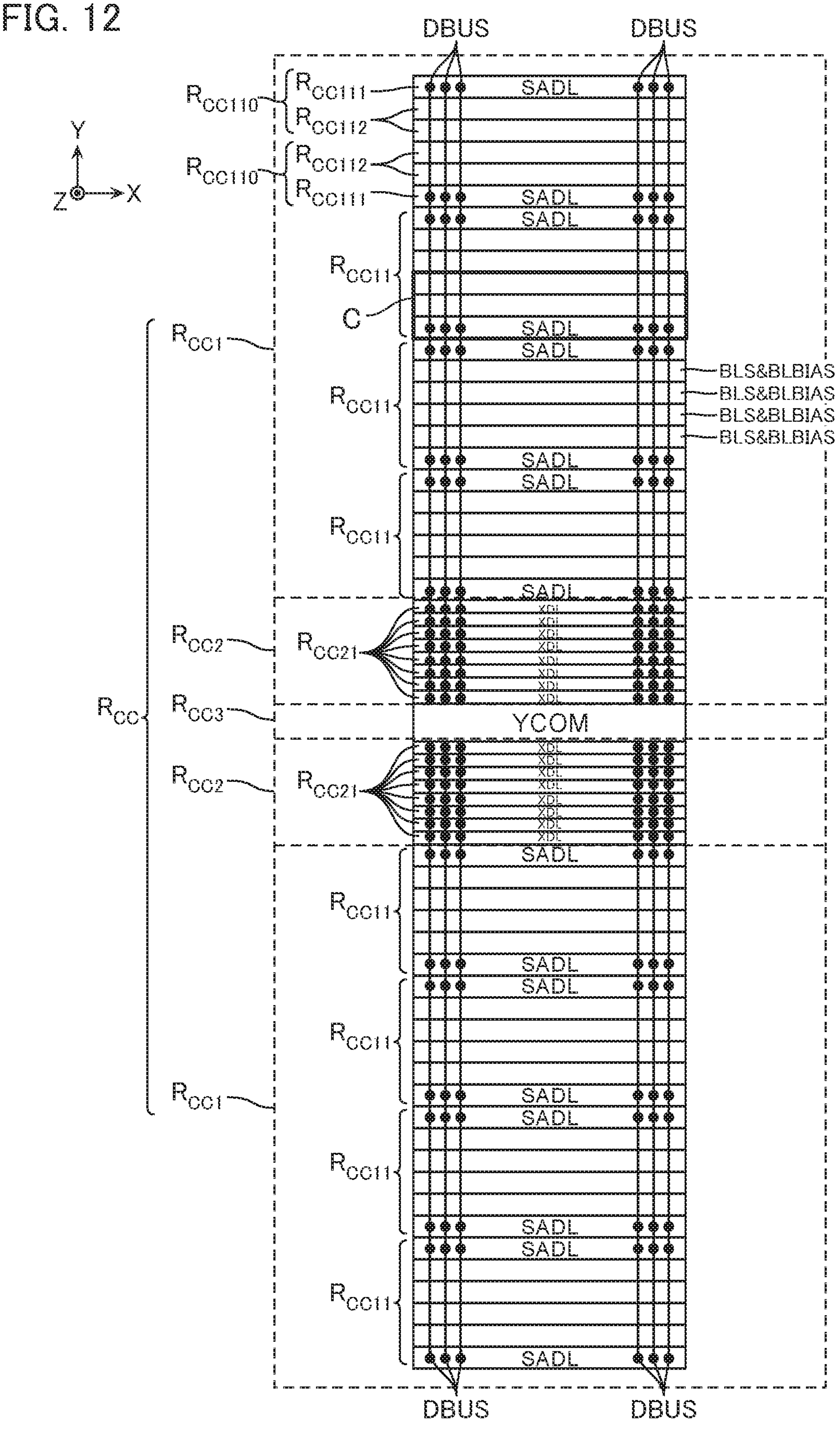
FIG. 12 is a schematic plan view illustrating an enlarged column control circuit region $R_{CC}$ of FIG. 11.
Figure 13:
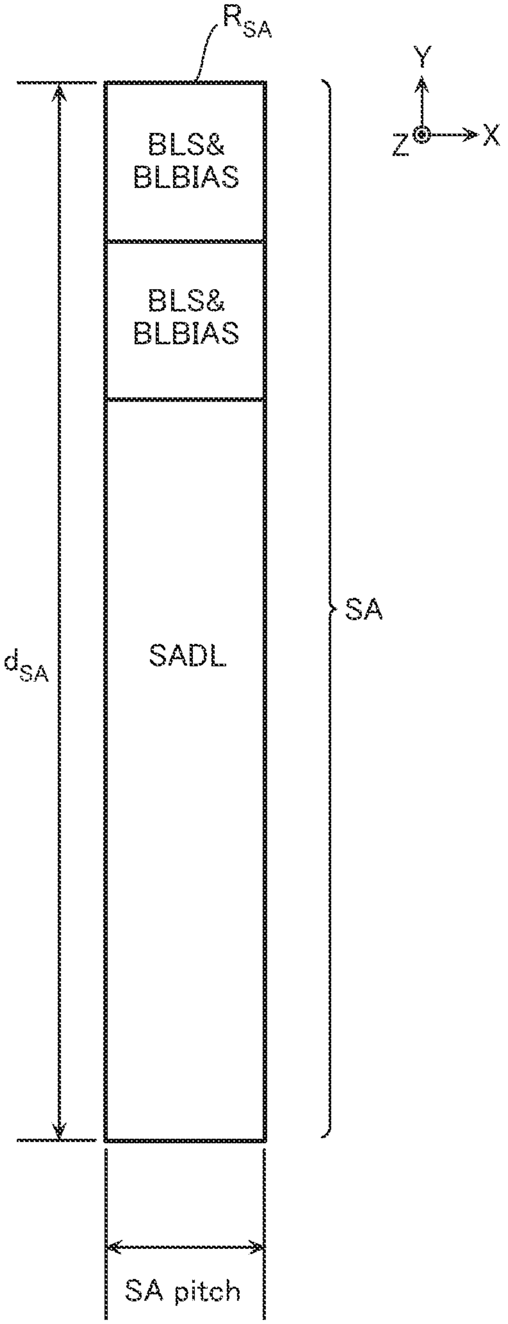
FIG. 13 is a schematic plan view illustrating an enlarged part C of FIG. 12.

FIG. 5 is a schematic bottom view illustrating an exemplary configuration of the chip $C_M$. In FIG. 5, a part of the configurations of the bonding electrode $P_{I1}$ and the like is omitted. FIG. 6 and FIG. 7 are schematic cross-sectional views illustrating a part of the configuration of the memory die MD. FIG. 8 is a schematic bottom view illustrating a part of the configuration of the chip $C_M$. In FIG. 8, an XY cross-sectional surface at a position of the word line WL is illustrated in the left side region, and an XY cross-sectional surface at a position of the drain-side select gate line SGD is illustrated in the right side region. In the right side region of FIG. 8, for indicating connecting portions of semiconductor layers 120 and the bit lines BL, via-contact electrodes ch, Vy, and the bit lines BL are also illustrated. Also in the left side region of FIG. 8, the via-contact electrodes ch, Vy, and the bit lines BL are disposed. FIG. 9 is a schematic cross-sectional view illustrating a part of the configuration of the chip $C_M$. While FIG. 9 illustrates a YZ cross-sectional surface, a structure similar to FIG. 9 is observed also in the observation of a cross-sectional surface along the central axis of the semiconductor layer 120 (for example, XZ cross-sectional surface) other than the YZ cross-sectional surface. FIG. 10 is a schematic plan view illustrating exemplary configurations of hook-up regions $R_{HU1}$, $R_{HU2}$. FIG. 11 is a schematic plan view illustrating an exemplary configuration of the chip $C_P$. In FIG. 11, a part of the configurations of the bonding electrode $P_{I2}$ and the like is omitted. FIG. 12 is a schematic plan view illustrating the enlarged column control circuit region $R_{CC}$ of FIG. 11. FIG. 13 is a schematic plan view illustrating an enlarged part C of FIG. 12. In FIG. 13, the exemplary configuration of the sense amplifier SA is schematically illustrated.

[Structure of Chip $C_M$]

In the example of FIG. 5, the chip $C_M$ includes two memory planes MP arranged in the X-direction. Each of these two memory planes MP includes two regions R1, R2 arranged in the X-direction. The region R1 is on an X-direction negative side, and the region R2 is on an X-direction positive side. Each of these two regions R1, R2 includes a plurality of memory blocks BLK arranged in the Y-direction.

In the example of FIG. 5, each of the plurality of memory blocks BLK in the region R1 includes a memory hole region $R_{MH11}$ that is disposed on the X-direction negative side and has a large width in the X-direction, a memory hole region $R_{MH12}$ that is disposed on the X-direction positive side and has a small width in the X-direction, and a hook-up region $R_{HU1}$ disposed between the two memory hole regions $R_{MH11}$, $R_{MH12}$. Each of the plurality of memory blocks BLK in the region R2 includes a memory hole region $R_{MH21}$ that is disposed on the X-direction positive side and has a large width in the X-direction, a memory hole region $R_{MH22}$ that is disposed on the X-direction negative side and has a small width in the X-direction, and a hook-up region $R_{HU2}$ disposed between the two memory hole regions $R_{MH21}$, $R_{MH22}$. The chip $C_M$ includes a peripheral region $R_P$ disposed on one end side in the Y-direction with respect to the two memory planes MP.

Thus, the memory hole regions $R_{MH11}$, $R_{MH12}$ and the hook-up region $R_{HU1}$ in the region R1, and the memory hole regions $R_{MH21}$, $R_{MH22}$ and the hook-up region $R_{HU2}$ in the region R2 are linearly symmetrical about the boundary between the region R1 and the region R2.

The memory hole regions $R_{MH11}$, $R_{MH12}$ are respectively referred to as a "first memory region" and a "second memory region" in some cases.

For example, as illustrated in FIG. 6, the chip $C_M$ includes a substrate layer $L_{SB}$, a memory cell array layer $L_{MCA}$ disposed below the substrate layer $L_{SB}$, a via-contact electrode layer CH disposed below the memory cell array layer $L_{MCA}$, a plurality of wiring layers M0, M1 disposed below the via-contact electrode layer CH, and a chip bonding electrode layer MB disposed below the wiring layers M0, M1.

[Structure of Substrate Layer $L_{SB}$ in Chip $C_M$]

For example, as illustrated in FIG. 6, the substrate layer $L_{SB}$ includes a conductive layer 100 disposed on the upper surface of the memory cell array layer $L_{MCA}$, an insulating layer 101 disposed on the upper surface of the conductive layer 100, a back side wiring layer MA disposed on the upper surface of the insulating layer 101, and an insulating layer 102 disposed on the upper surface of the back side wiring layer MA.

The conductive layer 100, for example, may contain a semiconductor layer, such as silicon (Si), into which N-type impurities, such as phosphorus (P), or P-type impurities, such as boron (B), are implanted, may contain a metal, such as tungsten (W), or may contain silicide, such as tungsten silicide (WSi).

The conductive layer 100 functions as a part of the source line SL (FIG. 1). The two conductive layers 100 are disposed corresponding to the two memory planes MP (FIG. 5). In an end portion in the X-direction and the Y-direction of the memory plane MP, a region VZ without the conductive layer 100 is disposed.

The insulating layer 101 contains, for example, silicon oxide ($SiO_2$).

The back side wiring layer MA includes a plurality of wirings ma. These plurality of wirings ma may contain, for example, aluminum (Al).

A part of the plurality of wirings ma functions as a part of the source line SL (FIG. 1). The two wirings ma are disposed corresponding to the two memory planes MP (FIG. 5). Each of the wirings ma is electrically connected to the conductive layer 100.

A part of the plurality of wirings ma functions as the external pad electrodes $P_X$. This wiring ma is disposed in the peripheral region $R_P$. This wiring ma is connected to a via-contact electrode CC in the memory cell array layer $L_{MCA}$ in the region VZ without the conductive layer 100. The wiring ma is partially exposed to the outside of the memory die MD via an opening TV provided to the insulating layer 102.

The insulating layer 102 is, for example, a passivation layer made of an insulating material, such as polyimide.

[Structure of Chip $C_M$ in Memory Hole Region $R_{MH}$ of Memory Cell Array Layer $L_{MCA}$]

As described with reference to FIG. 5, the memory cell array layer $L_{MCA}$ includes the plurality of memory blocks BLK arranged in the Y-direction. As illustrated in FIG. 6, an inter-block insulating layer ST, such as silicon oxide ($SiO_2$), is disposed between the two memory blocks BLK adjacent in the Y-direction.

For example, as illustrated in FIG. 6, the memory block BLK includes a plurality of conductive layers 110 arranged in the Z-direction and the plurality of semiconductor layers 120 extending in the Z-direction. Additionally, as illustrated in FIG. 9, respective gate insulating films 130 are disposed between the plurality of conductive layers 110 and the plurality of semiconductor layers 120.

The conductive layer 110 has an approximately plate shape extending in the X-direction. The conductive layer 110 may include, for example, a stacked film of a barrier conductive film, such as titanium nitride (TiN), and a metal film, such as tungsten (W) or molybdenum (Mo). The conductive layer 110 may contain, for example, polycrystalline silicon containing impurities, such as phosphorus (P) or boron (B). Between the plurality of conductive layers 110 arranged in the Z-direction, an interlayer insulating layer 111, such as silicon oxide ($SiO_2$), is disposed.

Among the plurality of conductive layers 110, one or a plurality of conductive layers 110 positioned on the uppermost layer function as a gate electrode of the source-side select transistor STS (FIG. 1) and the source-side select gate line SGS (see FIG. 6). These plurality of conductive layers 110 are electrically independent in every memory block BLK.

Additionally, a plurality of conductive layers 110 positioned below this conductive layer 110 function as a gate electrode of the memory cell MC (FIG. 1) and the word line WL. Each of these plurality of conductive layers 110 is electrically independent in every memory block BLK.

One or a plurality of conductive layers 110 positioned below the conductive layers 110 function as a gate electrode of the drain-side select transistor STD and the drain-side select gate line SGD. For example, as illustrated in FIG. 8, a width $Y_{SGD}$ in the Y-direction of these plurality of conductive layers 110 is smaller than a width $Y_{WL}$ in the Y-direction of the conductive layers 110 that function as the word lines WL. Between two conductive layers 110 adjacent in the Y-direction, an insulating layer SHE, such as silicon oxide ($SiO_2$), is disposed.

For example, as illustrated in FIG. 8, the semiconductor layers 120 are arranged in a predetermined pattern in the X-direction and the Y-direction. The respective semiconductor layers 120 function as the channel regions of the plurality of memory cells MC and the select transistors (STD, STS) included in one memory string MS (FIG. 1). The semiconductor layer 120 contains, for example, polycrystalline silicon (Si). The semiconductor layer 120 has a substantially cylindrical shape and includes an insulating layer 125, such as silicon oxide, in the center portion. The outer peripheral surfaces of the semiconductor layers 120 are each surrounded by the plurality of conductive layers 110 and opposed to these plurality of conductive layers 110.

Additionally, on the upper end of the semiconductor layer 120, an impurity region (not illustrated) is disposed. The impurity region is connected to the conductive layer 100 (see FIG. 6). The impurity region, for example, contains N-type impurities, such as phosphorus (P), or P-type impurities, such as boron (B).

On the lower end of the semiconductor layer 120, an impurity region (not illustrated) is disposed. The impurity region is connected to the bit line BL via a via-contact electrode ch and a via-contact electrode Vy. The impurity region contains N-type impurities, such as phosphorus (P).

For example, as illustrated in FIG. 8, the gate insulating film 130 has an approximately cylindrical shape covering the outer peripheral surface of the semiconductor layer 120. For example, as illustrated in FIG. 9, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 contain, for example, silicon oxide ($SiO_2$) or silicon oxynitride (SiON). The electric charge accumulating film 132 includes a film, such as silicon nitride (SiN), that can accumulate an electric charge. The tunnel insulating film 131, the electric charge accumulating film 132, and the block insulating film 133 have an approximately cylindrical shape, and extend in the Z-direction along the outer peripheral surface of the semiconductor layer 120 excluding a contact portion of the semiconductor layer 120 with the conductive layer 100.

Note that FIG. 9 illustrates an example of the gate insulating film 130 including the electric charge accumulating film 132, such as silicon nitride. However, the gate insulating film 130, for example, may include a floating gate, such as polycrystalline silicon containing N-type or P-type impurities.

[Structure of Chip $C_M$ in Hook-Up Region $R_{HU1}$ of Memory Cell Array Layer $L_{MCA}$]

As illustrated in FIG. 7, the hook-up region $R_{HU1}$ includes a plurality of via-contact electrodes CC. Each of these plurality of via-contact electrodes CC extends in the Z-direction and has an upper end connected to the conductive layer 110 (WL, SGD, SGS). The via-contact electrode CC may include, for example, a stacked film of a barrier conductive film, such as titanium nitride (TiN), and a metal film, such as tungsten (W). On the outer peripheral surface of the via-contact electrode CC, an insulating layer 103, such as silicon oxide ($SiO_2$), is disposed. Accordingly, the via-contact electrode CC is insulated from the surrounding plurality of conductive layers 110.

As illustrated in FIG. 10, the hook-up region $R_{HU1}$ of the region R1 is disposed between the memory hole regions $R_{MH11}$, $R_{MH12}$, and the hook-up region $R_{HU2}$ of the region R2 is disposed between the memory hole regions $R_{MH21}$, $R_{MH22}$. In the memory hole regions $R_{MH11}$, $R_{MH12}$, $R_{MH21}$, and $R_{MH22}$, the first to twelfth memory blocks BLK counting from the Y-direction negative side are referred to as the memory blocks BLK (1) to BLK (12).

The hook-up region $R_{HU1}$ of the region R1 is divided into sub-regions $R_{HU}$ (N1) to $R_{HU}$ (N12) corresponding to the memory blocks BLK (1) to BLK (12). The hook-up region $R_{HU2}$ of the region R2 is divided into sub-regions $R_{HU}$ (P1) to $R_{HU}$ (P12) corresponding to the memory blocks BLK (1) to BLK (12).

In the even-numbered sub-regions $R_{HU}$ (N2), $R_{HU}$ (N4), $R_{HU}$ (N6), $R_{HU}$ (N8), $R_{HU}$ (N10), and $R_{HU}$ (N12), a plurality of rows of the three via-contact electrodes CC arranged in the Y-direction are arranged in the X-direction. In the odd-numbered sub-regions $R_{HU}$ (P1), $R_{HU}$ (P3), $R_{HU}$ (P5), $R_{HU}$ (P7), $R_{HU}$ (P9), and $R_{HU}$ (P11), a plurality of rows of the three via-contact electrodes CC arranged in the Y-direction are arranged in the X-direction.

The plurality of via-contact electrodes CC in the sub-region $R_{HU}$ (P1) are connected to the conductive layers 110 of the respective layers in the memory block BLK (1). The plurality of via-contact electrodes CC in the sub-region $R_{HU}$ (N2) are connected to the conductive layers 110 of the respective layers in the memory block BLK (2). The plurality of via-contact electrodes CC in the sub-region $R_{HU}$ ($P_3$) are connected to the conductive layers 110 of the respective layers in the memory block BLK (3). The plurality of via-contact electrodes CC in the sub-region $R_{HU}$ (N4) are connected to the conductive layers 110 of the respective layers in the memory block BLK (4). The plurality of via-contact electrodes CC in the sub-region $R_{HU}$ ($P_5$) are connected to the conductive layers 110 of the respective layers in the memory block BLK (5). The plurality of via-contact electrodes CC in the sub-region $R_{HU}$ (N6) are connected to the conductive layers 110 of the respective layers in the memory block BLK (6).

The plurality of via-contact electrodes CC in the sub-region $R_{HU}$ ($P_7$) are connected to the conductive layers 110 of the respective layers in the memory block BLK (7). The plurality of via-contact electrodes CC in the sub-region $R_{HU}$ (N8) are connected to the conductive layers 110 of the respective layers in the memory block BLK (8). The plurality of via-contact electrodes CC in the sub-region $R_{HU}$ ($P_9$) are connected to the conductive layers 110 of the respective layers in the memory block BLK (9). The plurality of via-contact electrodes CC in the sub-region $R_{HU}$ (N10) are connected to the conductive layers 110 of the respective layers in the memory block BLK (10). The plurality of via-contact electrodes CC in the sub-region $R_{HU}$ ($P_{11}$) are connected to the conductive layers 110 of the respective layers in the memory block BLK (11). The plurality of via-contact electrodes CC in the sub-region $R_{HU}$ (N12) are connected to the conductive layers 110 of the respective layers in the memory block BLK (12).

A length in the Y-direction of the memory block BLK is referred to as "BLK pitch" in some cases.

[Structure of Chip $C_M$ in Peripheral Region $R_P$ of Memory Cell Array Layer $L_{MCA}$]

For example, as illustrated in FIG. 6, in the peripheral region $R_P$, the plurality of via-contact electrodes CC are disposed corresponding to the external pad electrode $P_X$. These plurality of via-contact electrodes CC have upper ends connected to the external pad electrode $P_X$.

[Structure of Via-Contact Electrode Layer CH]

A plurality of via-contact electrodes ch included in the via-contact electrode layer CH are, for example, electrically connected to at least one of a configuration in the memory cell array layer $L_{MCA}$ and a configuration in the chip $C_P$.

The via-contact electrode layer CH includes a plurality of via-contact electrodes ch as a plurality of wirings. These plurality of via-contact electrodes ch may include, for example, a stacked film of a barrier conductive film, such as titanium nitride (TiN), and a metal film, such as tungsten (W). The via-contact electrodes ch are disposed corresponding to the plurality of semiconductor layers 120, and connected to the lower ends of the plurality of semiconductor layers 120.

[Structure of Wiring Layers M0, M1 in Chip $C_M$]

A plurality of wirings included in the wiring layers M0, M1 are, for example, electrically connected to at least one of a configuration in the memory cell array layer $L_{MCA}$ and a configuration in the chip $C_P$.

The wiring layer M0 (first wiring layer) includes a plurality of wirings m0. For example, these plurality of wirings m0 may include a stacked film of a barrier conductive film, such as titanium nitride (TiN), and a metal film, such as copper (Cu). Note that a part of the plurality of wirings m0 functions as the bit lines BL. For example, as illustrated in FIG. 8, the bit lines BL are arranged in the X-direction and extend in the Y-direction.

For example, as illustrated in FIG. 6, the wiring layer M1 (third wiring layer) includes a plurality of wirings m1, m1*a*. These plurality of wirings m1, m1*a* may include, for example, a stacked film of a barrier conductive film, such as titanium nitride (TiN), and a metal film, such as tungsten (W). Note that a wiring pattern in the wiring layer M1 will be described later. The wirings m1, m1*a* in the wiring layer M1 are referred to as second wirings in some cases.

[Structure of Chip Bonding Electrode Layer MB]

A plurality of wirings included in the chip bonding electrode layer MB are, for example, electrically connected to at least one of the configuration in the memory cell array layer $L_{MCA}$ and the configuration in the chip $C_P$.

The chip bonding electrode layer MB includes a plurality of bonding electrodes $P_{I1}$. These plurality of bonding electrodes $P_{I1}$ may include, for example, a stacked film of a barrier conductive film $P_{I1B}$, such as titanium nitride (TiN), and a metal film $P_{I1M}$, such as copper (Cu).

[Structure of Chip $C_P$]

For example, as illustrated in FIG. 11, the chip $C_P$ includes regions MP' overlapping with the two memory planes MP arranged in the X-direction. Each of these two regions MP' includes two regions R1', R2' arranged in the X-direction. The region R1' overlaps with the region R1 of FIG. 5 viewed in the Z-direction. The region R2' overlaps with the region R2 of FIG. 5 viewed in the Z-direction.

A row control circuit region $R_{RC}$ is disposed in an end portion on the X-direction positive side of the region R1'. In the region R1', a block decoder region $R_{BD}$ is disposed to be adjacent to the row control circuit region $R_{RC}$ on the X-direction negative side. In the region R1', a peripheral circuit region $R_{PC}$ is disposed to be adjacent to the block decoder region $R_{BD}$ on the X-direction negative side. A row control circuit region $R_{RC}$ is disposed in an end portion on the X-direction negative side of the region R2'. In the region R2', a block decoder region $R_{BD}$ is disposed to be adjacent to the row control circuit region $R_{RC}$ on the X-direction positive side. In the region R2', a peripheral circuit region $R_{PC}$ is disposed to be adjacent to the block decoder region $R_{BD}$ on the X-direction positive side.

The peripheral circuit region $R_{PC}$ includes four column control circuit regions $R_{CC}$ arranged in the X-direction and the Y-direction. Although the illustration is omitted, circuits are disposed also in the other regions in the peripheral circuit region RPC. In a region of the chip $C_P$ opposed to the peripheral region $R_P$ of the chip $C_M$ (FIG. 5), a circuit region $R_c$ is disposed.

In the row control circuit region $R_{RC}$, a plurality of block decode units blkd described with reference to FIG. 2 are disposed. That is, in the row control circuit region $R_{RC}$, a plurality of word line switches WLSW constituting a plurality of block decode units blkd are disposed. In the block decoder region $R_{BD}$, the block decoder BLKD described with reference to FIG. 2 is disposed. In the column control circuit region $R_{CC}$, the column control circuit ColC described with reference to FIG. 3 is disposed. In the circuit region $R_C$, an input/output circuit (not illustrated) is disposed. This input/output circuit is connected to the external pad electrode $P_X$ via the via-contact electrode CC or the like described with reference to FIG. 6.

In FIG. 11, regions overlapping with the hook-up regions Ran, $R_{HU2}$ (FIG. 5) viewed in the Z-direction are illustrated by dotted lines. In the example of FIG. 11, a part of the row control circuit region $R_{RC}$ of the region R1' is disposed in a region overlapping with the hook-up region $R_{HU1}$ (FIG. 5) viewed in the Z-direction. Additionally, a part of the row control circuit region $R_{RC}$ of the region R1' is disposed in a region overlapping with the memory hole region $R_{MH12}$ (FIG. 5) viewed in the Z-direction, and disposed in a region overlapping with a part of the memory hole region $R_{MH11}$ (FIG. 5) viewed in the Z-direction. In the example of FIG. 11, a width in the X-direction of the row control circuit region $R_{RC}$ is larger than a width in the X-direction of the hook-up region $R_{HU1}$ (FIG. 5).

In the example of FIG. 11, a part of the row control circuit region $R_{RC}$ of the region R2' is disposed in a region overlapping with the hook-up region $R_{HU2}$ (FIG. 5) viewed in the Z-direction. Additionally, a part of the row control circuit region $R_{RC}$ of the region R2' is disposed in a region overlapping with the memory hole region $R_{MH22}$ (FIG. 5) viewed in the Z-direction, and disposed in a region overlapping with a part of the memory hole region $R_{MH21}$ (FIG. 5) viewed in the Z-direction. In the example of FIG. 11, a width in the X-direction of the row control circuit region $R_{RC}$ is larger than a width in the X-direction of the hook-up region $R_{HU2}$ (FIG. 5).

Thus, the row control circuit region $R_{RC}$, the block decoder region $R_{BD}$, and the peripheral circuit region $R_{PC}$ (including four column control circuit regions $R_{CC}$) in the region R1' and the row control circuit region $R_{RC}$, the block decoder region $R_{BD}$, and the peripheral circuit region $R_{PC}$ (including four column control circuit regions $R_{CC}$) in the region R2' are linearly symmetrical about the boundary between the region R1' and the region R2'.

A plurality of passing wirings TW connect between the peripheral circuits PC in the region MP'. As illustrated in FIG. 11, the plurality of passing wirings TW extend in the Y-direction. The plurality of passing wirings TW transmit various signals including a control signal. The plurality of passing wirings TW are formed in, for example, a wiring layer D4 of the chip $C_P$. However, the plurality of passing wirings TW may be formed in a wiring layer (for example, wiring layer D2, D3) other than the wiring layer D4. Although not illustrated in FIG. 11, a plurality of passing wirings extending in the X-direction are also disposed. These plurality of passing wirings are formed in, for example, the wiring layers D2, D3 in the chip $C_P$. However, these plurality of passing wirings may be formed in a wiring layer (for example, wiring layer D4) other than the wiring layers D2, D3.

The plurality of passing wirings TW pass above the column control circuit regions $R_{CC}$.

[Configuration of Column Control Circuit Region $R_{CC}$ in Chip $C_P$]

As illustrated in FIG. 12, the column control circuit region $R_{CC}$ includes two regions $R_{CC1}$ arranged in the Y-direction, two regions $R_{CC2}$ arranged in the Y-direction between these two regions $R_{CC1}$, and a region $R_{CC3}$ disposed between these two regions $R_{CC2}$.

The region $R_{CC1}$ includes four regions $R_{CC11}$ arranged in the Y-direction. Each of these four regions $R_{CC11}$ includes two regions $R_{CC111}$ arranged in the Y-direction and four regions $R_{CC112}$ arranged in the Y-direction between these two regions $R_{CC111}$. In the region $R_{CC111}$, a plurality of sense amplifier circuits SADL described with reference to FIG. 3 are disposed. In the region $R_{CC112}$, a plurality of switch transistors BLS, BLBIAS described with reference to FIG. 3 are disposed. In the following description, a region including one region $R_{CC111}$ and two regions $R_{CC112}$ corresponding to the region $R_{CC111}$ is referred to as a region $R_{CC110}$ in some cases.

In this embodiment, a part (part C of FIG. 12) of the region $R_{CC110}$ is referred to as a sense amplifier SA as illustrated in FIG. 13 in some cases. In FIG. 12, while a width in the X-direction is illustrated to be larger than a width in the Y-direction of the sense amplifier SA (part C), actually, as illustrated in FIG. 13, the width in the Y-direction is larger than the width in the X-direction of the sense amplifier SA. The width in the X-direction of the sense amplifier SA is referred to as an "SA pitch" in some cases. The width in the Y-direction of the sense amplifier SA is referred to as a width or length "$d_{SA}$" in some cases. The region in which the sense amplifier SA is disposed is referred to as a sense amplifier region "$R_{SA}$" in some cases.

The sense amplifier SA includes a sense amplifier circuit SADL (FIG. 3) and a pair of switch transistors BLS (FIG. 3), BLBIAS (FIG. 3). The sense amplifier circuit SADL includes one sense amplifier circuit SADL described with reference to FIG. 3.

As illustrated in FIG. 12, the region $R_{CC2}$ includes eight regions $R_{CC21}$ arranged in the Y-direction. Each of these eight regions $R_{CC21}$ includes a plurality of latch circuits XDL (FIG. 3) arranged in the X-direction. The number of the latch circuits XDL arranged in the X-direction in one region $R_{CC21}$ is the same as the number of the sense amplifier circuits SADL arranged in the X-direction in one region $R_{CC111}$. For example, when the eight sense amplifier circuits SADL arranged in the X-direction are disposed in one region $R_{CC111}$, the eight latch circuits XDL arranged in the X-direction are disposed in one region $R_{CC21}$.

In this embodiment, as illustrated in FIG. 12, a plurality of wirings DBUS are disposed corresponding to the plurality of sense amplifier circuits SADL arranged in the X-direction. As illustrated in FIG. 12, these respective plurality of wirings DBUS extend in the Y-direction, and are connected to the eight sense amplifier circuits SADL arranged in the Y-direction and the eight latch circuits XDL arranged in the Y-direction in common.

As illustrated in FIG. 12, the region $R_{CC3}$ includes a circuit YCOM that controls the sense amplifier circuit SADL, the latch circuit XDL, and the like described with reference to FIG. 3.

For example, as illustrated in FIG. 6, the chip $C_P$ includes a semiconductor substrate 200, an electrode layer GC disposed above the semiconductor substrate 200, wiring layers D0, D1, D2, D3, and D4 disposed above the electrode layer GC, and a chip bonding electrode layer DB disposed above the wiring layers D0, D1, D2, D3, and D4.

[Structure of Semiconductor Substrate 200 of Chip $C_P$]

The semiconductor substrate 200, for example, contains P-type silicon (Si) containing P-type impurities, such as boron (B). On the surface of the semiconductor substrate 200, for example, an N-type well region 200N containing N-type impurities, such as phosphorus (P), a P-type well region 200P containing P-type impurities, such as boron (B), a semiconductor substrate region 200S in which the N-type well region 200N or the P-type well region 200P is not disposed, and an insulating region 2001 are disposed. A part of the P-type well region 200P is disposed in the semiconductor substrate region 200S, and a part of the P-type well region 200P is disposed in the N-type well region 200N. Each of the N-type well region 200N, the P-type well regions 200P disposed in the N-type well region 200N and the semiconductor substrate region 200S, and the semiconductor substrate region 200S functions as a part of a plurality of transistors Tr, a plurality of capacitors, and the like constituting the peripheral circuit PC.

[Structure of Electrode Layer GC of Chip $C_P$]

The electrode layer GC is disposed on the upper surface of the semiconductor substrate 200 via an insulating layer 200G. The electrode layer GC includes a plurality of electrodes gc opposed to the surface of the semiconductor substrate 200. Additionally, the respective regions in the semiconductor substrate 200 and the plurality of electrodes gc included in the electrode layer GC are connected to via-contact electrodes CS.

The respective N-type well region 200N, P-type well regions 200P disposed in the N-type well region 200N and the semiconductor substrate region 200S, and semiconductor substrate region 200S of the semiconductor substrate 200 function as channel regions of a plurality of transistors Tr, one electrodes of a plurality of capacitors, and the like constituting the peripheral circuit PC.

The respective plurality of electrodes gc included in the electrode layer GC function as gate electrodes of the plurality of transistors Tr, the other electrodes of the plurality of capacitors, and the like constituting the peripheral circuit PC.

The via-contact electrode CS extends in the Z-direction, and has a lower end connected to the upper surface of the semiconductor substrate 200 or the electrode gc. In a connecting part between the via-contact electrode CS and the semiconductor substrate 200, an impurity region containing N-type impurities or P-type impurities is disposed. The via-contact electrode CS may include, for example, a stacked film of a barrier conductive film, such as titanium nitride (TiN), and a metal film, such as tungsten (W).

[Structure of Wiring Layers D0, D1, D2, D3, and D4 of Chip $C_P$]

For example, as illustrated in FIG. 6, a plurality of wirings included in the wiring layers D0, D1, D2, D3, and D4 are electrically connected to, for example, at least one of the configuration in the memory cell array layer $L_{MCA}$ and the configuration in the chip $C_P$.

The wiring layers D0, D1, and D2 include a plurality of wirings d0, d1, and d2, respectively. These plurality of wirings d0, d1, and d2 may include, for example, a stacked film of a barrier conductive film, such as titanium nitride (TiN), and a metal film, such as tungsten (W).

The wiring layers D3, D4 include a plurality of wirings d3, d4, respectively. The wiring layer D4 includes a plurality of passing wirings TW. These plurality of wirings d3, d4 and passing wirings TW may include, for example, a stacked film of a barrier conductive film, such as titanium nitride (TiN), tantalum nitride (TaN), and a stacked film of tantalum nitride (TaN) and tantalum (Ta); and a metal film, such as copper (Cu). The wiring layer D4 may be referred to as a second wiring layer, and the wiring d4 may be referred to as a first wiring in some cases.

[Structure of Chip Bonding Electrode Layer DB]

A plurality of wirings included in the chip bonding electrode layer DB are electrically connected to, for example, at least one of the configuration in the memory cell array layer $L_{MCA}$ and the configuration in the chip $C_P$.

The chip bonding electrode layer DB includes a plurality of bonding electrodes $P_{I2}$. These plurality of bonding electrodes $P_{I2}$ may include, for example, a stacked film of a barrier conductive film $P_{I2B}$, such as titanium nitride (TiN), tantalum nitride (TaN), and a stacked film of tantalum nitride (TaN) and tantalum (Ta); and a metal film $P_{I2M}$, such as copper (Cu).

When metal films $P_{I1M}$, $P_{I2M}$, such as copper (Cu), are used for the bonding electrode $P_{I1}$ and the bonding electrode $P_{I2}$, the metal film $P_{I1M}$ is integrated with the metal film $P_{I2M}$, and it becomes difficult to confirm the boundary thereof. However, the bonding structure can be confirmed by a distortion of a bonding shape of the bonding electrode $P_{I1}$ and the bonding electrode $P_{I2}$ due to the displacement of bonding position, and a positional displacement of the barrier conductive films $P_{I1B}$, $P_{I2B}$ (generation of discontinuous portion in the side surface). When the bonding electrode $P_{I1}$ and the bonding electrode $P_{I2}$ are formed by a damascene method, side surfaces of them each have a tapered shape. Therefore, the shape of a cross-sectional surface along the Z-direction in the portion where the bonding electrode $P_{I1}$ and the bonding electrode $P_{I2}$ are bonded together has a non-rectangular shape with non-linear side walls. When the bonding electrode $P_{I1}$ and the bonding electrode $P_{I2}$ are bonded together, the bottom surfaces, the side surfaces, and the upper surfaces of Cu forming these bonding electrodes are covered with a barrier metal in the structure. In contrast, in a common wiring layer using Cu, an insulating layer (SiN, SiCN, or the like) having an anti-oxidation function of Cu is disposed on the upper surface of Cu, and a barrier metal is not disposed. Therefore, even when the displacement of bonding position does not occur, the distinction from the common wiring layer can be made.

[Position of Memory Cell Array MCA and Area of Row Control Circuit Region $R_{RC}$]

Figure 14:
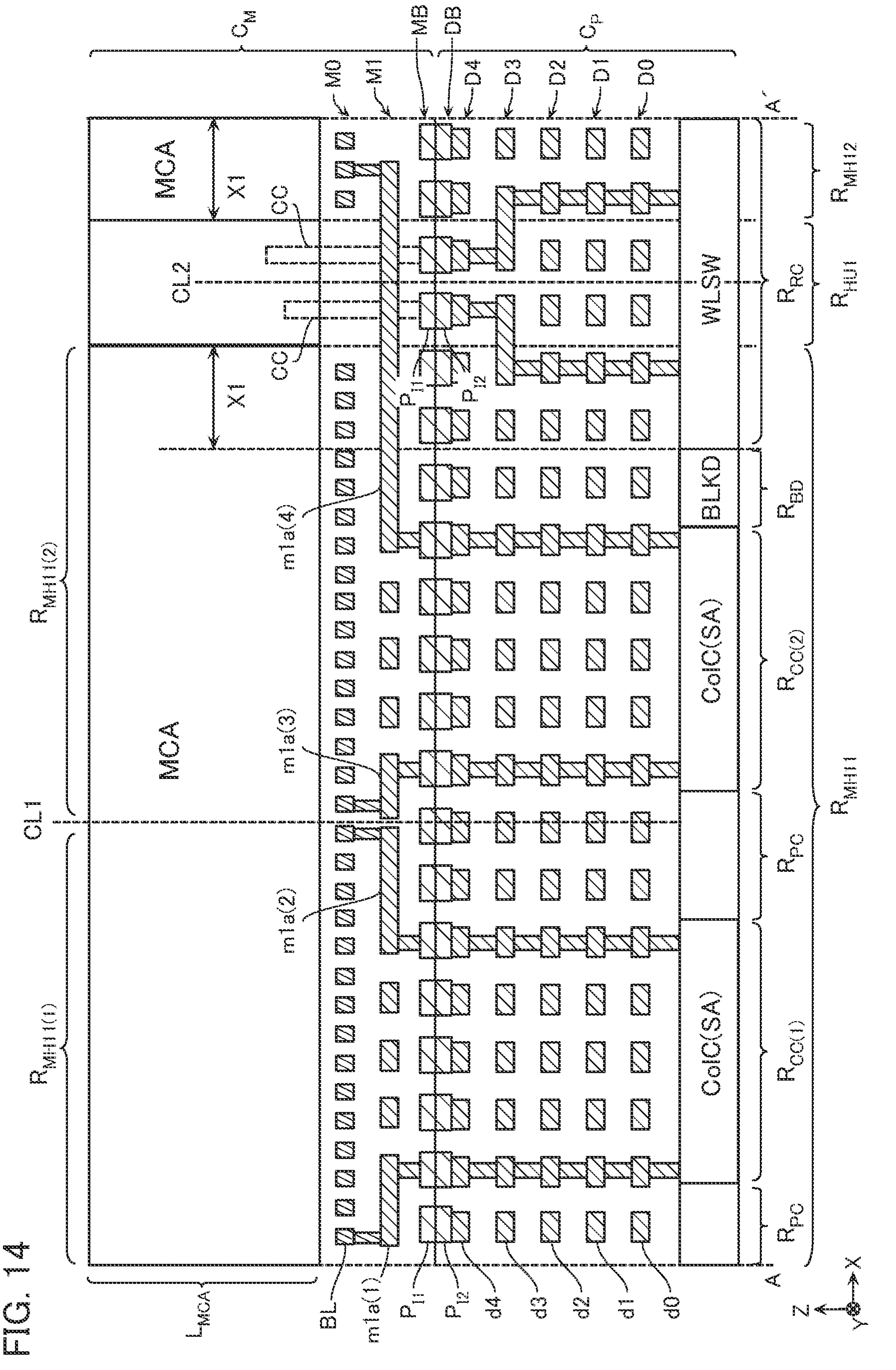
FIG. 14 is a schematic cross-sectional view of the chip $C_M$ and the chip $C_P$ taken along a line A-A' of FIG. 11 viewed along an arrow direction.

FIG. 14 is a schematic cross-sectional view of the chip $C_M$ and the chip $C_P$ taken along a line A-A' of FIG. 11 viewed along an arrow direction.

As described with reference to FIG. 7, the word lines WL (conductive layers 110) disposed in the memory cell array MCA are connected to the via-contact electrodes CC in the hook-up region $R_{HU1}$. As illustrated in FIG. 14, the via-contact electrode CC is connected to the bonding electrode $P_{I1}$ via the wirings m0, m1 of the wiring layers M0, M1. The bonding electrode $P_{I1}$ is connected to the bonding electrode $P_{I2}$. The bonding electrode $P_{I2}$ is connected to the word line switch WLSW disposed in the row control circuit region $R_{RC}$ via the wirings d4 to d0 of the wiring layers D4 to DO. In this case, any one or a plurality of the wirings d3 to d0 of the wiring layers D3 to D0 extend in the X-direction from the position of the bonding electrode $P_{I2}$ to the position of the word line switch WLSW. In the example of FIG. 14, the wiring d3 of the wiring layer D3 extends in the X-direction from the position of the bonding electrode $P_{I2}$ to the position of the word line switch WLSW.

Here, when the center position in the X-direction of the hook-up region $R_{HU1}$ is significantly displaced from the center position in the X-direction of the row control circuit region $R_{RC}$, a difference between the number of the wirings d3 to d0 of the wiring layers D3 to D0 extending in the X-direction negative side and the number of the wirings d3 to d0 of the wiring layers D3 to D0 extending in the X-direction positive side increases. For example, when the center position in the X-direction of the row control circuit region $R_{RC}$ is significantly displaced to the X-direction positive side from the center position in the X-direction of the hook-up region $R_{HU1}$, the number of the wirings d3 to d0 of the wiring layers D3 to D0 extending in the X-direction negative side becomes significantly larger than the number of the wirings d3 to d0 of the wiring layers D3 to D0 extending in the X-direction positive side. In this case, the wirings d3 to d0 of the wiring layers D3 to D0 extending in the X-direction negative side are possibly crowded. Especially, the larger the number of stacking of the word lines WL (conductive layers 110) becomes, the more the concern is caused.

Since a relatively large voltage is applied to the word line WL in some cases, a high-voltage transistor is used as the word line switch WLSW. Here, the high-voltage transistor is relatively large in some cases. In view of this, the area of the row control circuit region $R_{RC}$ described with reference to FIG. 11 becomes relatively large in some cases.

Therefore, in the configuration of this embodiment, the center position in the X-direction of the hook-up region $R_{HU1}$ is the same or approximately the same as the center position in the X-direction of the row control circuit region $R_{RC}$, and the width in the X-direction of the row control circuit region $R_{RC}$ is larger than the width in the X-direction of the hook-up region $R_{HU1}$.

Specifically, the memory hole region $R_{MH11}$ (memory cell array MCA) is disposed on the X-direction negative side of the hook-up region $R_{HU1}$, and the memory hole region $R_{MH12}$ (memory cell array MCA) is disposed on the X-direction positive side of the hook-up region $R_{HU1}$. Then, in the region R1', a part of the row control circuit region $R_{RC}$ is disposed in a region overlapping with the hook-up region $R_{HU1}$ viewed in the Z-direction, another part of the row control circuit region $R_{RC}$ is disposed in a region overlapping with a part of the memory hole region $R_{MH11}$ viewed in the Z-direction, and still another part of the row control circuit region $R_{RC}$ is disposed in a region overlapping with the memory hole region $R_{MH12}$ viewed in the Z-direction. In this case, a width X1 in the X-direction of the memory hole region $R_{MH12}$ is the same as a width X1 in the X-direction of the region in which the row control circuit region $R_{RC}$ overlaps with the memory hole region $R_{MM11}$. This causes the center position in the X-direction of the hook-up region $R_{HU1}$ and the center position in the X-direction of the row control circuit region $R_{RC}$ to be same at a center position CL2. While the configuration of the region R1' (region R1) is described with reference to FIG. 14, the configuration of the region R2' (region R2) is similar to that of the region R1'.

[Role of Wiring M1*a* in Wiring Layer M1]

When the structure as described above is employed, a part of the bit lines BL are disposed at not only positions overlapping with the column control circuit region $R_{CC}$, but also positions overlapping with the row control circuit region $R_{RC}$ (excluding hook-up region $R_{HU1}$), the block decoder region $R_{BD}$, and the peripheral circuit region $R_{PC}$ viewed in the Z-direction.

Therefore, in this embodiment, the wirings m1*a* extending in the X-direction as illustrated in FIG. 14 are disposed in the wiring layer M1, and the bit lines BL are electrically connected to the configurations in the column control circuit region $R_{CC}$ via the wirings m1*a*. With this configuration, the increase in circuit area of the memory die MD in association with the increase in area of the row control circuit region $R_{RC}$ is reduced, thus enabling providing a semiconductor memory device allowing high integration. Since the center position in the X-direction of the hook-up region $R_{HU1}$ and the center position in the X-direction of the row control circuit region $R_{RC}$ are same at the center position CL2, the crowded state of the wirings d4 to d0 of the wiring layers D4 to D0 can be reduced.

In FIG. 14, the center position of the memory hole region $R_{MH11}$ is referred to as "CL1" in some cases. In the memory hole region $R_{MH11}$, the region on the X-direction negative side with respect to the center position CL1 is referred to as "$R_{MH11(1)}$," and the region on the X-direction positive side with respect to the center position CL1 is referred to as "$R_{MH11(2)}$" in some cases. Since a part of the row control circuit region $R_{RC}$ is disposed in the region overlapping with a part of the memory hole region $R_{MH11}$ (region having the width X1) viewed in the Z-direction, and the block decoder region $R_{BD}$ is disposed on the X-direction negative side of the row control circuit region $R_{RC}$, the center position CL1 of the memory hole region $R_{MH11}$ is displaced from the center position of the peripheral circuit region $R_{PC}$ between a column control circuit region $R_{CC(1)}$ on the X-direction negative side and a column control circuit region $R_{CC(2)}$ on the X-direction positive side.

In this embodiment, a plurality of bit lines BL in the memory hole region $R_{MH11(1)}$ are connected to the sense amplifier SA (sense amplifier circuit SADL) of the column control circuit ColC in the column control circuit region $R_{CC(1)}$ via the wirings m1*a*. A plurality of bit lines BL in the memory hole region $R_{MH11(2)}$ and the memory hole region $R_{MH12}$ are connected to the sense amplifier SA (sense amplifier circuit SADL) of the column control circuit ColC in the column control circuit region $R_{CC(2)}$ via the wiring m1*a*.

For example, as illustrated in FIG. 14, the bit line BL in the end portion on the X-direction negative side of the memory hole region $R_{MH11(1)}$ is electrically connected to the sense amplifier SA in the column control circuit region $R_{CC}$ via a wiring m1*a*(1). The bit line BL in the end portion on the X-direction positive side of the memory hole region $R_{MH11(1)}$ is electrically connected to the sense amplifier SA in the column control circuit region $R_{CC}$ via a wiring m1*a*(2). The bit line BL in the end portion on the X-direction negative side of the memory hole region $R_{MH11(2)}$ is electrically connected to the sense amplifier SA in the column control circuit region $R_{CC}$ via a wiring m1*a*(3). The bit line BL in the memory hole region $R_{MH12}$ is electrically connected to the sense amplifier SA in the column control circuit region $R_{CC}$ via a wiring m1*a*(4).

[Wiring Pattern in Wiring Layer M1]

The following describes a wiring pattern in the wiring layer M1.

Figure 15:
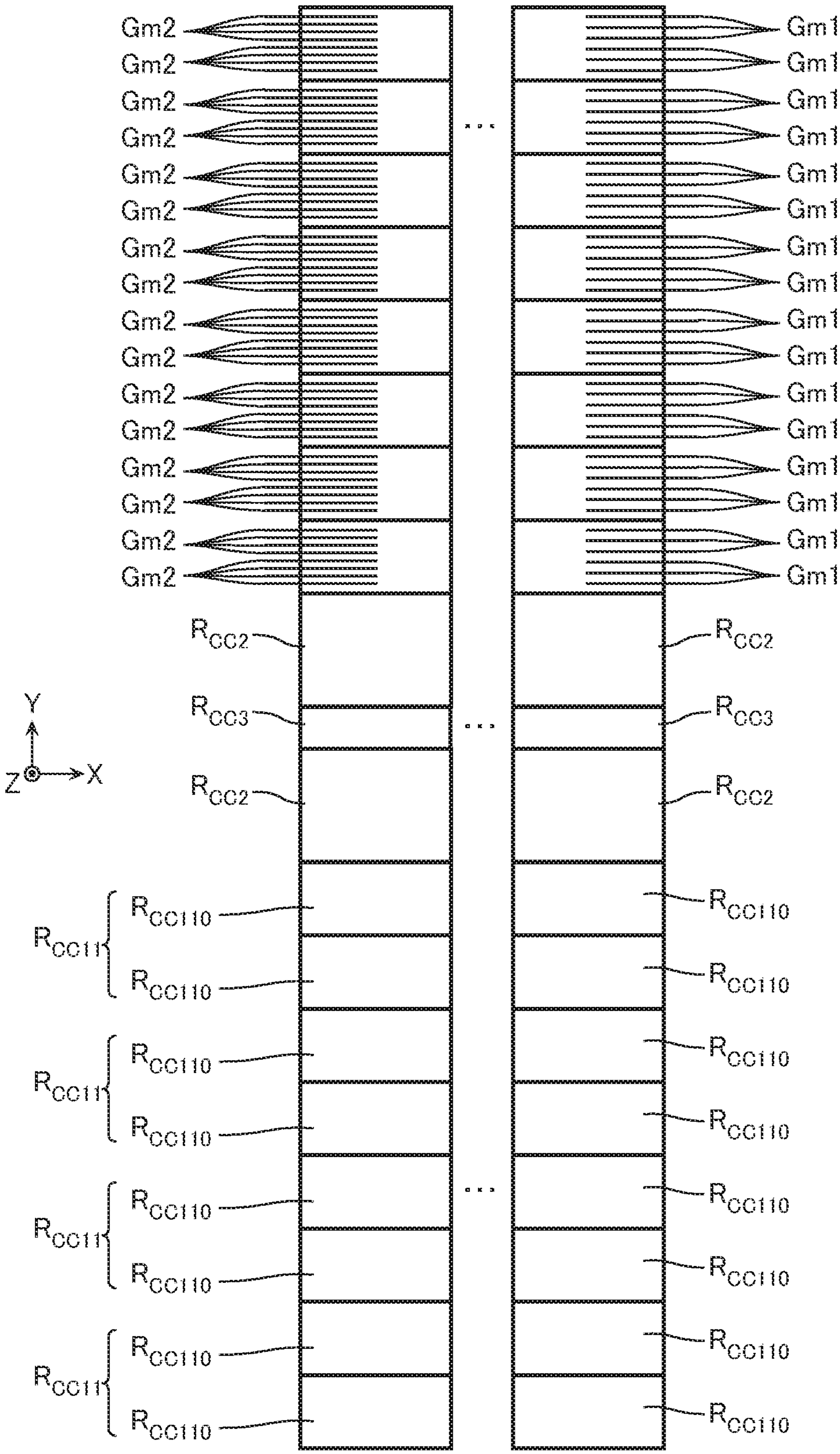
FIG. 15 is a schematic plan view for describing a wiring group Gm1 and a wiring group Gm2.
Figure 16:
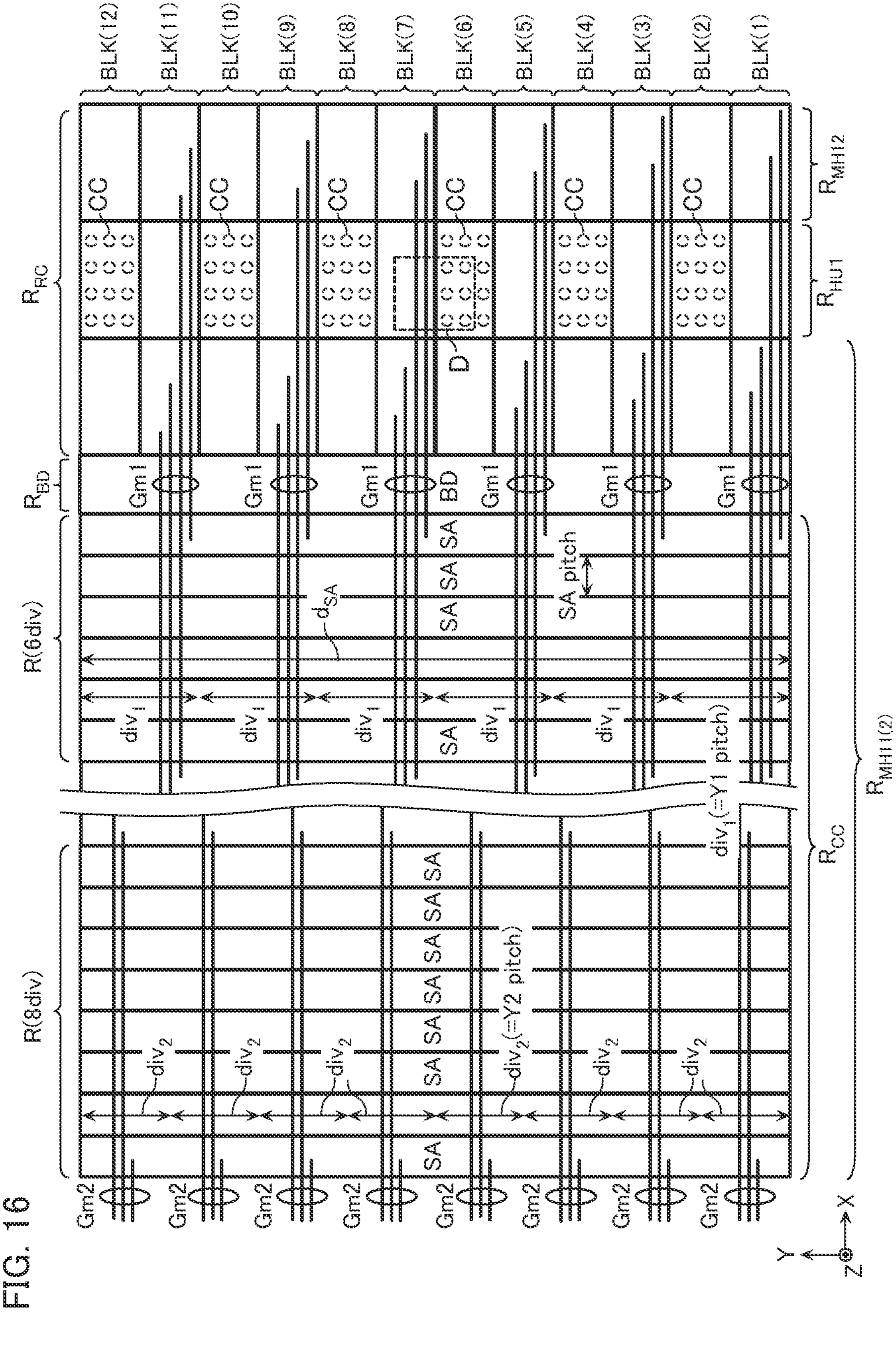
FIG. 16 is a schematic plan view illustrating an enlarged part B of FIG. 11.
Figure 17:
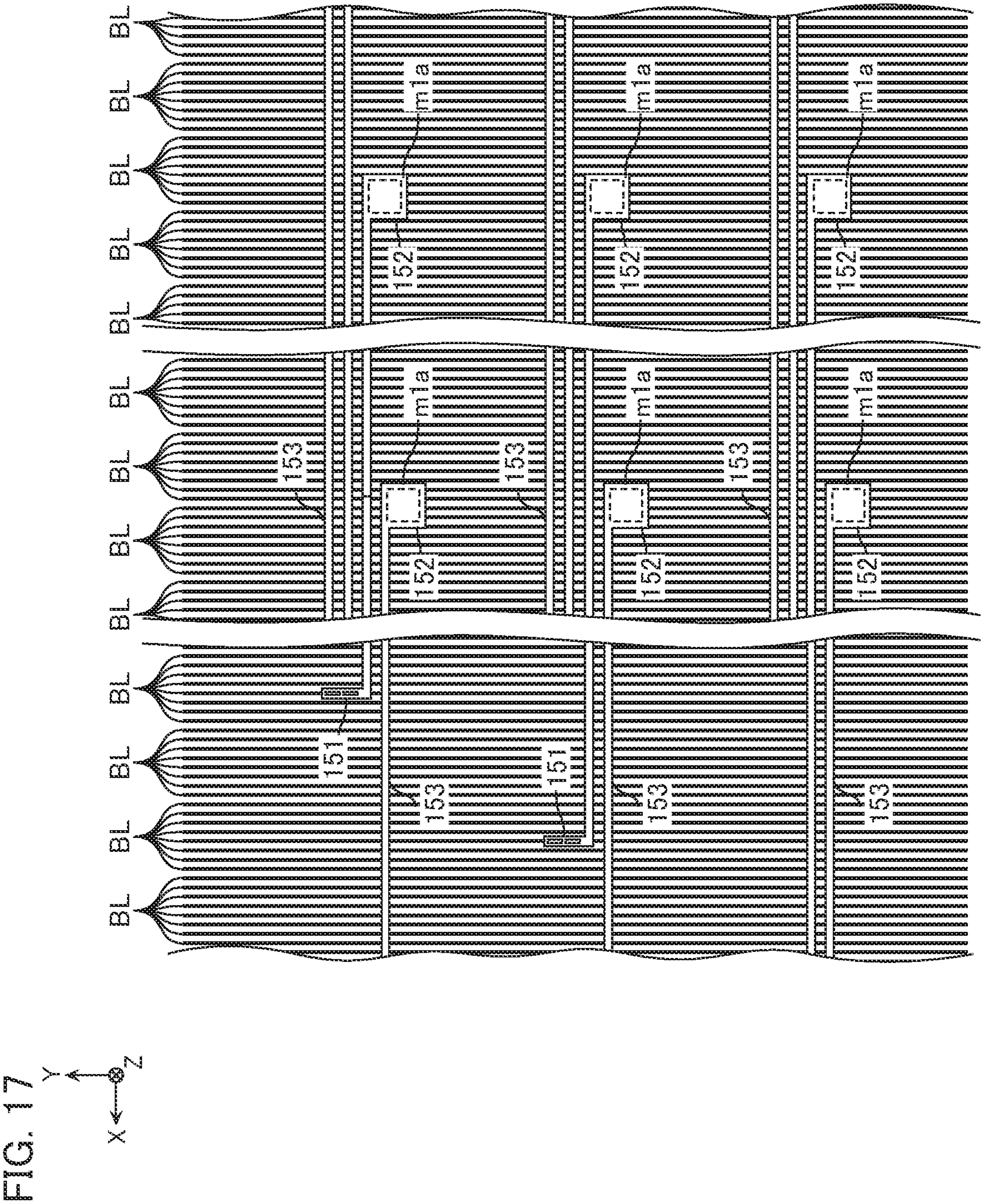
FIG. 17 is a schematic bottom view for describing a wiring m1*a* in a wiring layer M1.
Figure 18:
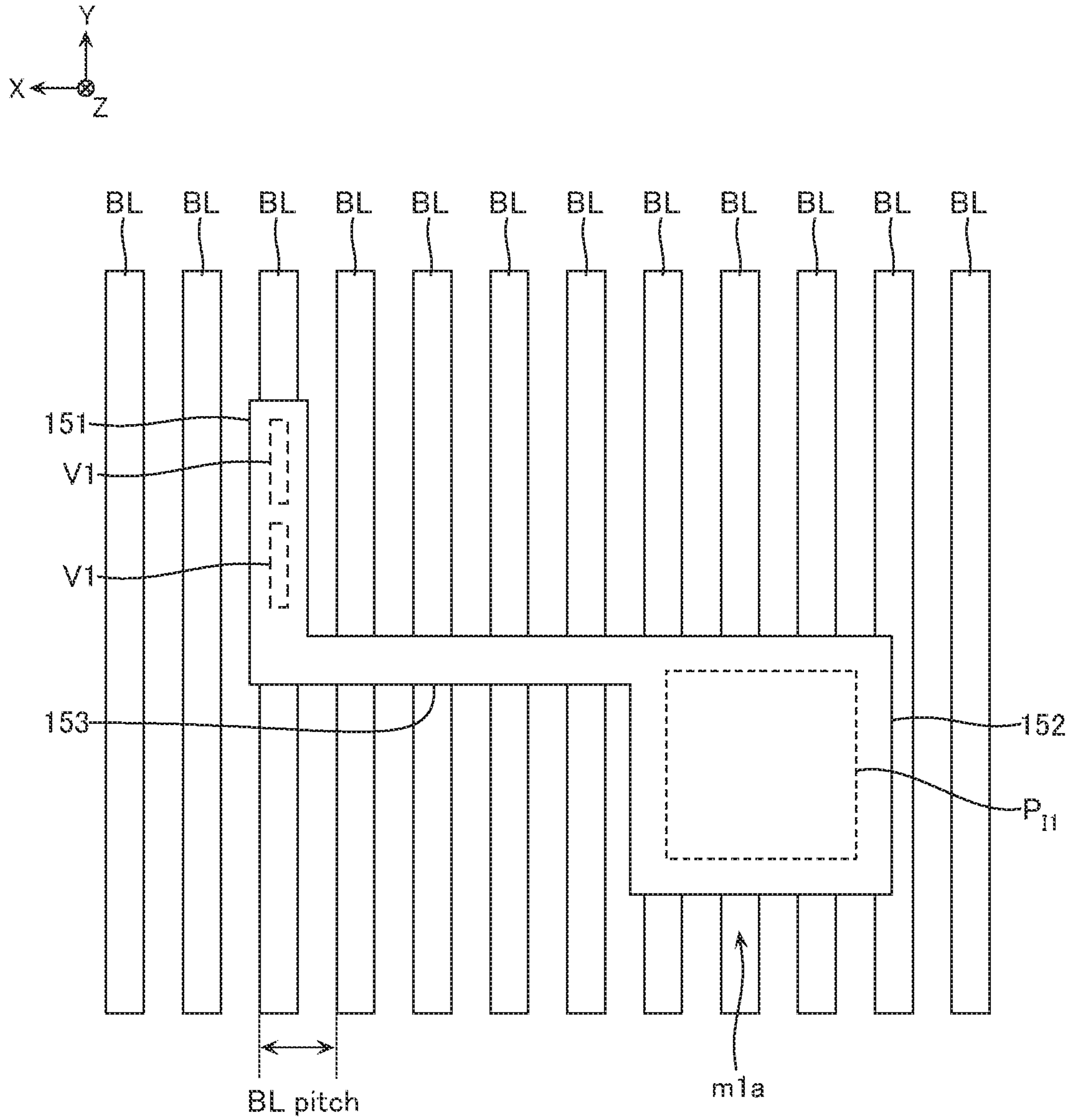
FIG. 18 is a schematic bottom view for describing the wiring m1*a;*
Figure 19:
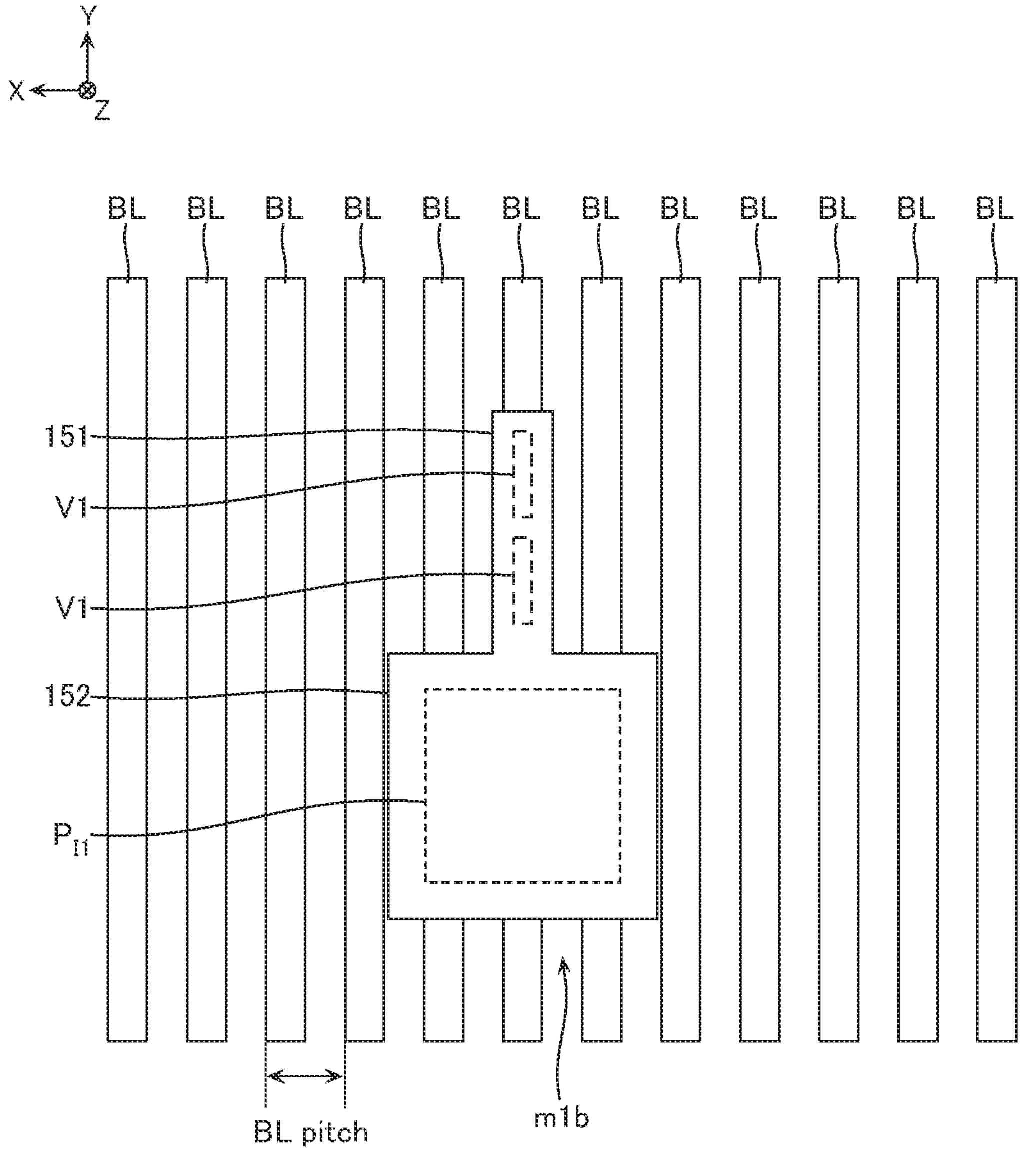
FIG. 19 is a schematic bottom view for describing a wiring m1*b;*

FIG. 15 is a schematic plan view for describing a wiring group Gm1 and a wiring group Gm2. FIG. 16 is a schematic plan view illustrating an enlarged part B of FIG. 11. In FIG. 16, a plurality of wiring groups Gm1, Gm2 and a plurality of via-contact electrodes CC in the wiring layer M1 are also illustrated in a manner of overlapping with the region of the part B of FIG. 11. FIG. 17 is a schematic bottom view for describing the wiring m1*a* in the wiring layer M1. FIG. 18 is a schematic bottom view for describing the wiring m1*a*. FIG. 19 is a schematic bottom view for describing a wiring m1*b*.

Figure 20:
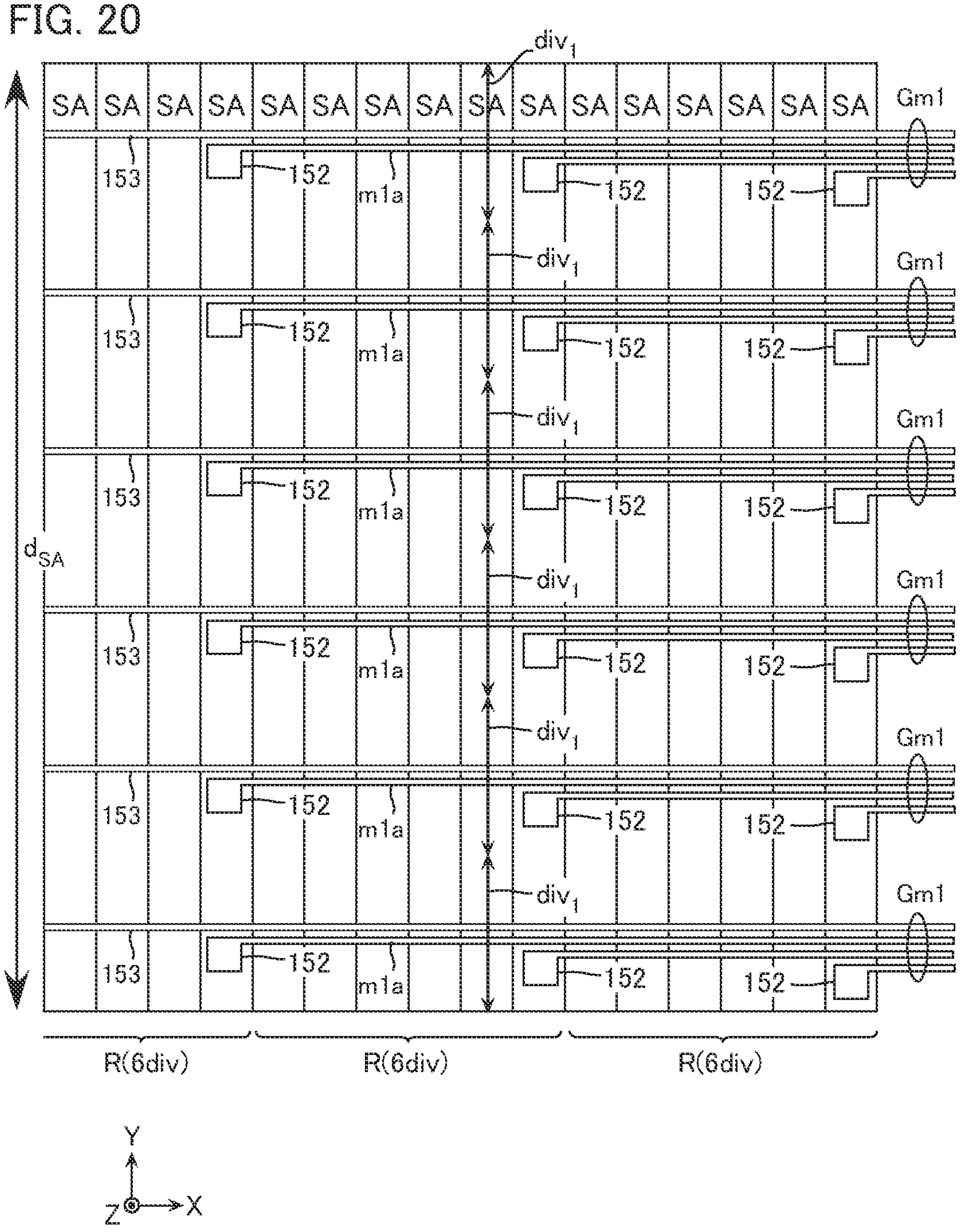
FIG. 20 is a schematic plan view for describing a wiring pattern of the wiring groups Gm1.
Figure 21:
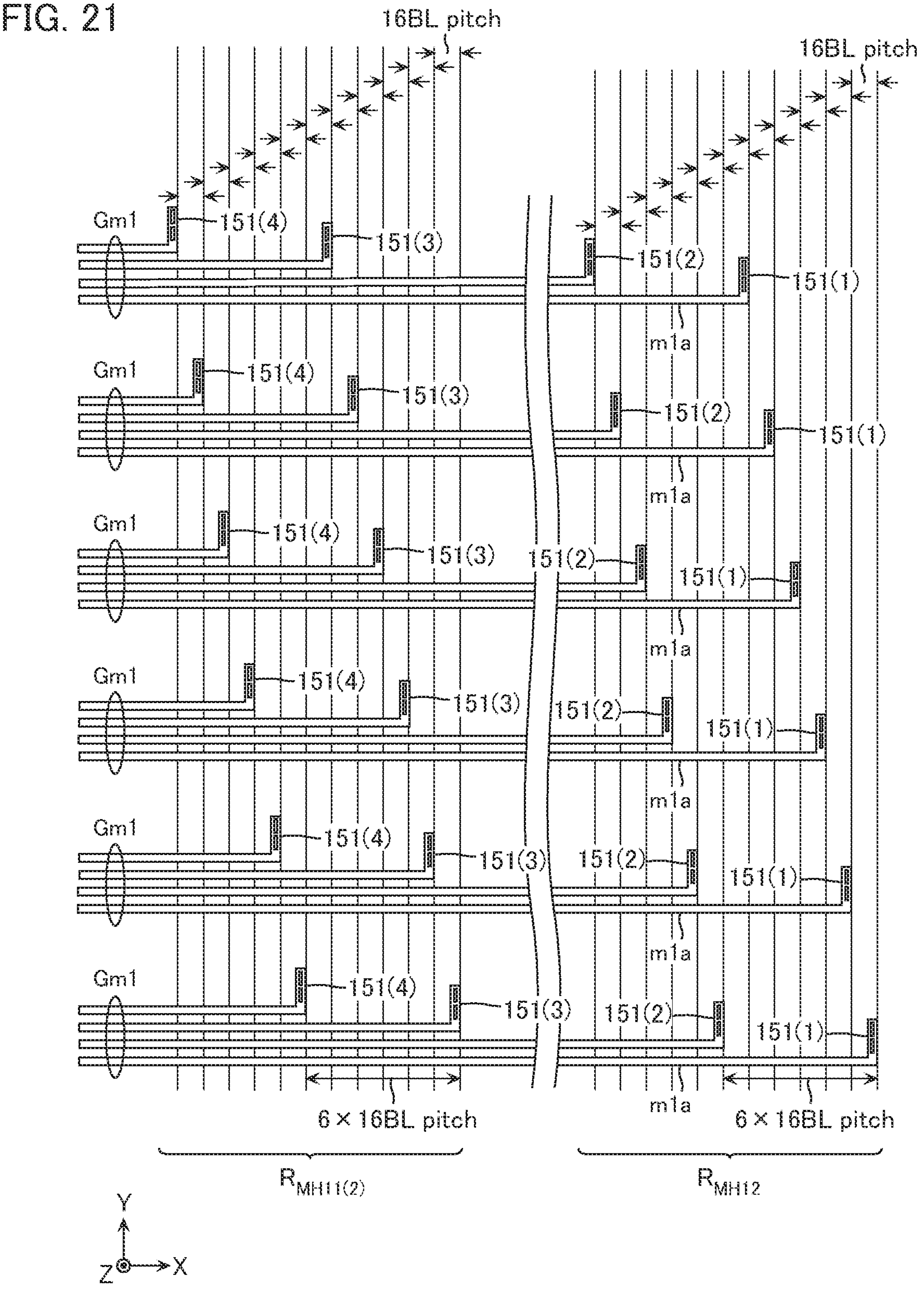
FIG. 21 is a schematic plan view for describing the wiring pattern of the wiring groups Gm1.
Figure 22:
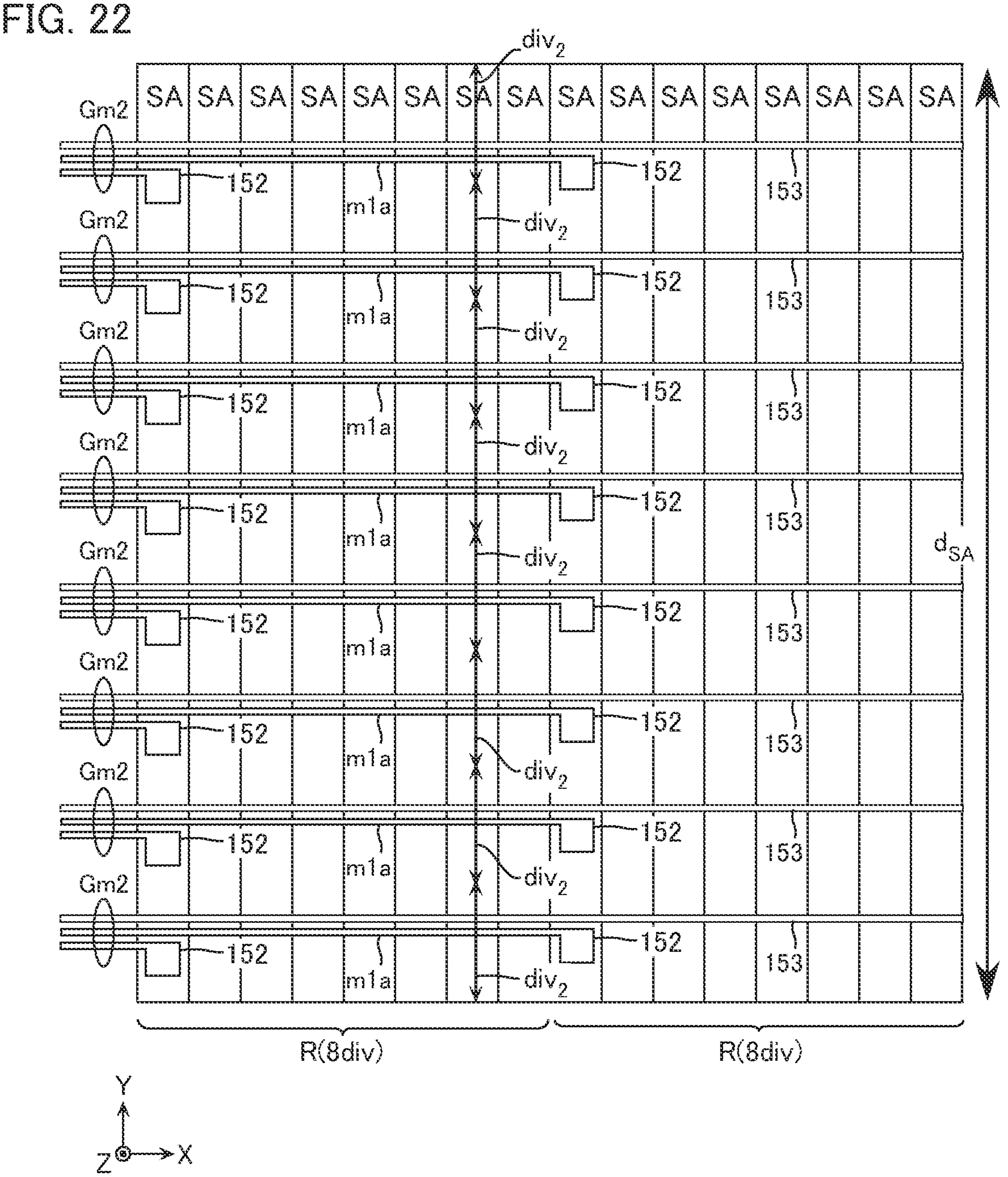
FIG. 22 is a schematic plan view for describing a wiring pattern of the wiring groups Gm2.
Figure 23:
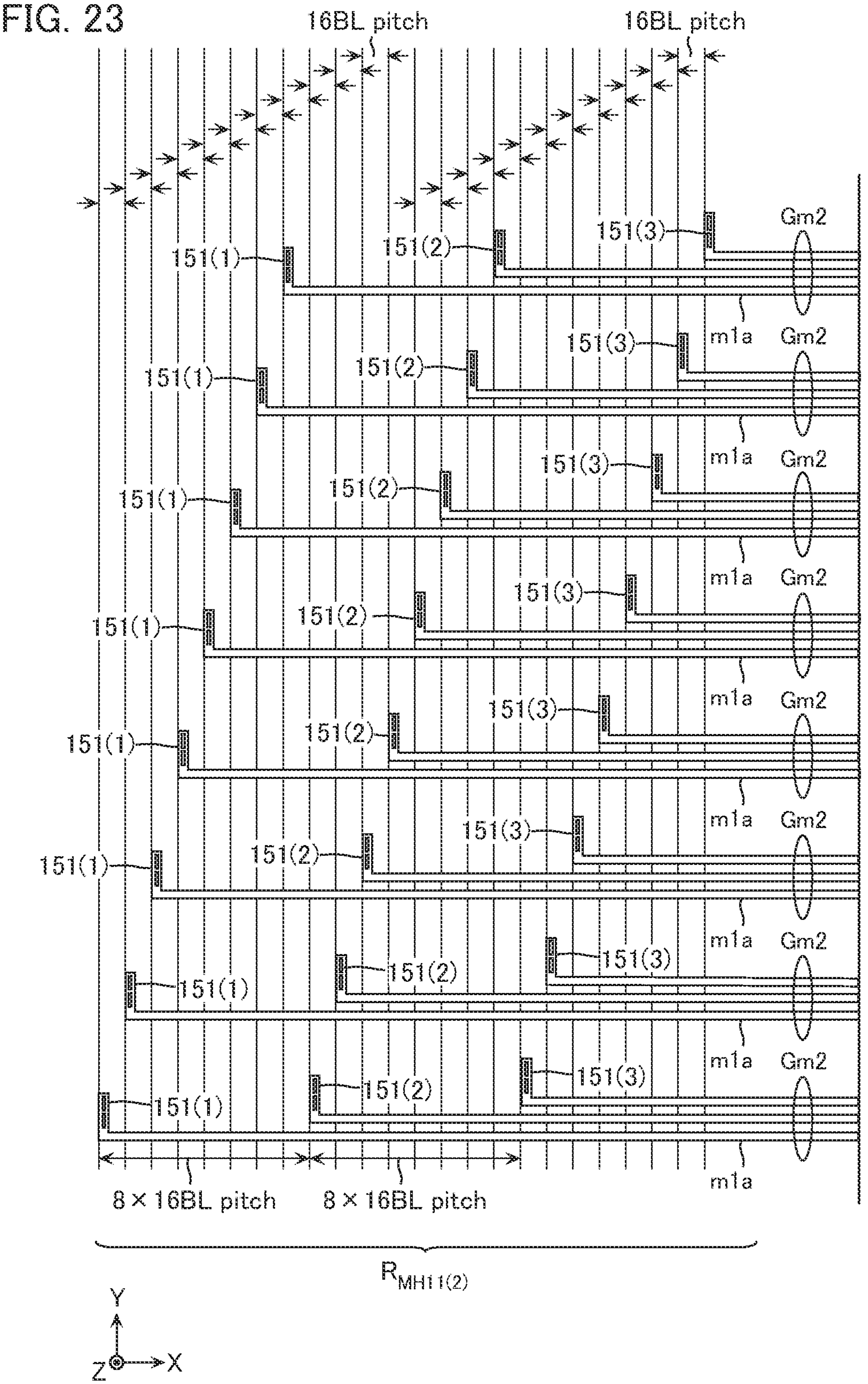
FIG. 23 is a schematic plan view for describing the wiring pattern of the wiring groups Gm2.
Figure 24:
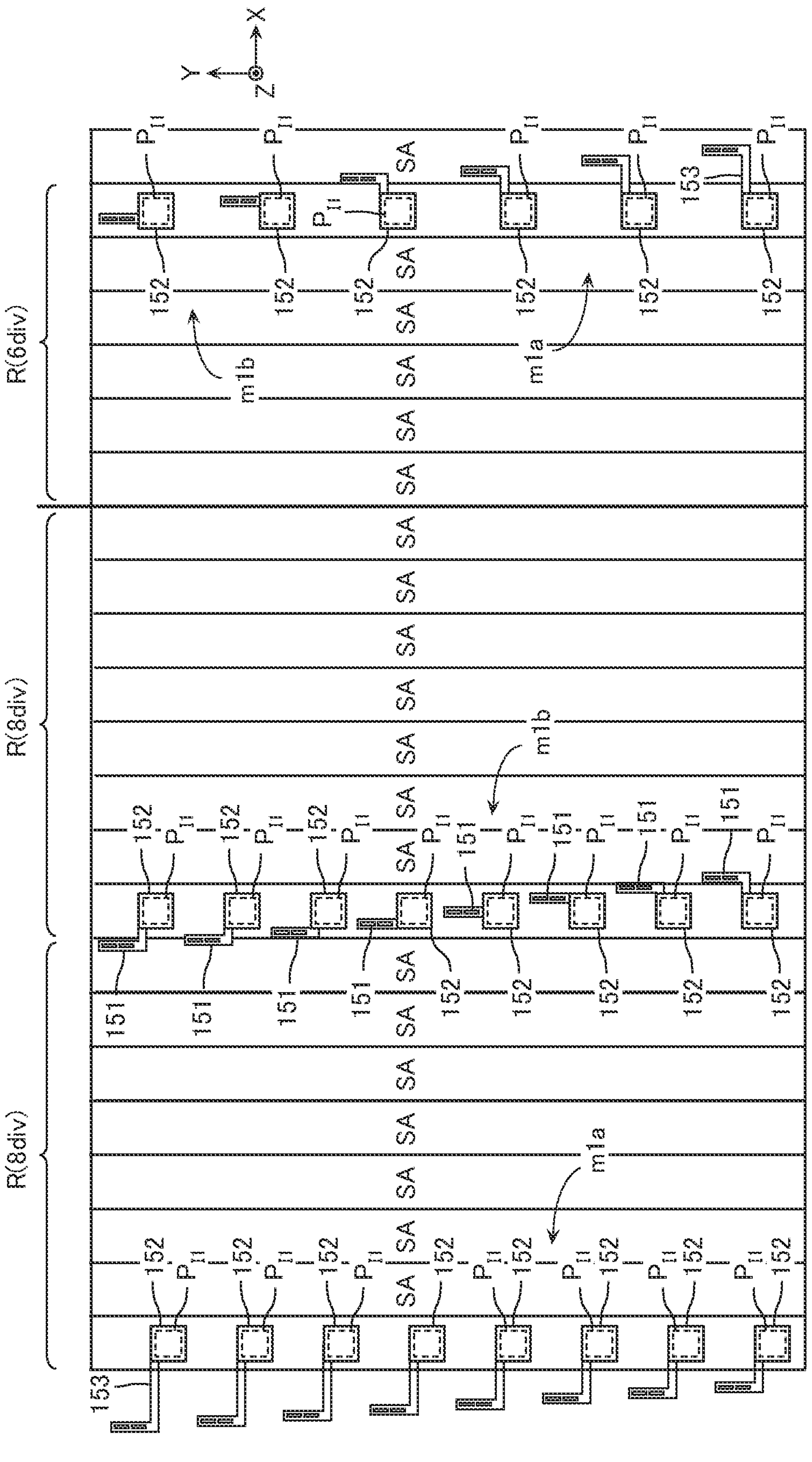
FIG. 24 is a schematic plan view illustrating a boundary between regions different in the number of divisions.

FIG. 20 and FIG. 21 are schematic plan views for describing a wiring pattern of the wiring groups Gm1. FIG. 20 illustrates the wiring pattern of a plurality of wiring groups Gm1 overlapped with the configuration in the chip $C_P$. FIG. 22 and FIG. 23 are schematic plan views for describing a wiring pattern of a plurality of wiring groups Gm2. FIG. 22 illustrates the wiring pattern of a plurality of wiring groups Gm2 overlapped with the configuration in the chip $C_P$. FIG. 24 is a schematic plan view illustrating a boundary between regions R (6div) and R (8div) different in the number of divisions.

As illustrated in FIG. 15, a plurality of wiring groups Gm1 are disposed in the region $R_{CC110}$ as a region on the X-direction positive side in the column control circuit region $R_{CC}$, and a plurality of the regions $R_{CC110}$ are arranged in the Y-direction. These plurality of wiring groups Gm1 are arranged in the Y-direction at a pitch smaller than the region $R_{CC110}$, and a plurality of (in the example of the drawing, six) wiring groups Gm1 are disposed corresponding to one region $R_{CC110}$. The wiring group Gm1 includes a plurality of wirings m1*a*.

As illustrated in FIG. 15, a plurality of wiring groups Gm2 are disposed in the region $R_{CC110}$ as a region on the X-direction negative side in the column control circuit region $R_{CC}$, and a plurality of the regions $R_{CC110}$ are arranged in the Y-direction. These plurality of wiring groups Gm2 are arranged in the Y-direction at a pitch smaller than the region $R_{CC110}$, and a plurality of (in the example of the drawing, eight) wiring groups Gm2 are disposed corresponding to one region $R_{CC110}$. The wiring group Gm2 includes a plurality of wirings m1*a*.

A part of the plurality of wirings included in a part of the wiring groups Gm1, Gm2 may be not the wiring m1*a* but a wiring m1*b* as illustrated in FIG. 19 described below.

As described above, FIG. 16 illustrates the region corresponding to the part B of FIG. 11. This region includes the memory hole region $R_{MH12}$, the hook-up region $R_{HU1}$, and the memory hole region $R_{MH11(2)}$ (including the block decoder region $R_{BD}$, the column control circuit region $R_{CC}$). This region has a length in the Y-direction corresponding to the length $d_{SA}$ in the Y-direction of the sense amplifier SA (FIG. 13). FIG. 16 illustrates this region (part B of FIG. 11) overlapped with a plurality of wiring groups Gm1, Gm2 in the wiring layer M1.

In the example of FIG. 16, the length $d_{SA}$ in the Y-direction of the sense amplifier SA matches the length in the Y-direction (BLK pitch of FIG. 10) of the 12 memory blocks BLK (1) to BLK (12). That is, the length $d_{SA}$ in the Y-direction of the sense amplifier SA is 12×BLK pitch. The length $d_{SA}$ in the Y-direction of the sense amplifier SA is not limited to the case of being the same as the length in the Y-direction (BLK pitch) of the 12 memory blocks BLK (1) to BLK (12), and may be approximately the same.

In the column control circuit region $R_{CC}$, a region in which the six sense amplifiers SA (six sense amplifier regions $R_{SA}$) are arranged in the X-direction is referred to as a region "R (6div)." A plurality of regions R (6div) arranged in the X-direction are disposed on the X-direction positive side of the column control circuit region $R_{CC}$. In the region R (6div), the length $d_{SA}$ in the Y-direction of the sense amplifier SA is virtually divided into six division units $div_1$. A length in the Y-direction of the division unit $div_1$ is referred to as a "Y1 pitch" in some cases. The "Y1 pitch"

corresponds to the length in the Y-direction of the two memory blocks BLK. That is, the "Y1 pitch" is 2×BLK pitch.

In the column control circuit region $R_{CC}$, a region in which the eight sense amplifiers SA (eight sense amplifier regions $R_{SA}$) are arranged in the X-direction is referred to as a region "R (8div)." A plurality of regions R (8div) arranged in the X-direction are disposed on the X-direction negative side of the column control circuit region $R_{CC}$. In the region R (8div), the length $d_{SA}$ in the Y-direction of the sense amplifier SA is virtually divided into eight division units $div_2$. A length in the Y-direction of the division unit $div_2$ is referred to as a "Y2 pitch" in some cases. The "Y2 pitch" does not correspond to the length in the Y-direction of the memory block BLK.

Thus, the column control circuit region $R_{CC}$ includes a plurality of regions R (6div) arranged in the X-direction and a plurality of regions R (8div) arranged in the X-direction.

As illustrated in FIG. 16, a plurality of via-contact electrodes CC are disposed in regions corresponding to the even-numbered memory blocks BLK (2), (4), (6), (8), (10), and (12) in the hook-up region $R_{HU1}$ (sub-regions $R_{HU}$ (N2), (N4), (N6), (N8), (N10), and (N12) of FIG. 10). Therefore, the wirings m1*a* in the wiring layer M1 connecting the bit lines BL in the memory hole region $R_{MH12}$ (wiring groups Gm1) and the sense amplifiers SA in the column control circuit region $R_{CC}$ cannot pass through the regions corresponding to the even-numbered memory blocks BLK (2), (4), (6), (8), (10), and (12) in the hook-up region $R_{HU1}$, and are required to pass through the regions corresponding to the odd-numbered memory blocks BLK (1), (3), (5), (7), (9), and (11) in the hook-up region $R_{HU1}$ (sub-regions $R_{HU}$ (N1), (N3), (N5), (N7), (N9), and (N11) of FIG. 10).

The wiring group Gm1 in the wiring layer M1 is a group of a plurality of wirings m1*a* connecting a plurality of bit lines BL in the memory hole region $R_{MH12}$ and the region on the X-direction positive side of the memory hole region $R_{MH11(2)}$ to the sense amplifiers SA in a plurality of regions R (6div) in the column control circuit region $R_{CC}$ (see FIG. 20 and FIG. 21 described below). The six wiring groups Gm1 are disposed corresponding to the six division units $div_1$. Accordingly, a part of the plurality of wirings m1*a* included in the wiring group Gm1 (a plurality of wirings m1*a* connecting a plurality of bit lines BL in the memory hole region $R_{MH12}$ to the sense amplifiers SA in a plurality of regions R (6div)) can pass through the regions corresponding to the odd-numbered memory block BLKs (1), (3), (5), (7), (9), and (11) in the hook-up region $R_{HU1}$.

FIG. 16 schematically illustrates the wiring groups Gm1, and the detailed configuration of the wiring group Gm1 is illustrated in FIG. 20 and FIG. 21.

The wiring group Gm2 in the wiring layer M1 is a group of a plurality of wirings m1*a* connecting a plurality of bit lines BL in the region on the X-direction negative side of the memory hole region $R_{MH11(2)}$ to the sense amplifiers SA in a plurality of regions R (8div) in the column control circuit region $R_{CC}$ (see FIG. 22 and FIG. 23 described below). The eight wiring groups Gm2 are disposed corresponding to the eight division units $div_2$.

FIG. 16 schematically illustrates the wiring groups Gm2, and the detailed configuration of the wiring group Gm2 is illustrated in FIG. 22 and FIG. 23. In the region on the X-direction negative side of the memory hole region $R_{MH11\ (2)}$, since there is no obstruction, such as a via-contact electrode CC, to the wiring m1*a*, a plurality of wirings m1*a* can be disposed without a restriction.

As illustrated in FIG. 17, in the memory hole region $R_{MH11\ (2)}$ and the memory hole region $R_{MH12}$, a plurality of wirings m1*a* of the wiring layer M1 are disposed. The wirings m1*a* are a part of the plurality of wirings m1 described with reference to FIG. 6, FIG. 7, and the like.

As illustrated in FIG. 18, the wiring m1*a* includes a part 151 disposed at a position overlapping with the bit line BL viewed in the Z-direction, a part 152 disposed at a position overlapping with the bonding electrode $P_{I1}$ viewed in the Z-direction, and a part 153 connected to these parts 151, 152.

The part 151 extends in the Y-direction. As illustrated in FIG. 6, an upper surface of the part 151 is connected to two via-contact electrodes V1 arranged in the Y-direction. These two via-contact electrodes V1 are connected to a lower surface of the bit line BL. As illustrated in FIG. 18, lengths in the Y-direction of these two via-contact electrodes V1 are larger than lengths in the X-direction of these two via-contact electrodes V1. A length in the Y-direction of the part 151 is larger than a total Y-length of these two via-contact electrodes V1. A length in the X-direction of the part 151 is larger than lengths in the X-direction of these two via-contact electrodes V1. The part 151 covers the entire lower surfaces of these two via-contact electrodes V1.

In the illustrated example, the two via-contact electrodes V1 are disposed corresponding to the one part 151, but this configuration is merely an example. For example, one via-contact electrode V1 may be disposed corresponding to one part 151, and three or more via-contact electrodes V1 may be disposed corresponding to one part 151.

Here, the bit lines BL are arranged in the X-direction over the whole memory hole regions $R_{MH11}$, $R_{MH12}$ (FIG. 14). The parts 151 are also disposed over the whole memory hole regions $R_{MH11}$, $R_{MH12}$ corresponding to these plurality of bit lines BL. As illustrated in FIG. 18, a pitch between the bit lines BL arranged in the X-direction is referred to as a "BL pitch" in some cases.

As illustrated in FIG. 18, the part 152 is formed in an approximately rectangular shape. As illustrated in FIG. 6, a lower surface of the part 152 is connected to the bonding electrode $P_{I1}$. As illustrated in FIG. 18, a length in the Y-direction of the part 152 is larger than a length in the Y-direction of the bonding electrode $P_{I1}$. A length in the X-direction of the part 152 is larger than a length in the X-direction of the bonding electrode $P_{I1}$. The part 152 covers the whole upper surface of the bonding electrode $P_{I1}$.

The bonding electrodes $P_{I1}$ are arranged in the X-direction and the Y-direction over the whole column control circuit region $R_{CC}$ described with reference to FIG. 11. The parts 152 are also disposed over the whole column control circuit region $R_{CC}$ corresponding to these plurality of bonding electrodes $P_{I1}$. The positions of the parts 151 and the parts 152 arranged in the X-direction and the Y-direction are described later (FIG. 20 to FIG. 23).

As illustrated in FIG. 18, the part 153 extends in the X-direction. One end portion in the X-direction of the part 153 is connected to one end portion in the Y-direction of the part 151 (in the example of the drawing, end portion on the Y-direction negative side). The other end portion in the X-direction of the part 153 is connected to one end portion in the Y-direction of the part 152 (in the example of the drawing, end portion on the Y-direction positive side). The center position in the Y-direction of the part 153 is between the center position in the Y-direction of the part 151 and the center position in the Y-direction of the part 152.

A part of the plurality of wirings included in the wiring groups Gm1, Gm2 may be not the wiring m1*a* but a wiring m1*b* as illustrated in FIG. 19. The wiring m1*b* is basically configured similarly to the wiring m1*a*. However, the wiring m1*b* does not include the part 153. In the wiring m1*b*, one end portion in the Y-direction of the part 151 is connected to the part 152. The wiring m1*b* is referred to as a second wiring in some cases.

For example, in the region near the center in the X-direction of the column control circuit region $R_{CC}$, the bit line BL overlaps with the bonding electrode $P_{I1}$ electrically connected to this bit line BL viewed in the Z-direction in some cases. To such a bit line BL, the wiring m1*b*, not the wiring m1*a*, is connected.

Next, with reference to FIG. 20 to FIG. 23, the positions of the part 151 and the part 152 of the wiring m1*a*, and a pitch in the X-direction of the part 151 will be described.

FIG. 20 illustrates the wiring pattern of the plurality of wiring groups Gm1 in the region R (6div). In the example of FIG. 20, the six wiring groups Gm1 in the wiring layer M1 extend in the X-direction negative side (the part 152 is disposed on the negative side with respect to the part 151). The six wiring groups Gm1 are arranged in the Y-direction in a range of the length $d_{SA}$ in the Y-direction of the sense amplifier SA in the region R (6div). In the example of FIG. 20, each of the six wiring groups Gm1 includes the four wirings m1*a*. The six wiring groups Gm1 are arranged in the Y-direction at a predetermined pitch. The four wirings m1*a* are arranged in the Y-direction at a predetermined pitch.

Among the four wirings m1*a* included in the wiring group Gm1, the part 152 of the first wiring m1*a* counting from the Y-direction negative side is formed in a region overlapping with the first sense amplifier SA counting from the X-direction positive side in the first region R (6div) counting from the X-direction positive side viewed in the Z-direction in the wiring layer M1. Similarly, among the four wirings m1*a*, the parts 152 of the second to the fourth wirings m1*a* counting from the Y-direction negative side are formed in regions overlapping with the first sense amplifiers SA counting from the X-direction positive side in the second to the fourth regions R (6div) counting from the X-direction positive side viewed in the Z-direction in the wiring layer M1.

Accordingly, the four parts 152 included in the wiring group Gm1 are disposed corresponding to the respective four regions R (6div). That is, the part 152 is disposed every six sense amplifiers SA (every six sense amplifier regions $R_{SA}$) arranged in the X-direction. Since the six wiring groups Gm1 are disposed in the region overlapping with the region R (6div) viewed in the Z-direction, the six parts 152 are arranged in the Y-direction at a predetermined pitch above one sense amplifier SA (one sense amplifier region $R_{SA}$). Thus, in the region overlapping with one region R (6div) viewed in the Z-direction, the six parts 152 are disposed so as to be arranged in the Y-direction at a predetermined pitch.

In the example described with reference to FIG. 12 and FIG. 13, the 16 sense amplifiers SA arranged in the Y-direction are disposed in the column control circuit region $R_{CC}$. In the example described with reference to FIG. 15, the six wiring groups Gm1 are disposed in the region overlapping with one sense amplifier SA (region $R_{CC110}$) viewed in the Z-direction. Accordingly, the 96 (16×6) parts 152 are formed in the region overlapping with the 16 sense amplifiers SA arranged in the Y-direction viewed in the Z-direction in the wiring layer M1. In the example described with reference to FIG. 16 and FIG. 17, the wiring group Gm1 includes the four wirings m1*a*. Accordingly, the 384 (96×4) wirings m1*a* are formed in the region overlapping with the 16 sense amplifiers SA arranged in the Y-direction viewed in the Z-direction in the wiring layer M1.

While the wiring group Gm1 includes the four wirings m1*a* in the example of FIG. 20, the wiring group Gm1 may include the "h1" (h1 is an integer of 2 or more) wirings m1*a*. In this case, the number of the regions R (6div) arranged in the X-direction is "h1."

As illustrated in FIG. 21, the parts 151 of the four wirings m1*a* included in the wiring group Gm1 are formed in the memory hole region $R_{MH12}$, and formed in a region on the X-direction positive side of the memory hole region $R_{MH11}$ (2).

In the example of FIG. 21, the parts 151 of the first and the second wirings m1*a* counting from the Y-direction negative side among the four wirings m1*a* included in the wiring group Gm1 are formed in the memory hole region $R_{MH12}$. In each of the wiring groups Gm1, the part 151 of the first wiring m1*a* counting from the Y-direction negative side is referred to as a part 151 (1), and the part 151 of the second wiring m1*a* counting from the Y-direction negative side is referred to as a part 151 (2).

The parts 151 (1), 151 (2) of the wirings m1*a* are connected to a plurality of bit lines BL formed in the memory hole region $R_{MH12}$. Pitches in the X-direction of the parts 151 (1) of the wirings m1*a* in the six wiring groups Gm1 are each 16 BL pitch. Pitches in the X-direction of the parts 151 (2) of the wirings m1*a* in the six wiring groups Gm1 are also each 16 BL pitch. A pitch between the part 151 (1) of the wiring m1*a* in the sixth wiring group Gm1 counting from the Y-direction negative side and the part 151 (2) of the wiring m1*a* in the first wiring group Gm1 counting from the Y-direction negative side is also 16 BL pitch. Accordingly, a pitch between the part 151 (1) of the wiring m1*a* in the first wiring group Gm1 counting from the Y-direction negative side and the part 151 (2) of the wiring m1*a* in the first wiring group Gm1 counting from the Y-direction negative side is 6×16 BL pitch (96 BL pitch).

In the example of FIG. 21, the parts 151 of the third and the fourth wirings m1*a* counting from the Y-direction negative side among the four wirings m1*a* included in the wiring group Gm1 are formed in a region in the X-direction positive side of the memory hole region $R_{MH11(2)}$. In each of the wiring groups Gm1, the part 151 of the third wiring m1*a* counting from the Y-direction negative side is referred to as a part 151 (3), and the part 151 of the fourth wiring m1*a* counting from the Y-direction negative side is referred to as a part 151 (4).

The parts 151 (3), 151 (4) of the wirings m1*a* are connected to a plurality of bit lines BL formed in a region on the X-direction positive side of the memory hole region $R_{MH11(2)}$. Pitches in the X-direction of the parts 151 (3) of the wirings m1*a* in the six wiring groups Gm1 are each 16 BL pitch. Pitches in the X-direction of the parts 151 (4) of the wirings m1*a* in the six wiring groups Gm1 are also each 16 BL pitch. A pitch between the part 151 (3) of the wiring m1*a* in the sixth wiring group Gm1 counting from the Y-direction negative side and the part 151 (4) of the wiring m1*a* in the first wiring group Gm1 counting from the Y-direction negative side is also 16 BL pitch. Accordingly, a pitch between the part 151 (3) of the wiring m1*a* in the first wiring group Gm1 counting from the Y-direction negative side and the part 151 (4) of the wiring m1*a* in the first wiring group Gm1 counting from the Y-direction negative side is 6×16 BL pitch (96 BL pitch).

The number of the regions R (6div) in the column control circuit region $R_{CC}$ is determined corresponding to the number of the bit lines BL formed in the memory hole region $R_{MH12}$ and the bit lines BL formed in the region on the X-direction positive side of the memory hole region $R_{MH11}$ (2). In one region R (6div), the 96 sense amplifiers SA (sense amplifier circuits SADL) are disposed. One bit line BL is connected to one sense amplifier SA. Therefore, the 96 sense amplifiers SA are connected to the 96 bit lines BL.

FIG. 22 illustrates the wiring pattern of the plurality of wiring groups Gm2 in the region R (8div). In the example of FIG. 22, the eight wiring groups Gm2 in the wiring layer M1 extend in the X-direction positive side (the part 152 is disposed on the positive side with respect to the part 151). The eight wiring groups Gm2 are arranged in the Y-direction in a range of the length $d_{SA}$ in the Y-direction of the sense amplifier SA in the region R (8div). In the example of FIG. 22, each of the eight wiring groups Gm2 includes the three wirings m1*a*. The eight wiring groups Gm2 are arranged in the Y-direction at a predetermined pitch. The three wirings m1*a* are arranged in the Y-direction at a predetermined pitch.

Among the three wirings m1*a* included in the wiring group Gm2, the part 152 of the first wiring m1*a* counting from the Y-direction negative side is formed in a region overlapping with the first sense amplifier SA counting from the X-direction negative side in the first region R (8div) counting from the X-direction negative side viewed in the Z-direction in the wiring layer M1. Similarly, among the three wirings m1*a*, the parts 152 of the second to the third wirings m1*a* counting from the Y-direction negative side are formed in regions overlapping with the first sense amplifiers SA counting from the X-direction negative side in the second to the third regions R (8div) counting from the X-direction negative side viewed in the Z-direction in the wiring layer M1.

Accordingly, the three parts 152 included in the wiring group Gm2 are disposed corresponding to the respective three regions R (8div). That is, the part 152 is disposed every eight sense amplifiers SA (every eight sense amplifier regions $R_{SA}$) arranged in the X-direction. Since the eight wiring groups Gm2 are disposed on the region overlapping with the region R (8div) viewed in the Z-direction, the eight parts 152 are arranged in the Y-direction at a predetermined pitch above one sense amplifier SA (one sense amplifier region $R_{SA}$). Thus, in the region overlapping with one region R (8div) viewed in the Z-direction, the eight parts 152 are disposed so as to be arranged in the Y-direction at a predetermined pitch.

In the example described with reference to FIG. 12 and FIG. 13, the 16 sense amplifiers SA arranged in the Y-direction are disposed in the column control circuit region $R_{CC}$. In the example described with reference to FIG. 15, the eight wiring groups Gm2 are disposed in the region overlapping with one sense amplifier SA (region $R_{CC110}$) viewed in the Z-direction. Accordingly, the 128 (16×8) parts 152 are formed in the region overlapping with the 16 sense amplifiers SA arranged in the Y-direction viewed in the Z-direction in the wiring layer M1. In the example described with reference to FIG. 16 and FIG. 17, the wiring group Gm2 includes the three wirings m1*a*. Accordingly, the 384 (128×3) wirings m1*a* are formed in the region overlapping with the 16 sense amplifiers SA arranged in the Y-direction viewed in the Z-direction in the wiring layer M1.

While the wiring group Gm2 includes the three wirings m1*a* in the example of FIG. 23, the wiring group Gm2 may include the “h2” (h2 is an integer of 2 or more) wirings m1*a*. In this case, the number of the regions R (8div) arranged in the X-direction is “h2.”

The number “h1” of the wirings m1*a* included in the wiring group Gm1 and the number “h2” of the wirings m1*a* included in the wiring group Gm2 may be different numbers.

As illustrated in FIG. 23, the parts 151 of the three wirings m1*a* included in the wiring group Gm2 are formed in a region on the X-direction negative side of the memory hole region $R_{MH11(2)}$.

In each of the wiring groups Gm2, the part 151 of the first wiring m1*a* counting from the Y-direction negative side is referred to as a part 151 (1), the part 151 of the second wiring m1*a* counting from the Y-direction negative side is referred to as a part 151 (2), and the part 151 of the third wiring m1*a* counting from the Y-direction negative side is referred to as a part 151 (3).

The parts 151 (1), 151 (2), and 151(3) of the wirings m1*a* are connected to a plurality of bit lines BL formed in a region in the X-direction negative side of the memory hole region $R_{M11(2)}$. Pitches in the X-direction of the parts 151 (1) of the wirings m1*a* in the eight wiring groups Gm2 are each 16 BL pitch. Pitches in the X-direction of the parts 151 (2) of the wirings m1*a* in the eight wiring groups Gm2 are also each 16 BL pitch. Pitches in the X-direction of the parts 151 (3) of the wirings m1*a* in the eight wiring groups Gm2 are also each 16 BL pitch.

A pitch between the part 151 (1) of the wiring m1*a* in the eighth wiring group Gm2 counting from the Y-direction negative side and the part 151 (2) of the wiring m1*a* in the first wiring group Gm2 counting from the Y-direction negative side is 16 BL pitch. Accordingly, a pitch between the part 151 (1) of the wiring m1*a* in the first wiring group Gm2 counting from the Y-direction negative side and the part 151 (2) of the wiring m1*a* in the first wiring group Gm2 counting from the Y-direction negative side is 8×16 BL pitch (128 BL pitch).

A pitch between the part 151 (2) of the wiring m1*a* in the eighth wiring group Gm2 counting from the Y-direction negative side and the part 151 (3) of the wiring m1*a* in the first wiring group Gm2 counting from the Y-direction negative side is 16 BL pitch. Accordingly, a pitch between the part 151 (2) of the wiring m1*a* in the first wiring group Gm2 counting from the Y-direction negative side and the part 151 (3) of the wiring m1*a* in the first wiring group Gm2 counting from the Y-direction negative side is 8×16 BL pitch (128 BL pitch).

The number of the regions R (8div) in the column control circuit region $R_{CC}$ is determined corresponding to the number of the bit lines BL formed in the region on the X-direction negative side of the memory hole region $R_{MH11(2)}$. In one region R (8div), the 128 sense amplifiers SA (sense amplifier circuits SADL) are disposed. One bit line BL is connected to one sense amplifier SA. Therefore, the 128 sense amplifiers SA are connected to the 128 bit lines BL.

As illustrated in FIG. 24, in the boundary between the region R (6div) and the region R (8div), since a distance in the X-direction from the bit line BL to the bonding electrode $P_{I1}$ is small, the wiring m1*a* or the wiring m1*b* of the part 153 with the small distance is formed. In the region R (6div), the six wirings m1*a* or wirings m1*b* are arranged in the Y-direction at a predetermined pitch in the wiring layer M1 above one sense amplifier SA. In the region R (8div), the eight wirings m1*a* or wirings m1*b* are arranged in the Y-direction at a predetermined pitch in the wiring layer M1 above one sense amplifier SA.

In the boundary between the region R (6div) and the region R (8div), the wiring groups Gm1, Gm2 illustrated in FIG. 20 to FIG. 23 are not present. Therefore, a pitch in the Y-direction of the wiring m1*a* or the wiring m1*b* illustrated in FIG. 24 can be made larger than a pitch in the Y-direction of the wiring m1*a* illustrated in FIG. 20 to FIG. 23. As illustrated in FIG. 24, in the proximity of the boundary between the region R (6div) and the region R (8div), the positional relation between the part 151 and the part 152 in the X-direction is switched. In the region R (6div), many of the wirings m1*a* or the wirings m1*b* have the part 152 positioned on the X-direction negative side with respect to the part 151, and in the region R (8div), many of the wirings m1*a* or the wirings m1*b* have the part 152 positioned on the X-direction positive side with respect to the part 151.

[Wiring d4 in Wiring Layer D4]

Next, with reference to FIG. 25 and FIG. 26, the position of the wiring d4 will be described.

Figure 25:
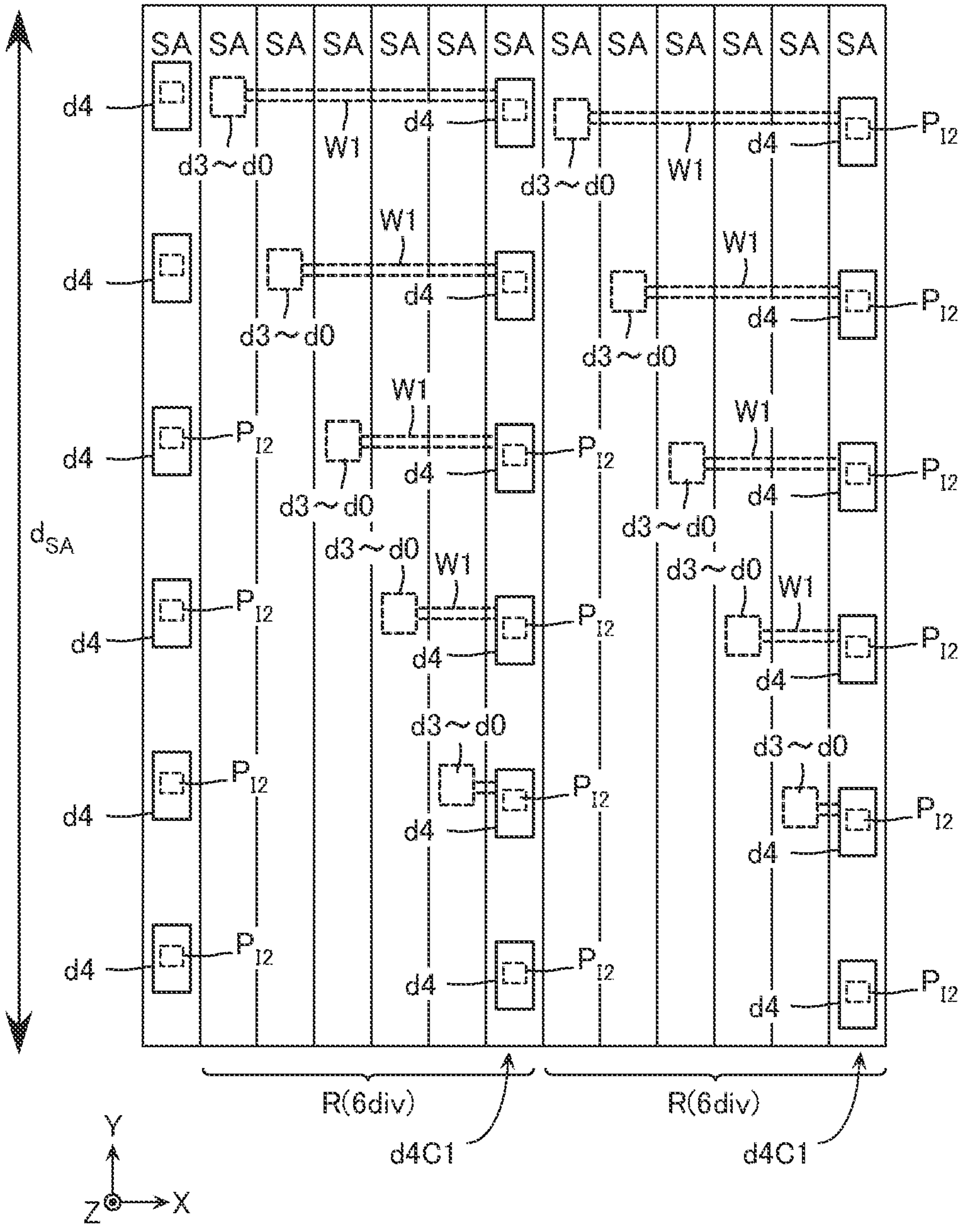
FIG. 25 is a schematic plan view illustrating an exemplary arrangement of wirings d4 in a wiring layer D4.

FIG. 25 is a schematic plan view illustrating an exemplary arrangement of the wirings d4 in the wiring layer D4 above the region R (6div). FIG. 26 is a schematic plan view illustrating an exemplary arrangement of the wirings d4 in the wiring layer D4 above the region R (8div). FIG. 25 and FIG. 26 illustrate the wirings d4 of the wiring layer D4, the bonding electrodes $P_{I2}$, the wirings W1, W2 of the wiring layers and the like other than the wiring layer D4, and the configurations in the chips $C_P$ in an overlapped manner. The bonding electrodes $P_{I2}$, the wirings W1, W2, and the wirings d3 to d0 are indicated by dotted lines.

The wiring d4 of the wiring layer D4 is disposed at a position overlapping with the part 152 of the wiring m1*a* (m1*b*) in the wiring layer M1, the bonding electrode $P_{I1}$, and the bonding electrode $P_{I2}$ viewed in the Z-direction.

As illustrated in FIG. 25, in a region overlapping with the region R (6div) viewed in the Z-direction, the six wirings d4 are arranged in the Y-direction at a predetermined pitch corresponding to the respective sense amplifiers SA. These six wirings d4 are formed above one sense amplifier SA every six sense amplifiers SA arranged in the X-direction in the wiring layer D4. A row of the six wirings d4 arranged in the Y-direction is referred to as a wiring row "d4C1" in some cases.

Similarly, as illustrated in FIG. 25, in a region overlapping with the region R (6div) viewed in the Z-direction, the six bonding electrodes $P_{I2}$ are arranged in the Y-direction at a predetermined pitch corresponding to the respective sense amplifiers SA. These six bonding electrodes $P_{I2}$ are formed above one sense amplifier SA every six sense amplifiers SA arranged in the X-direction in the chip bonding electrode layer DB.

Figure 26:
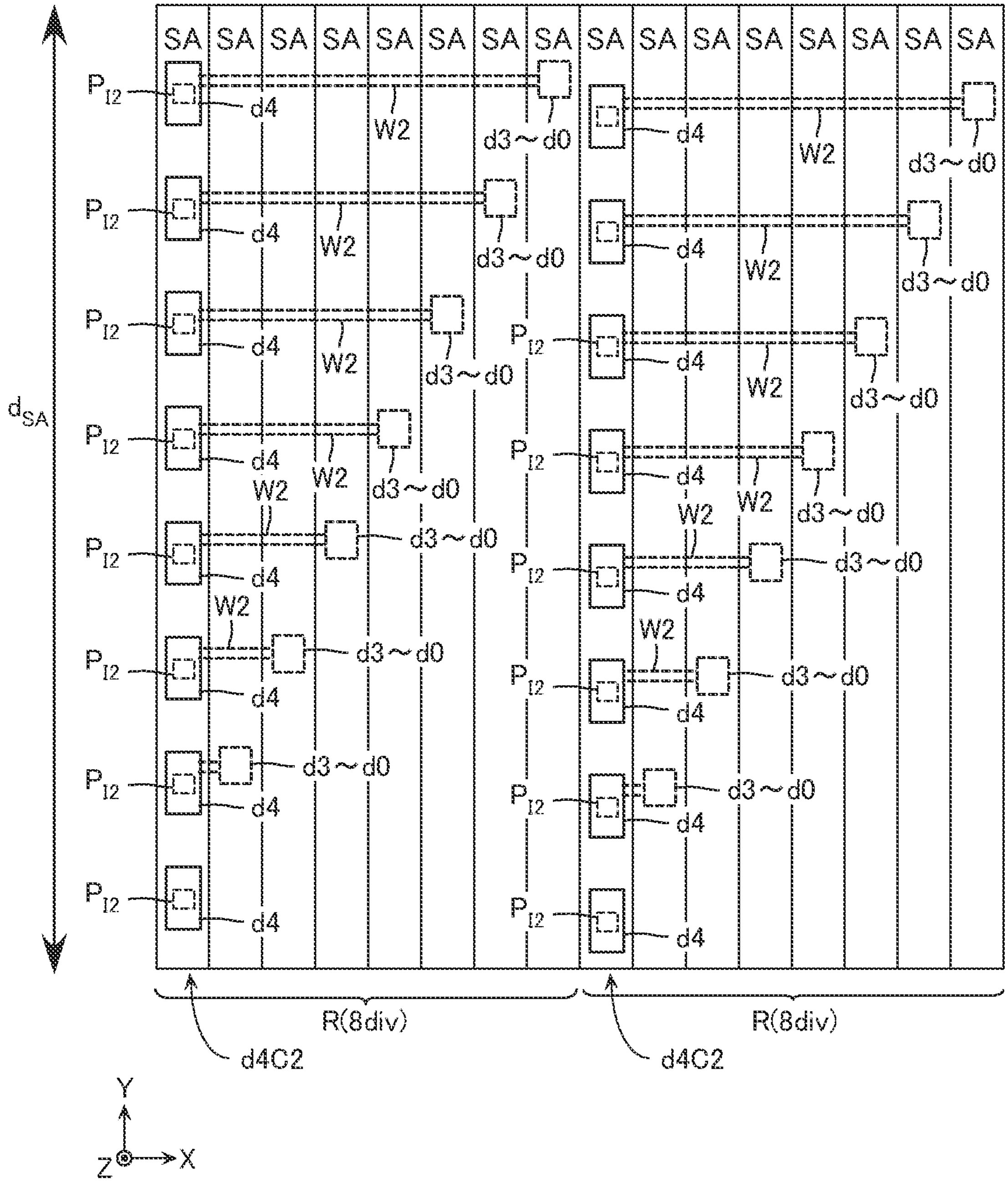
FIG. 26 is a schematic plan view illustrating the exemplary arrangement of the wirings d4 in the wiring layer D4.

As illustrated in FIG. 26, in the region overlapping with the region R (8div) viewed in the Z-direction, the eight wirings d4 are arranged in the Y-direction at a predetermined pitch corresponding to the respective sense amplifiers SA. These eight wirings d4 are formed above one sense amplifier SA every eight sense amplifiers SA arranged in the X-direction in the wiring layer D4. A row of the eight wirings d4 arranged in the Y-direction is referred to as a wiring row "d4C2" in some cases.

Similarly, as illustrated in FIG. 26, in a region overlapping with the region R (8div) viewed in the Z-direction, the eight bonding electrodes $P_{I2}$ are arranged in the Y-direction at a predetermined pitch corresponding to the respective sense amplifiers SA. These eight bonding electrodes $P_{I2}$ are formed above one sense amplifier SA every eight sense amplifiers SA arranged in the X-direction in the chip bonding electrode layer DB.

The wirings d4 to d0 are mutually connected via the via-contact electrodes. The wiring W1, W2 (FIG. 25, FIG. 26) is formed in any of the wiring layers D3 to D0. The wiring W1, W2 extends in the X-direction, is disposed at a position where one end in the X-direction overlaps with the wiring d4 viewed in the Z-direction, and is disposed at a position (position of the wirings d3 to d0 in FIG. 25, FIG. 26) where the other end in the X-direction overlaps with the sense amplifier SA viewed in the Z-direction. Each of the wirings W1, W2 is connected to the corresponding sense amplifier SA (sense amplifier circuit SADL) via one or a plurality of via-contact electrodes.

[Passing Wiring TW in Wiring Layer D4]

Figure 27:
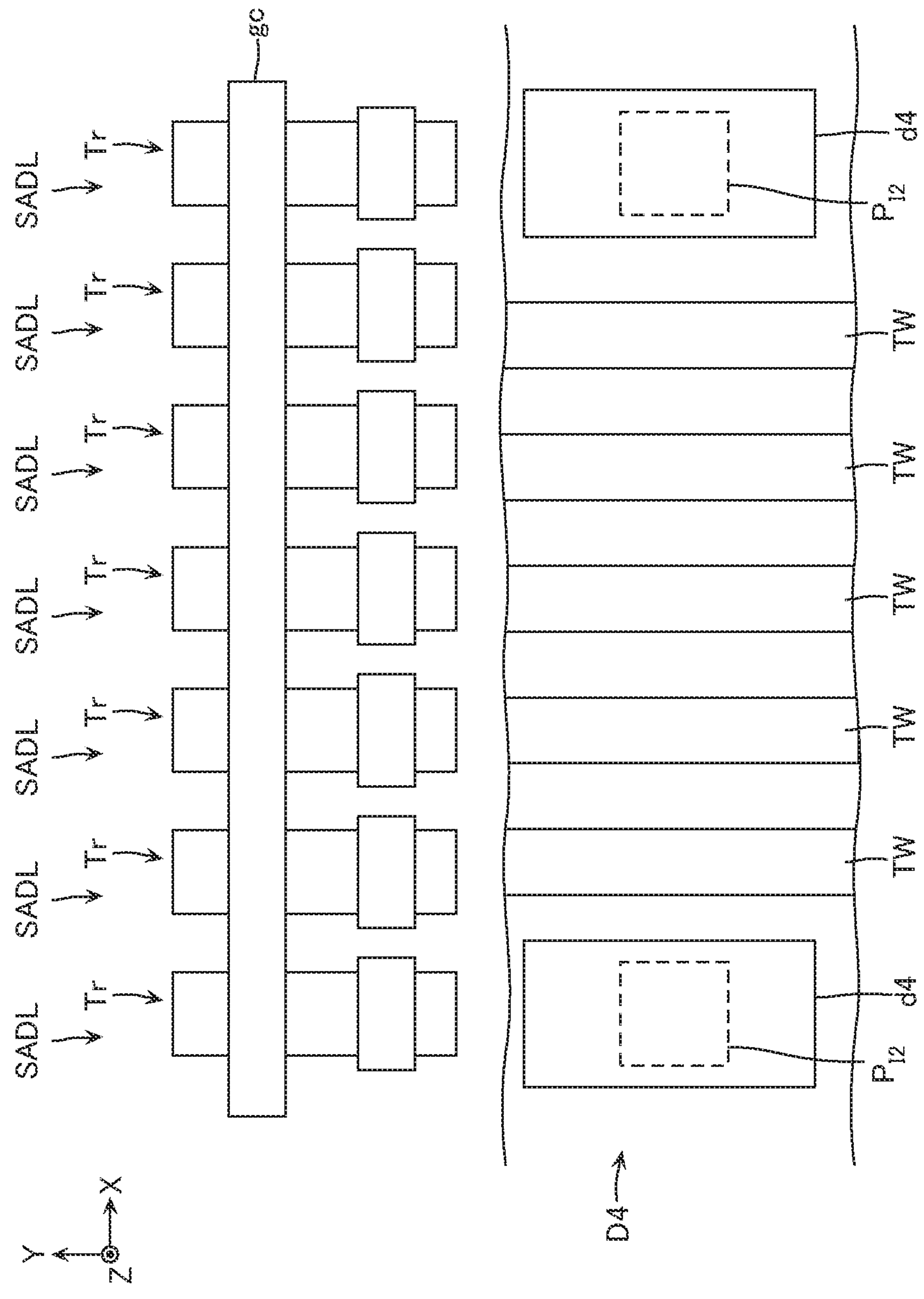
FIG. 27 is a schematic plan view illustrating a configuration of a passing wiring TW in a region R (6div)
Figure 28:
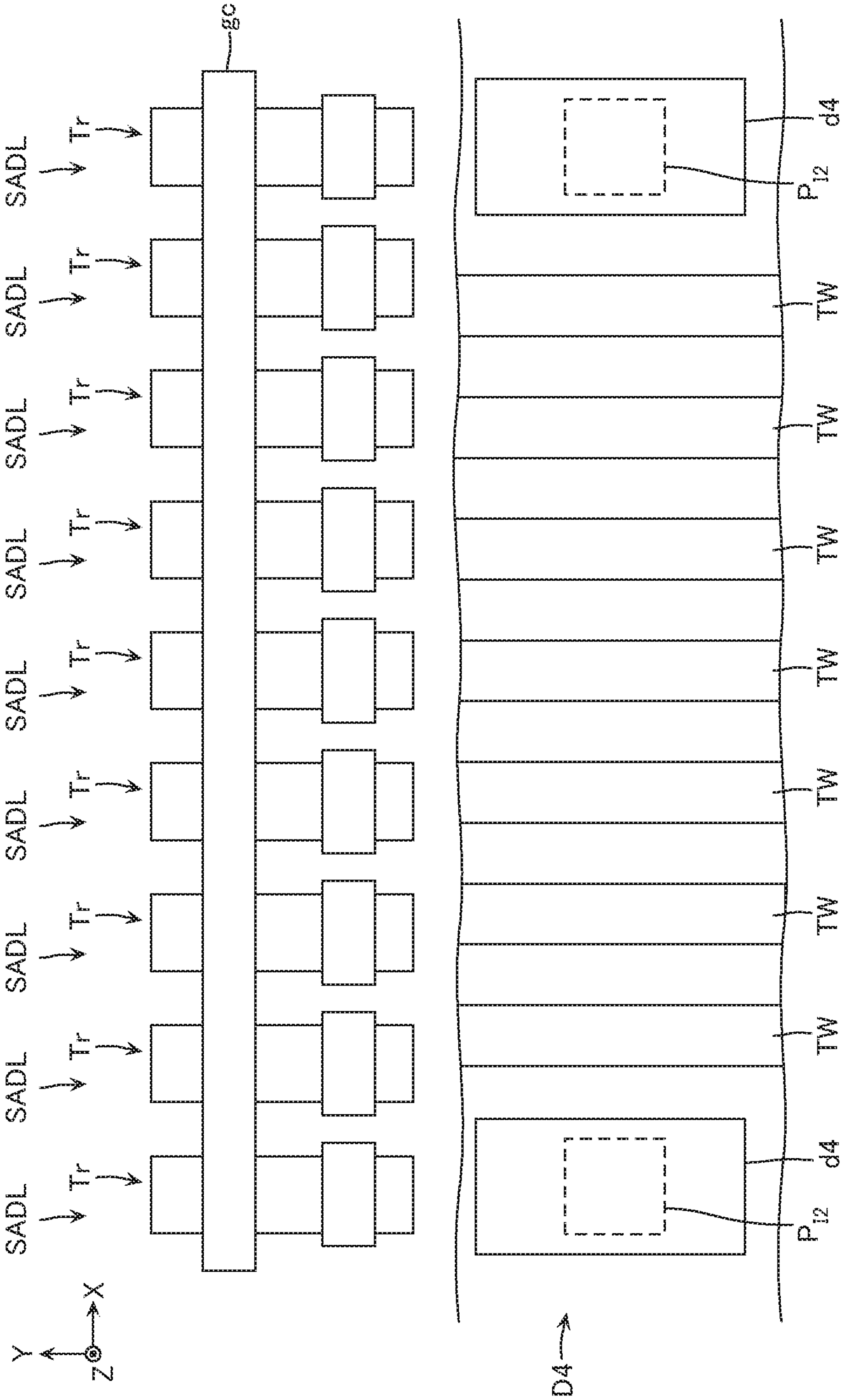
FIG. 28 is a schematic plan view illustrating a configuration of the passing wiring TW in a region R (8div)

FIG. 27 is a schematic plan view illustrating a configuration of the passing wiring TW in the region R (6div). FIG. 28 is a schematic plan view illustrating a configuration of the passing wiring TW in the region R (8div).

As illustrated in FIG. 27 and FIG. 28, in the wiring layer D4, a plurality of passing wirings TW extending in the Y-direction are disposed between the two wirings d4 adjacent in the X-direction. In the example of FIG. 27, the five passing wirings TW are disposed. In the example of FIG. 28, the seven passing wirings TW are disposed. The transistors Tr in FIG. 27 and FIG. 28 are a part of the plurality of transistors constituting the sense amplifier circuits SADL. Thus, since the distance between the two wirings d4 is larger in the region R (8div) than in the region R (6div), the larger number of the passing wirings TW can be disposed in the wiring layer D4.

Assume that, as the division unit for dividing one sense amplifier SA, the number of the division units $div_1$ is (n1), and the number of the division unit $div_2$ is (n2). In this case, in the column control circuit region $R_{CC}$, at least the (n1+n2) sense amplifiers SA are arranged in the X-direction. Note that n1 is an integer of 2 or more, and n2 is an integer of 2 or more and an integer different from n1. The (n1) wirings m1*a* extend in the X-direction negative side from the bit line BL side, are arranged in the Y-direction, and are connected to the (n1) sense amplifiers SA on the X-direction positive side. The (n2) wirings m1*a* extend in the X-direction positive side from the bit line BL side, are arranged in the Y-direction, and are connected to the (n2) sense amplifiers SA on the X-direction negative side.

A length in the Y-direction of a first region (R (n1div)) in which the (n1) sense amplifiers SA are disposed is virtually divided into (n1) first division units ($div_1$), and a length in the Y-direction of a second region (R (n2div)) in which the (n2) sense amplifiers SA are disposed is virtually divided into (n2) second division units ($div_2$). The wiring m1*a* is disposed for each of the (n1) first division units ($div_1$), and the wiring m1*a* is disposed for each of the (n2) second division units ($div_2$).

Figure 29:
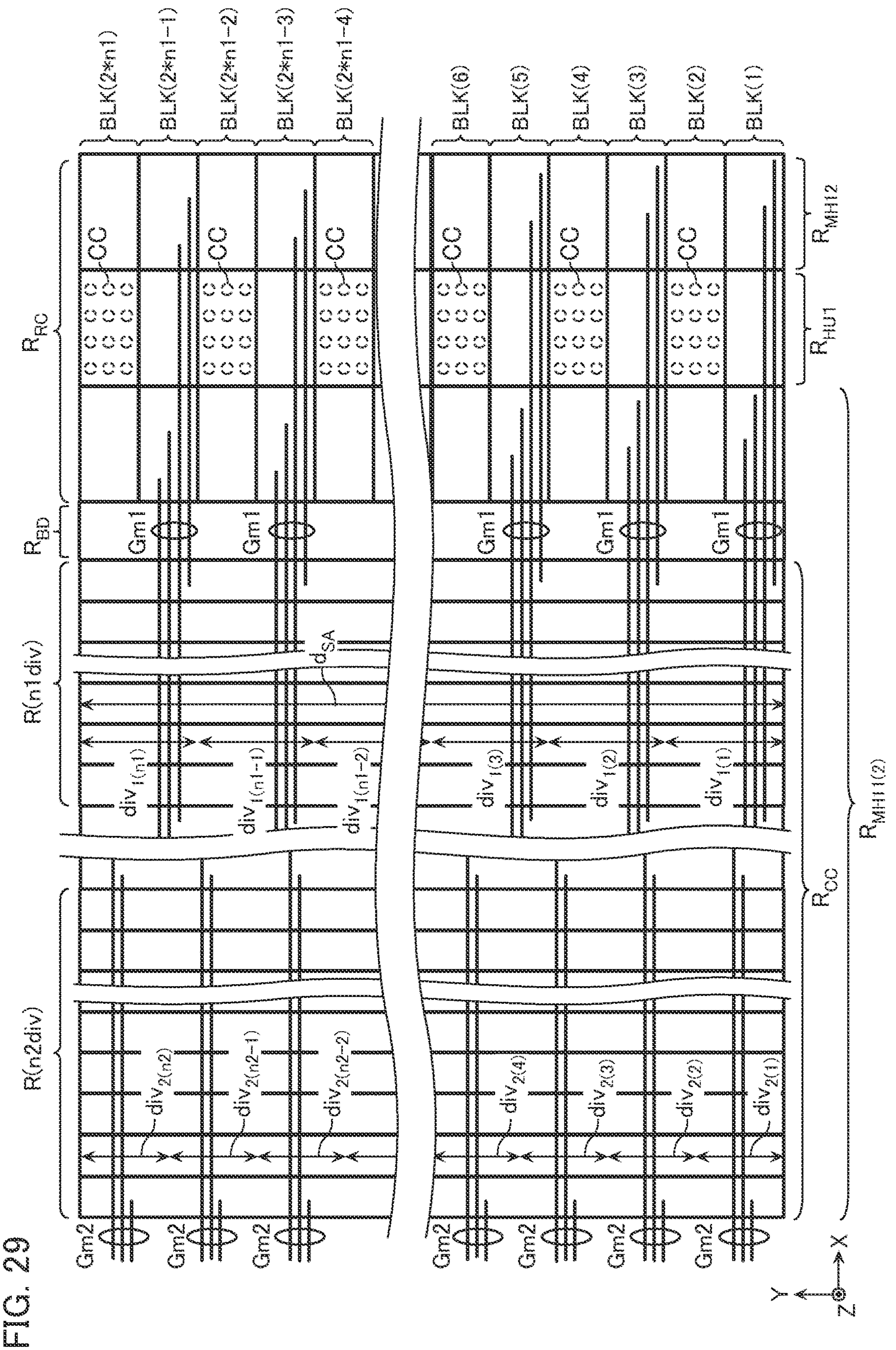
FIG. 29 is a schematic plan view illustrating a first region R (n1div) and a second region R (n2div)

For example, as illustrated in FIG. 29, when a plurality of the first regions (region R (n1div) virtually divided into the (n1) first division units ($div_1$)) are arranged in the X-direction, the wiring group Gm1 including the plurality of wirings m1*a* is disposed for each of the (n1) first division units ($div_{1(1)}$ to $div_{1(n1)}$). For example, as illustrated in FIG. 29, when a plurality of the second regions (region R (n2div) virtually divided into the (n2) second division units ($div_2$)) are arranged in the X-direction, the wiring group Gm2 including the plurality of wirings m1*a* is disposed for each of the (n2) second division units ($div_{2(1)}$ to $div_2$(n2)). In the example of FIG. 29, the length $d_{SA}$ in the Y-direction of the sense amplifier SA corresponds to a length in the Y-direction of the (2×n1) memory blocks (BLK (1) to BLK (2*n1)).

A length (BLK pitch×2×n1) in the Y-direction of the (2×n1) sub-regions (for example, $R_{HU}$ (N1) to $R_{HU}$ (N12)) illustrated in FIG. 10 may be the same or approximately the same as, or may be different from the length in the Y-direction of the sense amplifier SA ($d_{SA}$ of FIG. 16).

In the above description, the wiring pattern of the wirings m1*a* in the region R1 (R1') of the memory plane MP is described. However, since the region R1 (R1') and the region R2 (R2') are linearly symmetrical about the boundary therebetween, the wiring pattern of the wirings m1*a* in the region R2 (R2') is similar to the configuration of the wiring pattern of the wirings m1*a* in the region R1 (R1').

Comparative Example

Figure 30:
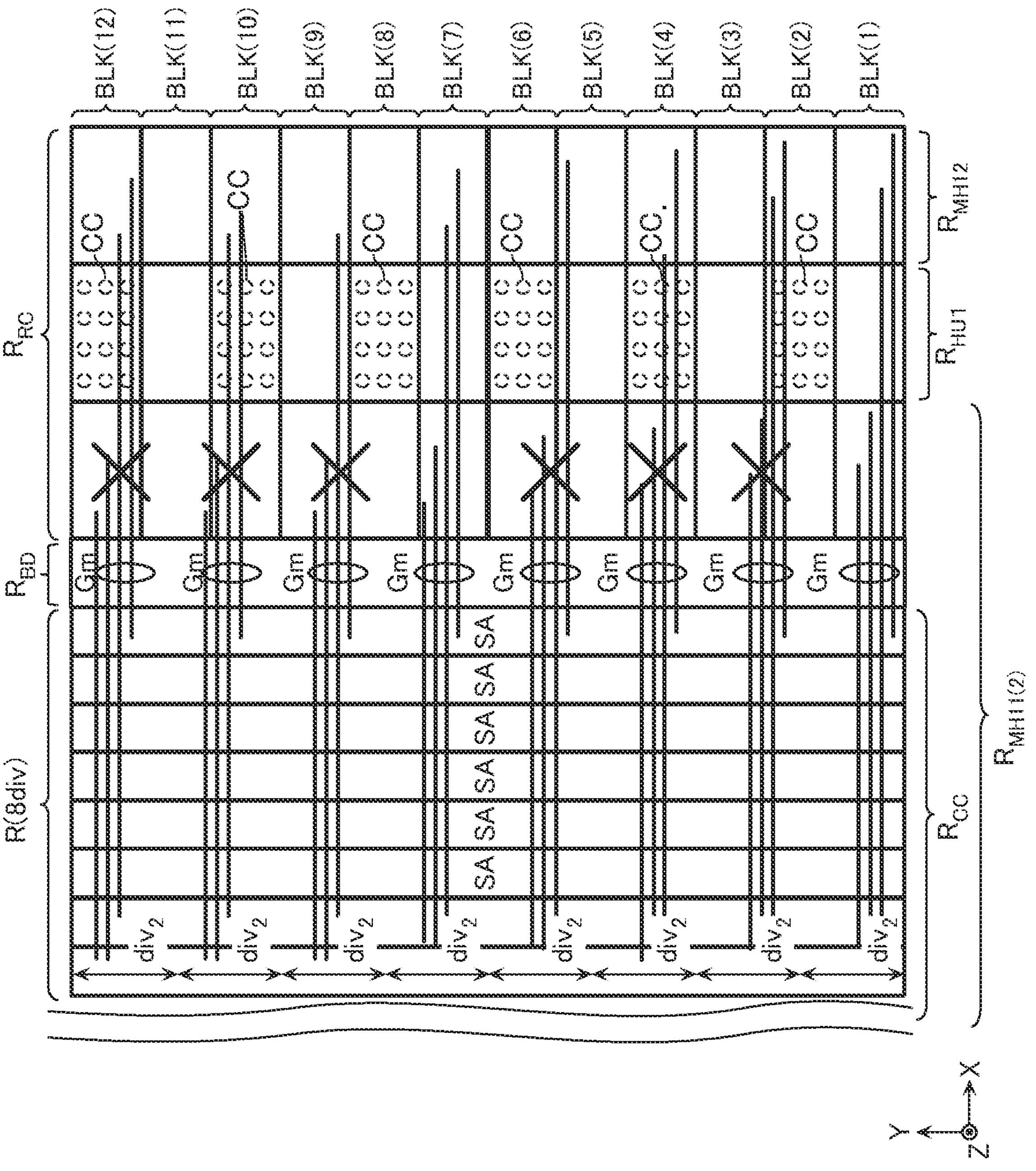
FIG. 30 is a schematic plan view for describing a wiring pattern of wiring groups Gm in a wiring layer M1 according to a comparative example.

FIG. 30 is a schematic plan view for describing a wiring pattern of wiring groups Gm in a wiring layer M1 according to a comparative example. FIG. 30 is a drawing corresponding to FIG. 16.

In a column control circuit region $R_{CC}$ illustrated in FIG. 30, only a plurality of regions R (8div) are arranged in the X-direction. That is, the whole column control circuit region $R_{CC}$ is the region R (8div). The region R (8div) is virtually divided into eight division units $div_2$. The eight wiring groups Gm are disposed corresponding to the eight division units $div_2$. A part of a plurality of wirings m1*a* included in the wiring group Gm connect the bit lines BL in the memory hole region $R_{MH12}$ to the configurations of the column control circuit region $R_{CC}$.

However, the eight division units $div_2$ do not correspond to the 12 memory blocks BLK. Therefore, a part of the eight wiring groups Gm is interfered with a plurality of via-contact electrodes CC disposed in the hook-up region $R_{HU1}$. It is considered to bend and detour the wiring m1*a*. However, since the wiring m1*a* is a very thin wiring, bending it is difficult.

In contrast, in the above-described first embodiment, as described with reference to FIG. 16, the region on the X-direction positive side of the column control circuit region $R_{CC}$ is the region R (6div) virtually divided into the six division units $div_1$ corresponding to the length (BLK pitch) in the Y-direction of the memory block BLK. Additionally, the six wiring groups Gm1 corresponding to the six division units $div_1$ are disposed. Accordingly, a part of a plurality of wirings m1*a* included in the wiring group Gm1 can pass through the region without a plurality of via-contact electrodes CC (region corresponding to the memory blocks BLK (1), (3), (5), (7), (9), and (11)). Consequently, a part of the plurality of wirings m1*a* included in the wiring group Gm1 is not interfered with the plurality of via-contact electrodes CC. Additionally, it is not necessary to bend the plurality of wirings m1*a*, and the plurality of wirings m1*a* can be extended in the X-direction. Accordingly, increase in difficulty of the manufacturing process of the semiconductor memory device (wiring layers including the wiring layer M1) can be avoided.

In the regions R (6div), R (8div), since the parts 152 of the plurality of wirings m1*a* are arranged in the Y-direction at a predetermined pitch above one sense amplifier SA, the plurality of wirings d4 in the wiring layer D4 can be also arranged in the Y-direction at a predetermined pitch above the one sense amplifier SA. Accordingly, in the wiring layer D4, one or a plurality of passing wirings TW can be formed between rows of the plurality of wirings d4 arranged in the Y-direction (rows d4C1, d4C2 illustrated in FIG. 25 and FIG. 26).

The region on the X-direction negative side of the column control circuit region $R_{CC}$ is the region R (8div) virtually divided into the eight division units $div_2$. Accordingly, in the region on the X-direction negative side of the column control circuit region $R_{CC}$, in the wiring layer D4, the large number of the passing wirings TW can be disposed (FIG. 28) between the rows of the plurality of wirings d4 arranged in the Y-direction (rows d4C2 illustrated in FIG. 26).

The center position CL1 of the memory hole region $R_{MH11}$ is displaced from the center position of the peripheral circuit region $R_{PC}$ between the column control circuit region $R_{CC(1)}$ on the X-direction negative side and the column control circuit region $R_{CC(2)}$ on the X-direction positive side (FIG. 14). In this case, the lengths of the plurality of wirings m1*a* included in the wiring group Gm2 tend to become shorter than the lengths of the plurality of wirings m1*a* included in the wiring group Gm1. Additionally, the number of the bit lines BL connected to the sense amplifier SA of the region R (8div) becomes smaller than the number of the bit lines BL connected to the sense amplifier SA of the region R (6div). That is, the smaller the length of the wiring m1*a* is, the more reduced the number of the bit lines BL is, and the more reduced the number of the wirings m1*a* is. Accordingly, when the length of the wiring m1*a* is small, and the number of the wirings m1*a* is small, even when the number of divisions (the number of the division units) is increased, the wirings m1*a* do not become crowded. In the example of FIG. 16, the number of the bit lines BL connected to the region R (6div) is larger than the number of the bit lines BL connected to the region R (8div).

Second Embodiment

Figure 31:
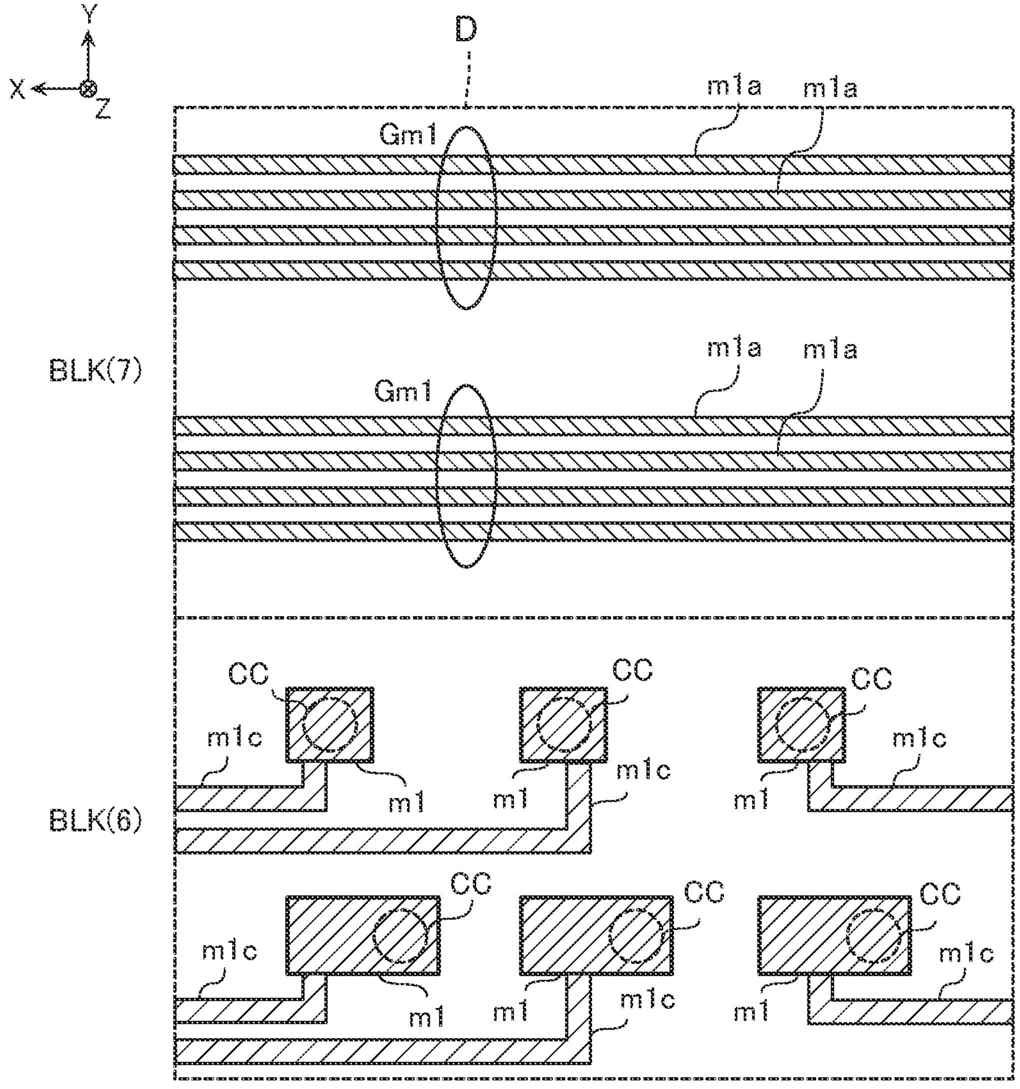
FIG. 31 is a schematic bottom view illustrating an enlarged region in the wiring layer M1 corresponding to a part D of FIG. 16.

FIG. 31 is a schematic bottom view illustrating an enlarged region in the wiring layer M1 corresponding to a part D of FIG. 16. While FIG. 16 illustrates a case where one memory block BLK includes one wiring group Gm1, FIG. 31 illustrates a case where one memory block BLK includes two or more wiring groups Gm1.

In the first embodiment, as described with reference to FIG. 14, each of the via-contact electrodes CC is connected to the bonding electrode $P_{I1}$ via a plurality of wirings m0, m1 in the wiring layers M0, M1. The bonding electrode $P_{I1}$ is connected to the bonding electrode $P_{I2}$, and the bonding electrode $P_{I2}$ is connected to the word line switch WLSW disposed in the row control circuit region $R_{RC}$ via the wirings d4 to d0 of the wiring layers D4 to D0. In this case, any one or a plurality of wirings d3 to d0 of the wiring layers D3 to D0 extend in the X-direction from the position of the bonding electrode $P_{I2}$ to the position of the word line switch WLSW.

Meanwhile, in the second embodiment, as illustrated in FIG. 31, a plurality of wirings m1 (six wirings m1 in the example of FIG. 31) disposed in the region corresponding to the memory block BLK (memory block BLK (6) in the example of FIG. 31) are connected to a respective plurality of via-contact electrodes CC via a plurality of wirings m0 of the wiring layer M0. Here, a part of the plurality of wirings m1 are connected to wirings m1*c*. The wiring m1*c* extends in the X-direction from the position of the via-contact electrode CC to a position overlapping with the word line switch WLSW viewed in the Z-direction, and is connected to a wiring m1. The wirings m1 disposed at the positions overlapping with the word line switches WLSW viewed in the Z-direction are connected to a respective plurality of bonding electrodes $P_{I1}$. The plurality of bonding electrodes $P_{I1}$ are connected to a respective plurality of bonding electrodes $P_{I2}$. The plurality of bonding electrodes $P_{I2}$ are connected to the respective word line switches WLSW disposed in the row control circuit region $R_{RC}$ via the wirings d4 to d0 of the wiring layers D4 to D0.

Thus, in the wiring layer M1, the region in which the wirings m1 connecting the via-contact electrodes CC to the word line switches WLSW are disposed (in the example of FIG. 31, sub-region $R_{HU}$ (N6) corresponding to the memory block BLK (6)) is separated from the region in which the wirings m1*a* connecting the bit lines BL to the sense amplifier circuits SADL are disposed (in the example of FIG. 31, sub-region $R_{HU}$ (N7) corresponding to the memory block BLK (7)). Therefore, the plurality of wirings m1, m1*c* are not interfered with the plurality of wirings m1*a* extending in the X-direction. Additionally, the plurality of wirings m1*c* extend in the X-direction from the positions of the via-contact electrodes CC to the positions overlapping with the word line switches WLSW viewed in the Z-direction. Accordingly, a part of the wirings d3 to d0 of the wiring layers D3 to D0 electrically connecting the bonding electrode $P_{I2}$ to the word line switch WLSW can be replaced with the wiring m1*c* of the wiring layer M1. Consequently, the wirings of the respective wiring layers can be efficiently formed, and the high integration of the semiconductor memory device can be attempted.

While the wiring is not disposed between the wiring groups Gm1 in the example of FIG. 31, dummy wirings may be disposed at a pitch, for example, approximately the same as that of the plurality of wirings m1*a*. The dummy wiring is not electrically connected to an element. The dummy wiring is electrically insulated, and is floating.

Third Embodiment

Figure 32:
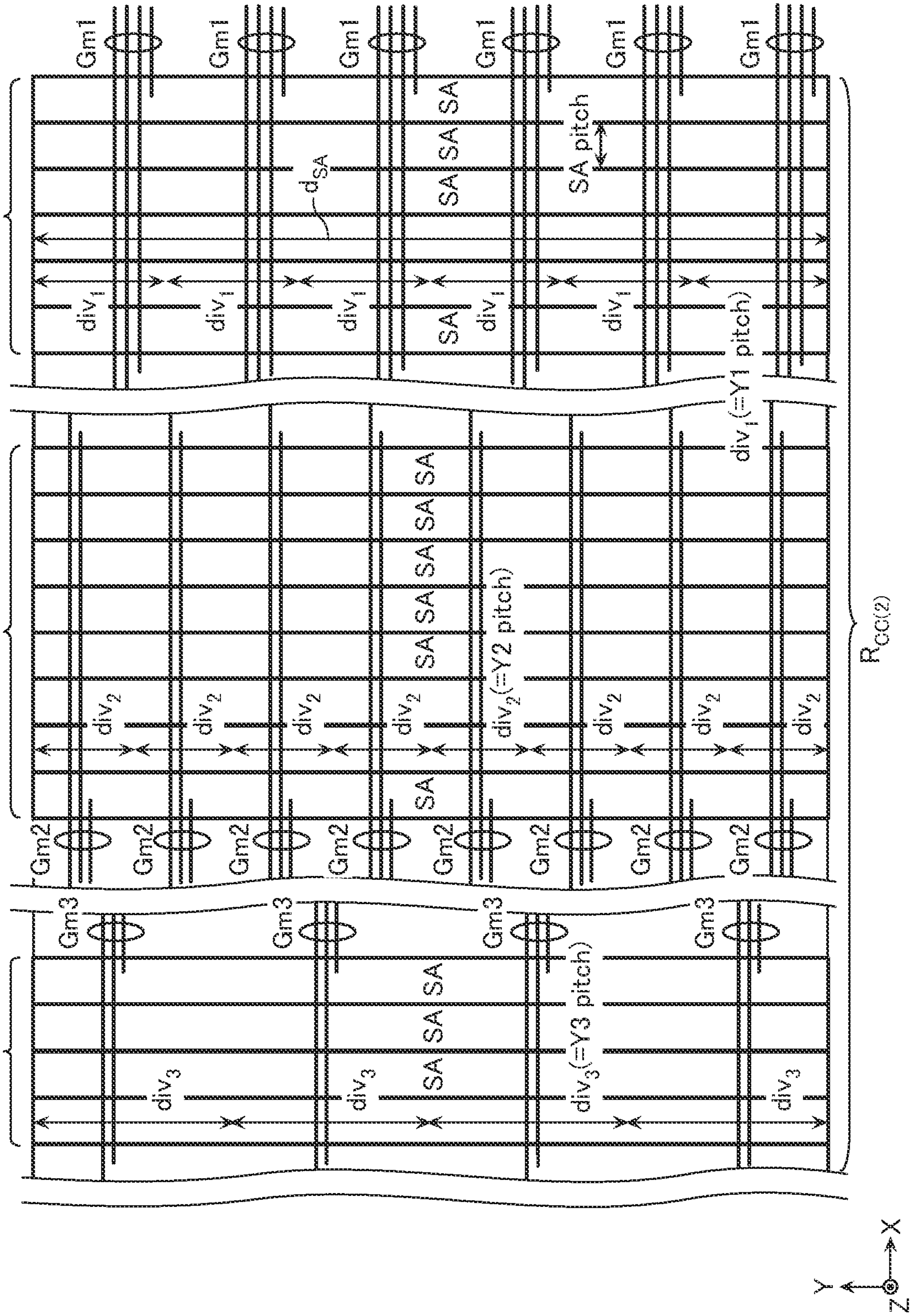
FIG. 32 is a schematic plan view illustrating a configuration of a column control circuit region $R_{CC}$ of a third embodiment.
Figure 33:
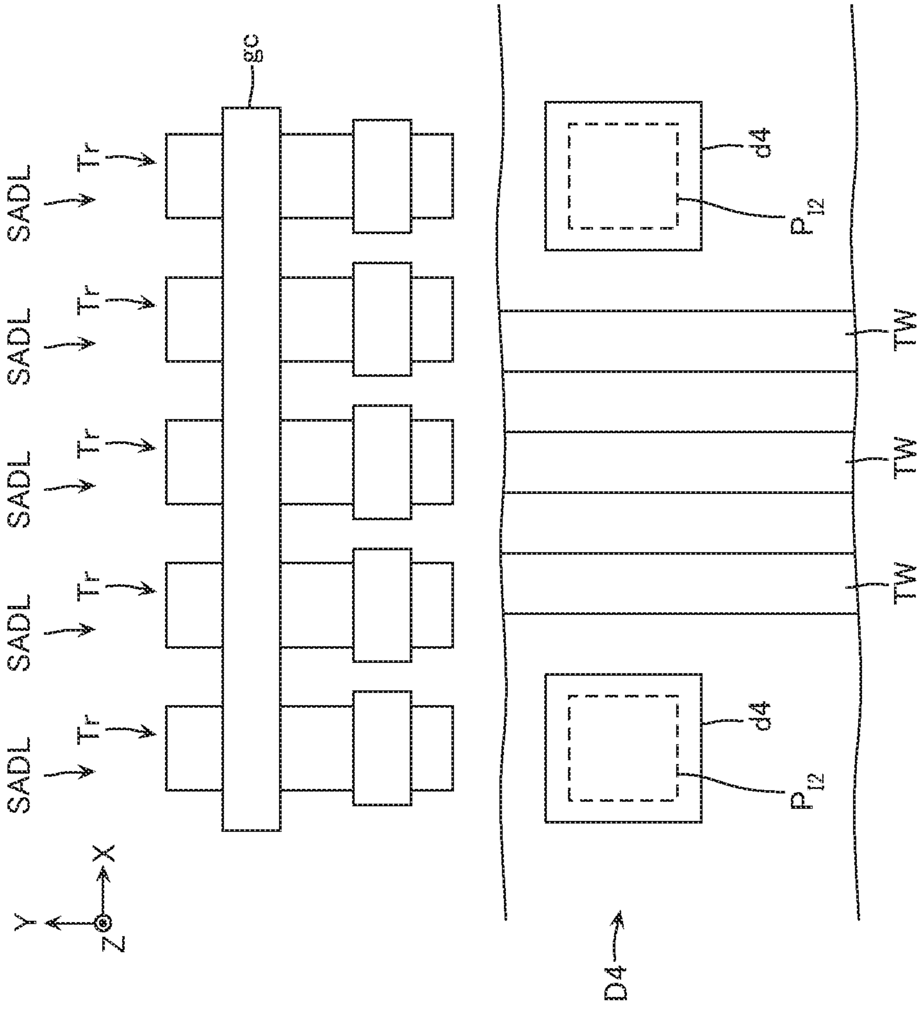
FIG. 33 is a schematic plan view illustrating a configuration of a passing wiring TW in a region R (4div)

FIG. 32 is a schematic plan view illustrating a configuration of a column control circuit region $R_{CC}$ of the third embodiment. FIG. 33 is a schematic plan view illustrating a configuration of a passing wiring TW in a region R (4div).

As illustrated in FIG. 32, in the column control circuit region $R_{CC(2)}$, the region on the X-direction positive side is a region R (6div), the region on the X-direction negative side is a region R (4div), and the region between the region on the X-direction positive side and the region on the X-direction negative side is a region R (8div). In the region R (4div), the length $d_{SA}$ in the Y-direction of the sense amplifier SA is virtually divided into four division units $div_3$. A length in the Y-direction of the division unit $div_3$ is referred to as a "Y3 pitch" in some cases. In the region R (4div), four wiring groups Gm3 are disposed corresponding to the four division units $div_3$. A pitch in the Y-direction of the wiring group Gm3 is referred to as "Y3 pitch" in some cases. Thus, the column control circuit region $R_{CC(2)}$ is divided into three regions (R (6div), R (8div), R (4div)) different in the number of divisions.

As illustrated in FIG. 33, in the wiring layer D4, a plurality of passing wirings TW extending in the Y-direction are formed between the two wirings d4. In the example of FIG. 33, the three passing wirings TW are formed.

With this configuration, by having the region with the small number of the passing wirings TW as the region R (4div), the pitch (Y3 pitch) in the Y-direction of the wiring group Gm3 can be relaxed. While the column control circuit region $R_{CC}$ is divided into three regions (R (6div), R (8div), R (4div)) different in the number of divisions in the third embodiment, the column control circuit region $R_{CC}$ may be divided into four or more regions different in the number of divisions.

Fourth Embodiment

Figure 34:
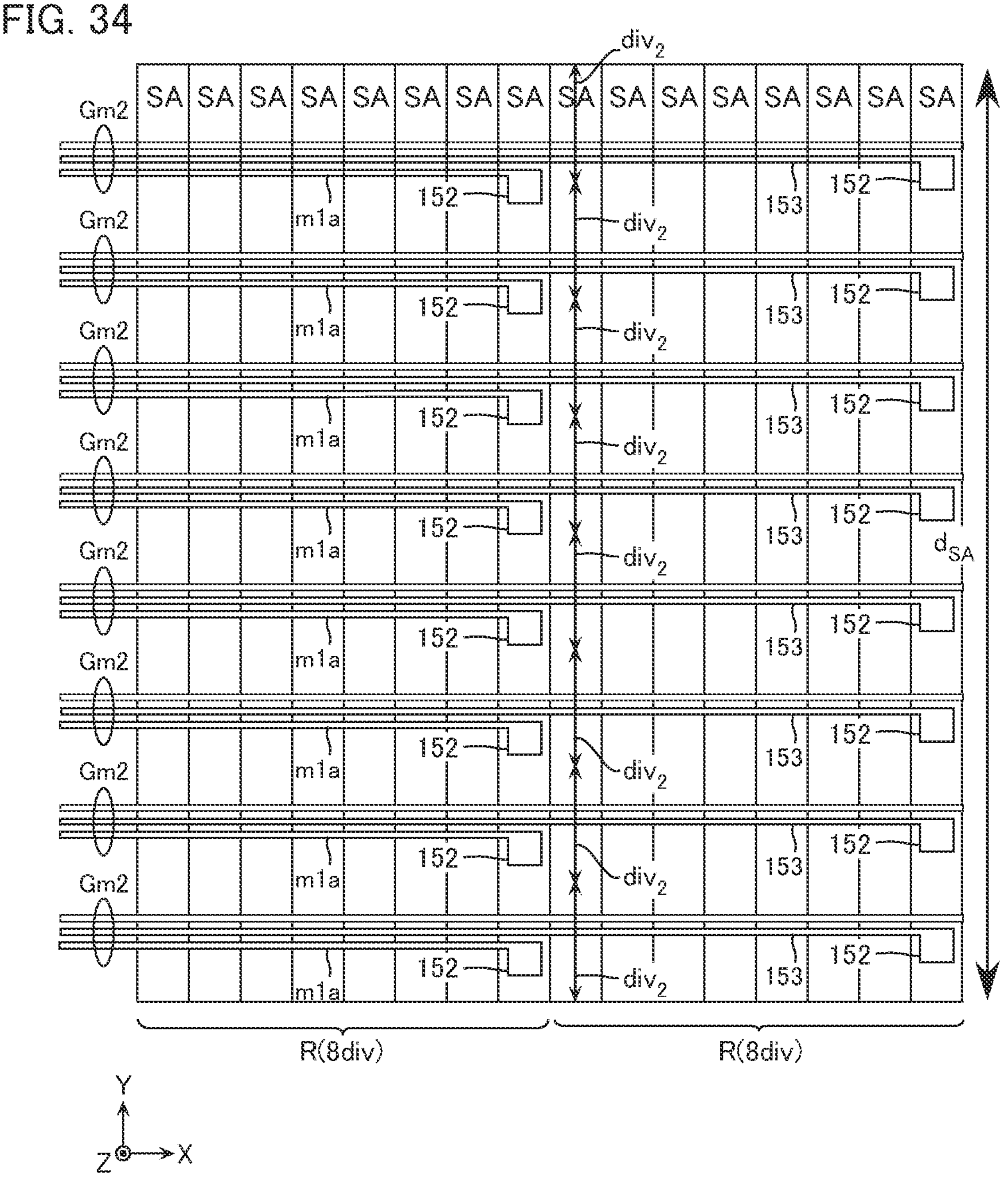
FIG. 34 is a schematic plan view for describing a wiring pattern of wiring groups Gm2 of a fourth embodiment.
Figure 35:
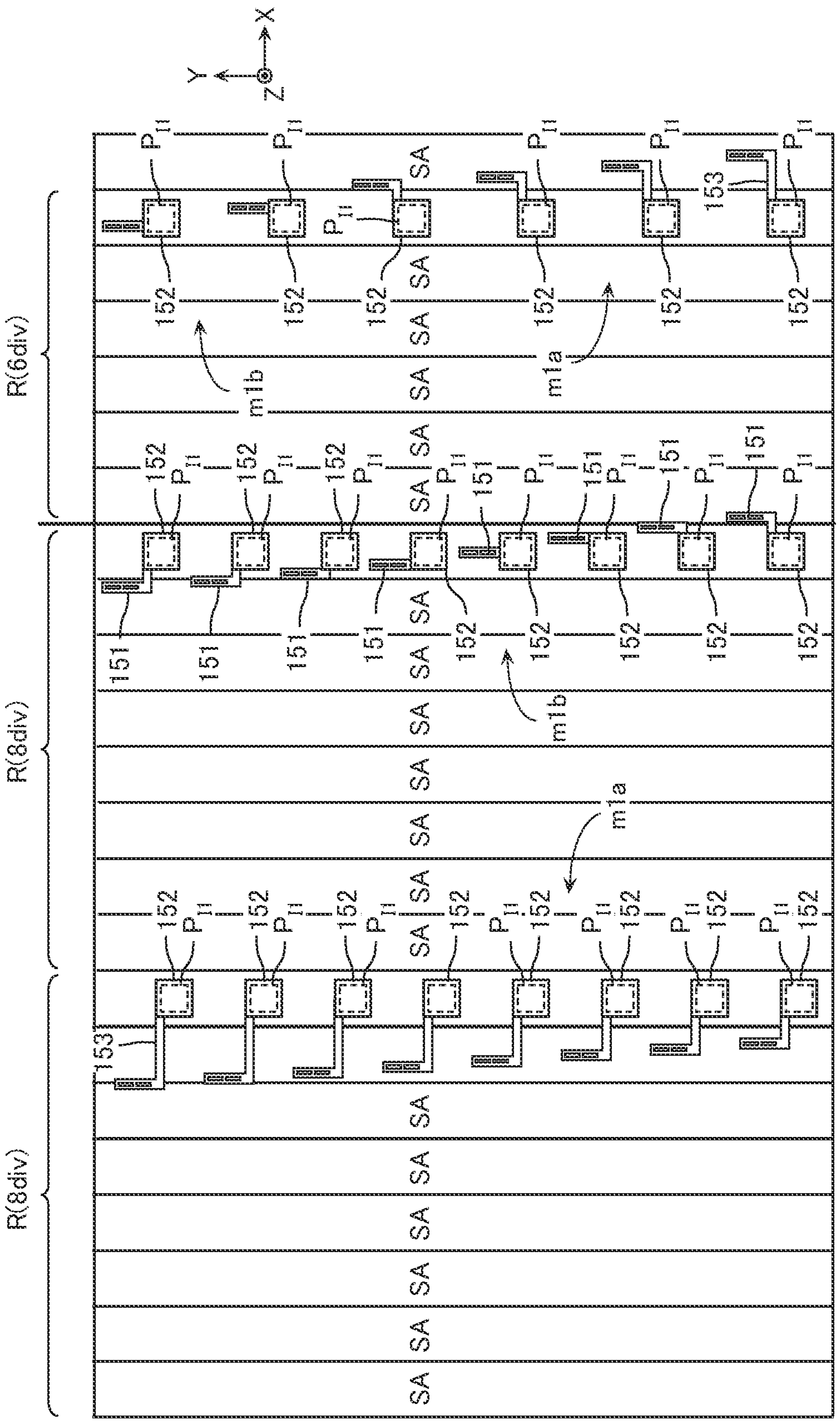
FIG. 35 is a schematic plan view illustrating a boundary between regions different in the number of divisions according to the fourth embodiment.
Figure 36:
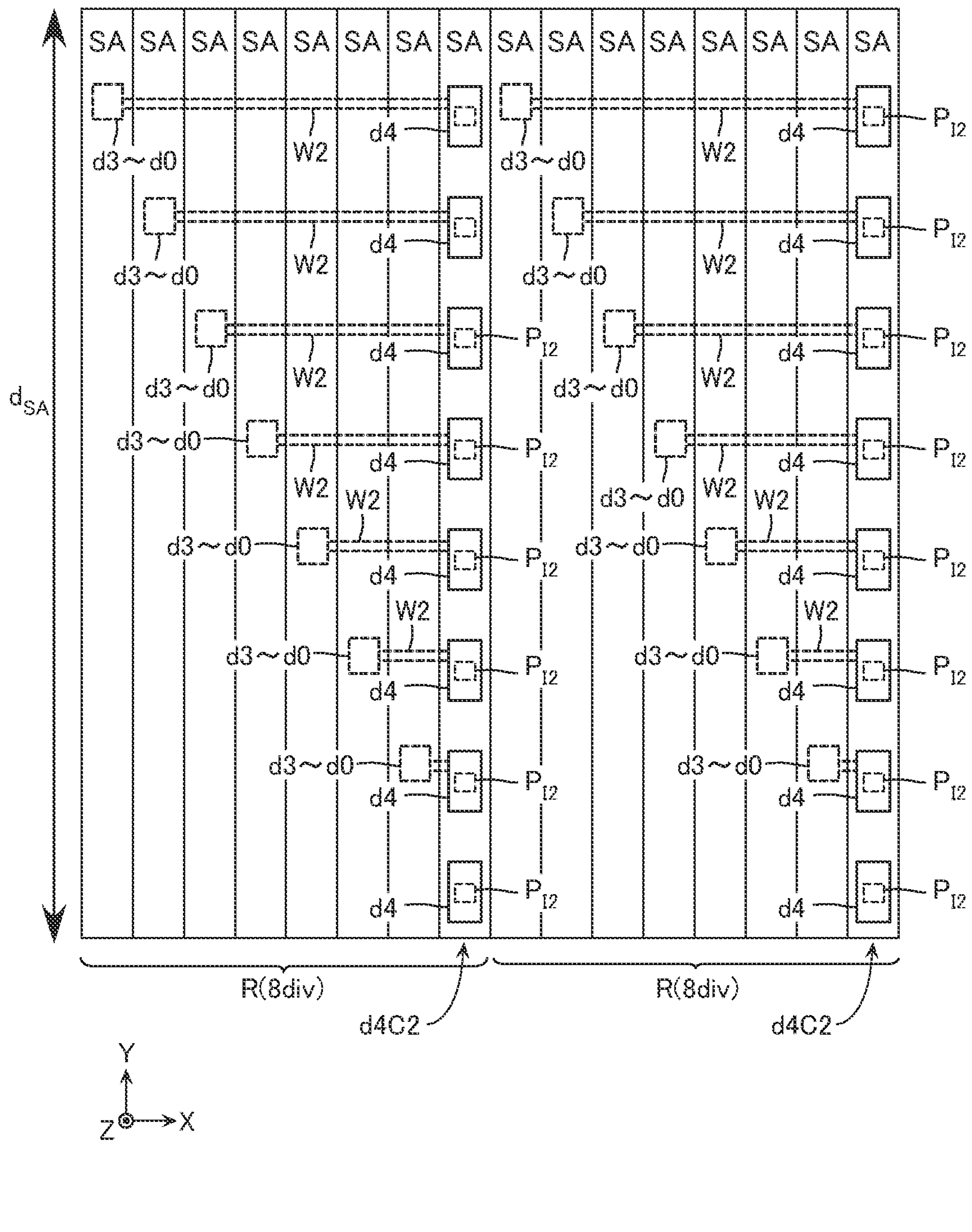
FIG. 36 is a schematic plan view illustrating an exemplary arrangement of wirings d4 in a wiring layer D4 according to the fourth embodiment.

FIG. 34 is a schematic plan view for describing a wiring pattern of wiring groups Gm2 of the fourth embodiment. FIG. 35 is a schematic plan view illustrating a boundary between regions R (6div) and R (8div) different in the number of divisions according to the fourth embodiment. FIG. 36 is a schematic plan view illustrating an exemplary arrangement of the wirings d4 in the wiring layer D4 according to the fourth embodiment. FIG. 34 to FIG. 36 are drawings corresponding to FIG. 22, FIG. 24, and FIG. 26.

In the example of FIG. 34, among the three wirings m1*a* included in the wiring group Gm2, the part 152 of the first wiring m1*a* counting from the Y-direction negative side is formed in a region overlapping with the eighth sense amplifier SA counting from the X-direction negative side (the first sense amplifier SA counting from the X-direction positive side) in the first region R (8div) counting from the X-direction negative side viewed in the Z-direction in the wiring layer M1. Similarly, among the three wirings m1*a*, the parts 152 of the second to the third wirings m1*a* counting from the Y-direction negative side are formed in regions overlapping with the eighth sense amplifiers SA counting from the X-direction negative side in the second to the third regions R (8div) counting from the X-direction negative side viewed in the Z-direction in the wiring layer M1.

Accordingly, the eight parts 152 are arranged in the Y-direction at a predetermined pitch above the eighth sense amplifier SA (sense amplifier region $R_{SA}$) counting from the X-direction negative side.

In the example of FIG. 35, in the region R (6div), the six wirings m1*a* or wirings m1*b* are arranged in the Y-direction at a predetermined pitch in the wiring layer M1 above the first sense amplifier SA counting from the X-direction positive side. In the region R (8div), the eight wirings m1*a* or wirings m1*b* are arranged in the Y-direction at a predetermined pitch in the wiring layer M1 above the eighth sense amplifier SA counting from the X-direction negative side (first sense amplifier SA counting from the X-direction positive side).

In the example of FIG. 36, the eight wirings d4 are arranged in the Y-direction at a predetermined pitch in the wiring layer D4 above the eighth sense amplifier SA counting from the X-direction negative side (first sense amplifier SA counting from the X-direction positive side). A row of the eight wirings d4 arranged in the Y-direction is referred to as a wiring row "d4C2" in some cases.

The wirings d4 to d0 are mutually connected via the via-contact electrodes. A wiring W2 (FIG. 36) is formed in any of the wiring layers D3 to DO. The wiring W2 extends in the X-direction, has one end in the X-direction disposed at a position overlapping with the wiring d4 viewed in the Z-direction, and has the other end in the X-direction disposed at a position overlapping with the sense amplifier SA (position of the wirings d3 to d0 of FIG. 36) viewed in the Z-direction. Each of the wirings W2 is connected to the corresponding sense amplifier SA (sense amplifier circuit SADL) via one or a plurality of via-contact electrodes.

In the first embodiment as illustrated in FIG. 24, in the boundary between the regions R (6div) and R (8div), a distance between the row of the six parts 152 arranged in the Y-direction in the wiring layer M1 and the row of the eight parts 152 arranged in the Y-direction in the wiring layer M1 is large, and the periodicity is lost. In contrast, in the fourth embodiment, as illustrated in FIG. 35, in the boundary between the regions R (6div) and R (8div), the distance between the row of the six parts 152 arranged in the Y-direction in the wiring layer M1 and the row of the eight parts 152 arranged in the Y-direction in the wiring layer M1 is approximately constant. Accordingly, the rows of the plurality of parts 152 can be disposed in the X-direction equally as much as possible.

In the fourth embodiment, as illustrated in FIG. 34 to FIG. 36, in both of the region R (6div) and the region R (8div), the row of the plurality of parts 152 (row of a plurality of bonding electrodes $P_{I1}$, $P_{I2}$, row of a plurality of wirings d4) is disposed above the first sense amplifier SA counting from the X-direction positive side.

Other Embodiments

The semiconductor memory devices according to the first embodiment to the fourth embodiment are described above. However, the above-described configurations are merely examples, and the specific configurations are adjustable as necessary.

For example, while the chip $C_M$ exemplified in FIG. 5 has the configuration including the two memory planes MP arranged in the X-direction, a configuration including one memory plane or including three or more memory planes arranged in the X-direction may be employed. A configuration including the memory planes arranged in the X-direction and the Y-direction by 2×2 or 4×4 may be employed.

The column control circuit region $R_{CC}$ exemplified in FIG. 12 includes the 16 regions $R_{CC110}$ arranged in the Y-direction, and a pitch in the X-direction of the part 151 of the wiring m1*a* exemplified in FIG. 21 and FIG. 23 is 16 BL pitch. However, this is an example. For example, the column control circuit region $R_{CC}$ may include the 12 regions $R_{CC110}$ arranged in the Y-direction, and a pitch in the X-direction of the part 151 of the wiring m1*a* may be 12 BL pitch. For example, the column control circuit region $R_{CC}$ may include the eight regions $R_{CC110}$ arranged in the Y-direction, and a pitch in the X-direction of the part 151 of the wiring m1*a* may be 8 BL pitch. The number of the regions $R_{CC110}$ arranged in the Y-direction included in the column control circuit region $R_{CC}$, and a pitch in the X-direction of the part 151 of the wiring m1*a* are appropriately set.

As described with reference to FIG. 16, it is necessary that the plurality of wirings m1*a* connecting the plurality of bit lines BL of the memory hole region $R_{MH12}$ to the sense amplifiers SA in the plurality of regions R (6div) pass through the regions corresponding to the odd-numbered memory blocks BLK (1), (3), (5), (7), (9), and (11) in the hook-up region $R_{HU1}$. However, the plurality of wirings m1*a* connecting the plurality of bit lines BL in the region on the X-direction positive side of the memory hole region $R_{MH11(2)}$ to the sense amplifiers SA in the plurality of regions R (6div) may pass through the regions corresponding to the odd-numbered or even-numbered memory blocks BLK (1) to (12).

Figure 37:
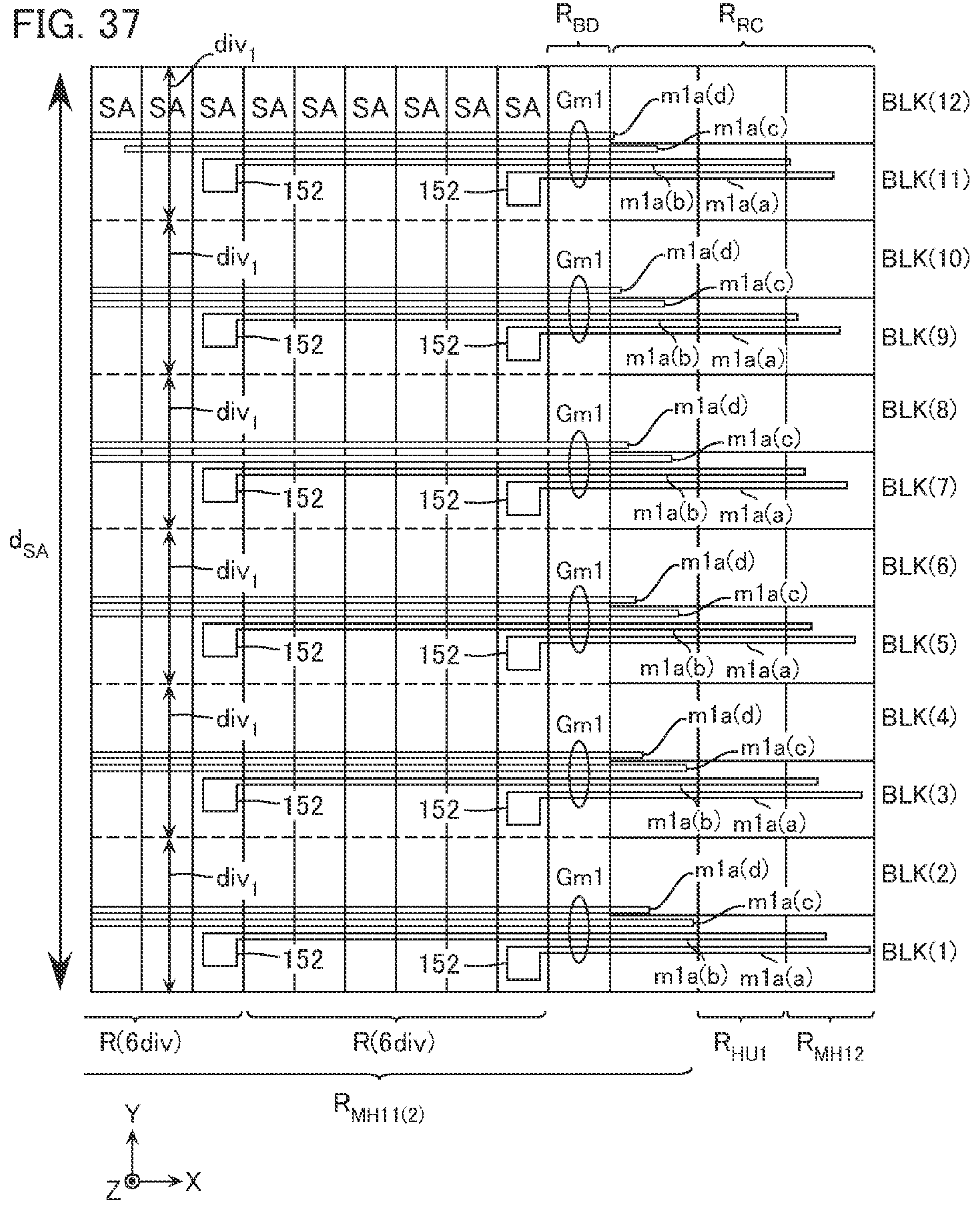
FIG. 37 is a schematic plan view for describing a modification of the wiring pattern of the wiring groups Gm1.

For example, as illustrated in FIG. 37, assume that the four wirings m1*a* included in the wiring group Gm1 are wirings m1*a* (a), m1*a* (b), m1*a* (c), and m1*a* (d) in the order from the Y-direction negative side. Here, the wirings m1*a* (a), m1*a* (b) are the wirings m1*a* connecting the plurality of bit lines BL of the memory hole region $R_{MH12}$ to the sense amplifiers SA in the plurality of regions R (6div). The wirings m1*a* (c), m1*a* (d) are the wirings m1*a* connecting the plurality of bit lines BL in the region on the X-direction positive side of the memory hole region $R_{MH11(2)}$ to the sense amplifiers SA in the plurality of regions R (6div). In the example of FIG. 37, the wirings m1*a* (a), m1*a* (b), and m1*a* (c) pass through the regions corresponding to the odd-numbered memory blocks BLK (1), (3), (5), (7), (9), and (11). Meanwhile, the wirings m1*a* (d) pass through the regions corresponding to the even-numbered memory blocks BLK (2), (4), (6), (8), (10), and (12).

In the example described with reference to FIG. 16, the column control circuit region $R_{CC}$ includes a plurality of regions R (6div) and a plurality of regions R (8div). However, for example, the column control circuit region $R_{CC}$ may include a plurality of regions R (8div) and a plurality of regions R (4div), and may include a plurality of regions R (10div) and a plurality of regions R (8div). These numbers of divisions are also examples, and the number of divisions can be adjusted as necessary.

In the example described with reference to FIG. 16, the number of the wirings m1*a* included in the plurality of wiring groups Gm1, Gm2 passing through one sense amplifier SA (sense amplifier region $R_{SA}$ of FIG. 13) is 24 for each. That is, the number of the wirings m1*a* included in the six wiring groups Gm1 is 6×4, and the number of the wirings m1*a* included in the eight wiring groups Gm2 is 8×3. However, the number of the wirings m1*a* passing through one sense amplifier SA may be different between the wiring group Gm1 and the wiring group Gm2. For example, the number of the wirings m1*a* included in the (n1) wiring groups Gm1 may be (n1)×(h1), and the number of the wirings m1*a* included in the (n2) wiring groups Gm2 may be (n2)×(h2). n1 is an integer of 2 or more, and n2 is an integer of 2 or more different from n1. h1 and h2 are integers of 2 or more.

The parts 152 of the plurality of wirings m1*a* illustrated in FIG. 20 and FIG. 22 are arranged in a row in the Y-direction in the wiring layer M1 above one sense amplifier SA. However, in the region without the passing wiring TW, the parts 152 of the plurality of wirings m1*a* do not need to be arranged in a row in the Y-direction.

In the column control circuit region $R_{CC}$ illustrated in FIG. 16, the region on the X-direction positive side close to the memory hole region $R_{MH12}$ is set as the region R (6div) divided into the six division units $div_1$. However, the number of divisions (the number of the division units) of the length $d_{SA}$ in the Y-direction of the sense amplifier SA can be adjusted corresponding to the length $d_{SA}$ in the Y-direction of the sense amplifier SA and the length (BLK pitch) in the Y-direction of the memory block BLK as necessary.

As illustrated in FIG. 13, the sense amplifier SA includes two stages of the switch transistors BLS, BLBIAS arranged in the Y-direction and the sense amplifier circuit SADL, and the region of the sense amplifier SA is set as the sense amplifier region $R_{SA}$. However, the sense amplifier circuit SADL may be set as the sense amplifier SA, and the region of the sense amplifier circuit SADL may be set as the sense amplifier region $R_{SA}$.

As illustrated in FIG. 11, the peripheral circuit region $R_{PC}$ includes the four column control circuit regions $R_{CC}$ arranged in the X-direction and the Y-direction. However, in the peripheral circuit region $R_{PC}$, the number of the column control circuit regions $R_{CC}$ disposed in the peripheral circuit region $R_{PC}$ is not limited to four. The number of the column control circuit regions $R_{CC}$ disposed in the peripheral circuit region $R_{PC}$ may be any number, for example, six column control circuit regions $R_{CC}$ in which two are arranged in the X-direction and three are arranged in the Y-direction, six column control circuit region $R_{CC}$ in which three are arranged in the X-direction and two are arranged in the Y-direction, or one column control circuit region $R_{CC}$.

The region R (6div) is referred to as a "first region," the region R (8div) is referred to as a "second region," and the region R (4div) is referred to as a "third region" in some cases.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a semiconductor substrate;

a plurality of conductive layers arranged in a first direction intersecting with a surface of the semiconductor substrate and extending in a second direction intersecting with the first direction;

a plurality of semiconductor layers extending in the first direction and being opposed to the plurality of conductive layers;

a first wiring layer disposed between the semiconductor substrate and the plurality of semiconductor layers, being electrically connected to the plurality of semiconductor layers, and including a plurality of bit lines, the plurality of bit lines being arranged in the second direction and extending in a third direction intersecting with the first direction and the second direction;

a column control circuit region disposed in the semiconductor substrate; and a second wiring layer disposed between the semiconductor substrate and the first wiring layer and including a plurality of first wirings, the respective plurality of first wirings electrically connecting the column control circuit region to the plurality of bit lines, wherein the semiconductor substrate includes a first region and a second region arranged in the second direction, the column control circuit region includes a plurality of sense amplifier regions, (n1) (n1 is an integer of 2 or more) first wirings arranged in the third direction are disposed at a position where the first region overlaps with the sense amplifier regions viewed in the first direction, and (n2) (n2 is an integer of 2 or more different from n1) first wirings arranged in the third direction are disposed at a position where the second region overlaps with the other sense amplifier regions viewed in the first direction.

2. The semiconductor memory device according to claim 1, wherein the sense amplifier regions overlapping with the first region include (n1) first division units in a predetermined length in the third direction, the other sense amplifier regions overlapping with the second region include (n2) second division units in a predetermined length in the third direction, the first wiring is disposed in each of the (n1) first division units, and the first wiring is disposed in each of the (n2) second division units.

3. The semiconductor memory device according to claim 1, wherein in a region where the first region overlaps with the column control circuit region, (n1)−1 sense amplifier regions arranged in the second direction are adjacent to the two sense amplifier regions in which the (n1) first wirings are disposed, and in a region where the second region overlaps with the column control circuit region, (n2)−1 sense amplifier regions arranged in the second direction are adjacent to the two sense amplifier regions in which the (n2) first wirings are disposed.

4. The semiconductor memory device according to claim 1, comprising a third wiring layer disposed between the first wiring layer and the second wiring layer and including a plurality of second wirings, wherein the (n1) second wirings are arranged in the third direction and electrically connected to the respective (n1) first wirings, and the (n2) second wirings are arranged in the third direction and electrically connected to the respective (n2) first wirings.

5. The semiconductor memory device according to claim 4, wherein each of at least a part of the plurality of second wirings includes:

a first part having a portion overlapping with one of the plurality of bit lines in the first direction;

a second part having a portion overlapping with the plurality of first wirings in the first direction; and a third part extending in the second direction and connected to the first part and the second part.

6. The semiconductor memory device according to claim 5, wherein each of another part of the plurality of second wirings includes:

a first part having a portion overlapping with one of the plurality of bit lines in the first direction; and a second part having a portion overlapping with the plurality of first wirings in the first direction, and one end portion in the third direction of the first part is connected to the second part.

7. The semiconductor memory device according to claim 1, wherein the second wiring layer is disposed between a plurality of rows of the plurality of first wirings arranged in the third direction, and includes a plurality of passing wirings extending in the third direction and arranged in the second direction.

8. The semiconductor memory device according to claim 7, wherein (n1) is smaller than (n2), the first region includes two of the plurality of rows of the plurality of first wirings, and the two rows are a first row and a second row arranged in the second direction, the second region includes other two of the plurality of rows of the plurality of first wirings, and the other two rows are a third row and a fourth row arranged in the second direction, and the count of the passing wirings disposed between the first row and the second row is smaller than the count of the passing wirings disposed between the third row and the fourth row.

9. The semiconductor memory device according to claim 1, wherein (n1) is smaller than (n2), and the count of the bit lines disposed above the first region is larger than the count of the bit lines disposed above the second region.

10. The semiconductor memory device according to claim 4, comprising:

a first memory region including a part of the plurality of semiconductor layers;

a second memory region including another part of the plurality of semiconductor layers, the second memory region being arranged with the first memory region in the second direction; and a hook-up region disposed between the first memory region and the second memory region, wherein the hook-up region includes a plurality of first sub-regions including a plurality of via-contact electrodes and a plurality of second sub-regions without the plurality of via-contact electrodes, the respective first sub-regions and the respective second sub-regions are alternately arranged in the third direction, the plurality of sense amplifier regions are disposed in a region of the semiconductor substrate overlapping with the first memory region viewed in the first direction, and the plurality of second wirings in the second memory region pass through at least any one of the plurality of second sub-regions.

11. The semiconductor memory device according to claim 10, wherein each of the first memory region and the second memory region includes a plurality of memory blocks arranged in the third direction, and the plurality of memory blocks correspond to the plurality of first and second sub-regions.

12. The semiconductor memory device according to claim 10, wherein a length in the third direction of (2×n1) sub-regions is the same or approximately the same as a length in the third direction of the sense amplifier region.

13. The semiconductor memory device according to claim 10, comprising a plurality of switch transistors disposed in the semiconductor substrate, wherein the respective plurality of via-contact electrodes are electrically connected to the plurality of conductive layers and the plurality of switch transistors.

14. The semiconductor memory device according to claim 13, wherein a center position in the second direction of a transistor region in which the plurality of switch transistors are disposed is the same or approximately the same as a center position in the second direction of the hook-up region.

15. The semiconductor memory device according to claim 14, wherein a length in the second direction of the transistor region is larger than a length in the second direction of the hook-up region.

16. The semiconductor memory device according to claim 1, wherein the semiconductor substrate includes a third region arranged in the second direction, and (n3) (n3 is an integer of 2 or more different from n1 and n2) first wirings arranged in the third direction are disposed at each of positions overlapping with the sense amplifier region in the third region viewed in the first direction.

17. The semiconductor memory device according to claim 5, wherein a positional relation between the first part and the second part in the second direction is switched in a proximity of a boundary between the first region and the second region.

18. The semiconductor memory device according to claim 1, wherein each of the plurality of sense amplifier regions includes a sense amplifier circuit and a switch transistor having one end electrically connected to the sense amplifier circuit and another end electrically connected to the first wiring.

19. The semiconductor memory device according to claim 4, wherein the semiconductor substrate includes a plurality of the first regions arranged in the second direction and a plurality of the second regions arranged in the second direction, (n1) (n1 is an integer of 2 or more) first wiring groups arranged in the third direction are disposed at each of positions overlapping with a part of the sense amplifier regions in the plurality of first regions viewed in the first direction, (n2) (n2 is an integer of 2 or more different from n1) second wiring groups arranged in the third direction are disposed at each of positions overlapping with a part of the sense amplifier regions in the plurality of second regions viewed in the first direction, the first wiring group includes (h1) (h1 is an integer of 2 or more) second wirings, and the second wiring group includes (h2) (h2 is an integer of 2 or more second wirings different from the (h1) second wirings.

* * * * *